(12) United States Patent
Baik et al.

(10) Patent No.: US 12,132,062 B2
(45) Date of Patent: Oct. 29, 2024

(54) IMAGE SENSOR SUBSTRATE

(71) Applicant: LG INNOTEK CO., LTD., Seoul (KR)

(72) Inventors: Jung Shik Baik, Seoul (KR); Eun Sung Seo, Seoul (KR); Young Joon Son, Seoul (KR); Jee Heum Paik, Seoul (KR); Hae Sik Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 467 days.

(21) Appl. No.: 17/436,484

(22) PCT Filed: Mar. 3, 2020

(86) PCT No.: PCT/KR2020/002982
§ 371 (c)(1),
(2) Date: Sep. 3, 2021

(87) PCT Pub. No.: WO2020/180078
PCT Pub. Date: Sep. 10, 2020

(65) Prior Publication Data
US 2022/0190015 A1    Jun. 16, 2022

(30) Foreign Application Priority Data

Mar. 4, 2019  (KR) .................. 10-2019-0024661
Aug. 30, 2019  (KR) .................. 10-2019-0107737

(51) Int. Cl.
*H01L 27/146* (2006.01)
*H01L 23/498* (2006.01)
(Continued)

(52) U.S. Cl.
CPC .. *H01L 27/14618* (2013.01); *H01L 23/49838* (2013.01); *G02B 7/08* (2013.01);
(Continued)

(58) Field of Classification Search
CPC ............ H01L 21/4882; H01L 21/4842; H01L 23/3672; H01L 23/3677; H01L 23/473;
(Continued)

(56) References Cited

U.S. PATENT DOCUMENTS 7,973,380 B2   7/2011  Hsu et al.
8,035,693 B2   10/2011 Chiou et al.
(Continued)

FOREIGN PATENT DOCUMENTS

| CN | 101005090 A | 7/2007 |
| CN | 104808416 A | 7/2015 |

(Continued)

OTHER PUBLICATIONS

International Search Report for PCT/KR2020/002982 mailed on Jun. 25, 2020.

*Primary Examiner* — Patricia D Valenzuela
(74) *Attorney, Agent, or Firm* — Birch, Stewart, Kolasch & Birch, LLP

(57) ABSTRACT

An image sensor substrate according to an embodiment includes: an insulating layer including a first open region; and a first lead pattern part disposed on the insulating layer, wherein the first lead pattern part includes: a first pattern part disposed on the insulating layer; a connection portion extending from the first pattern part; and a second pattern part connected to the first pattern part through the connection portion, wherein the second pattern part and the connection portion are disposed to fly on a region not overlapped with the insulating layer in a vertical direction.

20 Claims, 36 Drawing Sheets

(51) Int. Cl.
    *G02B 7/08* (2021.01)
    *H01F 7/126* (2006.01)
    *H01F 7/129* (2006.01)
    *H01F 7/17* (2006.01)
    *H04N 23/54* (2023.01)
    *H04N 23/68* (2023.01)

(52) U.S. Cl.
    CPC .............. *H01F 7/126* (2013.01); *H01F 7/129* (2013.01); *H01F 7/17* (2013.01); *H04N 23/54* (2023.01); *H04N 23/687* (2023.01)

(58) Field of Classification Search
    CPC ......... H01L 21/565; H01L 2224/48472; H01L 2924/181; H01L 23/4334; H01L 23/3735; H01L 25/072; H01L 25/18; H01L 23/10; H01L 2924/19107; H01L 23/40; H01L 27/14618; H01L 23/49838; H01L 27/146; H01F 7/126; H01F 7/129; H01F 7/17; H01F 7/122; H04N 23/54; H04N 25/00; H04N 23/687; G02B 7/08
    See application file for complete search history.

(56) References Cited

U.S. PATENT DOCUMENTS

| | | | |
|---|---|---|---|
| 8,605,160 B2 | 12/2013 | Kwon et al. | |
| 9,240,512 B2 | 1/2016 | Kim et al. | |
| 9,252,180 B2 | 2/2016 | Chien et al. | |
| 9,451,167 B2 | 9/2016 | Lee | |
| 9,736,377 B2 | 8/2017 | Lee | |
| 10,033,303 B2 | 7/2018 | Liu et al. | |
| 10,071,903 B2 | 9/2018 | Liu et al. | |
| 10,134,790 B1 | 11/2018 | Wu et al. | |
| 10,177,188 B2 | 1/2019 | Kang et al. | |
| 10,497,729 B2 | 12/2019 | Wu et al. | |
| 10,516,348 B2 | 12/2019 | Liu et al. | |
| 10,606,097 B2 | 3/2020 | Kim et al. | |
| 10,868,073 B2 | 12/2020 | Kang et al. | |
| 11,011,566 B2 | 5/2021 | Chien et al. | |
| 11,158,659 B2 | 10/2021 | Chu et al. | |
| 11,482,554 B2 | 10/2022 | Kang et al. | |
| 2008/0273092 A1 | 11/2008 | Chiou et al. | |
| 2013/0076923 A1* | 3/2013 | Kwon | G03B 5/00 348/208.7 |
| 2014/0225215 A1 | 8/2014 | Chien et al. | |
| 2015/0115291 A1 | 4/2015 | Kim et al. | |
| 2015/0212291 A1* | 7/2015 | Lee | H04N 23/687 348/360 |
| 2016/0148967 A1 | 5/2016 | Chien et al. | |
| 2016/0323487 A1 | 11/2016 | Lee | |
| 2017/0170215 A1 | 6/2017 | Chu et al. | |
| 2018/0040658 A1 | 2/2018 | Kang et al. | |
| 2018/0337203 A1 | 11/2018 | Wu et al. | |
| 2018/0350855 A1 | 12/2018 | Chu et al. | |
| 2019/0074316 A1 | 3/2019 | Kang et al. | |
| 2019/0088692 A1 | 3/2019 | Wu et al. | |
| 2020/0303445 A1 | 9/2020 | Kang et al. | |
| 2021/0273009 A1 | 9/2021 | Chien et al. | |

FOREIGN PATENT DOCUMENTS

| | | |
|---|---|---|
| CN | 108602663 A | 9/2018 |
| JP | 2013-72967 A | 4/2013 |
| KR | 10-0646560 B1 | 11/2006 |
| KR | 10-2013-0059576 A | 6/2013 |
| KR | 10-2014-0073238 A | 6/2014 |
| KR | 10-2015-0142196 A | 12/2015 |
| KR | 10-2016-0145109 A | 12/2016 |
| KR | 10-2017-0021682 A | 2/2017 |
| KR | 10-2018-0081087 A | 7/2018 |
| KR | 10-2019-0014375 A | 2/2019 |
| TW | M322407 U | 11/2007 |
| TW | 201432895 A | 8/2014 |
| TW | 201517258 A | 5/2015 |
| TW | 201733100 A | 9/2017 |
| TW | 201820600 A | 6/2018 |
| TW | 201901942 A | 1/2019 |

\* cited by examiner

【FIG. 1】
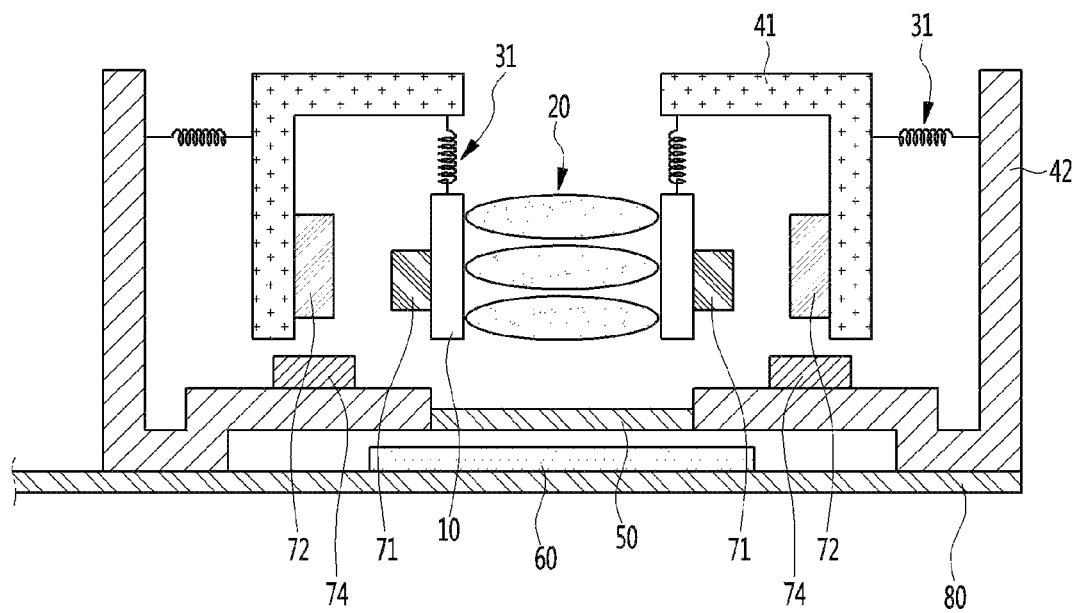
【FIG. 2】
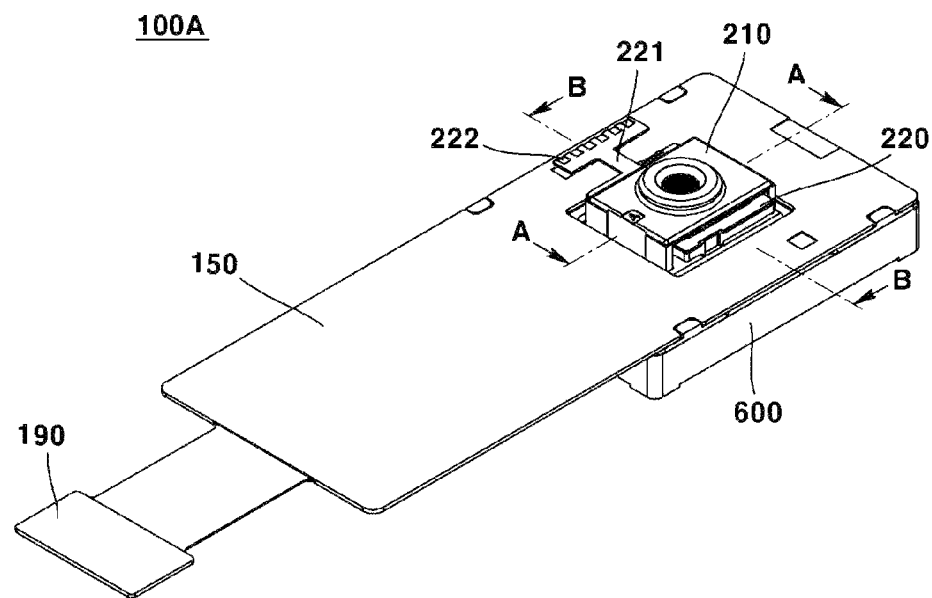

[FIG. 3]
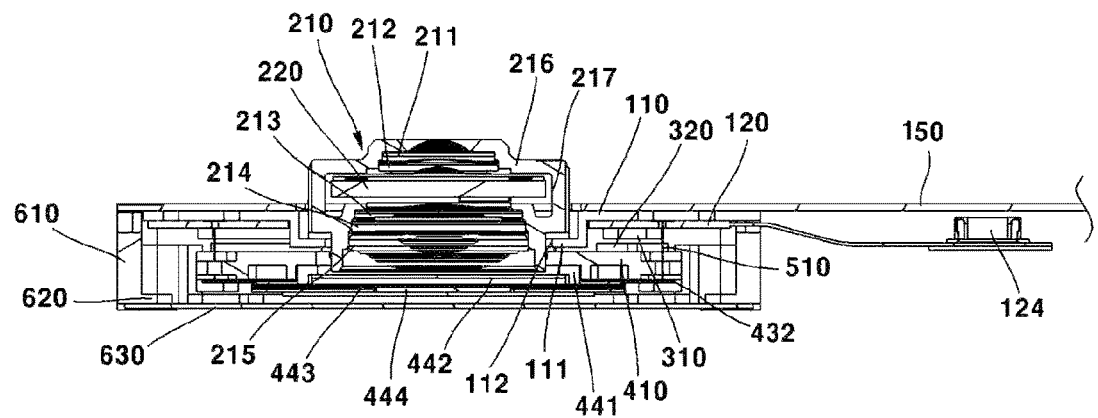
[FIG. 4]
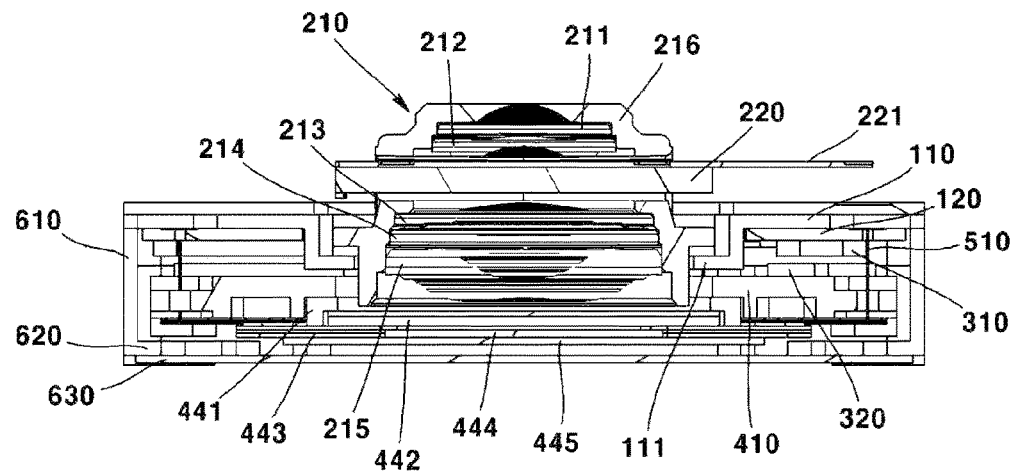

[FIG. 5]
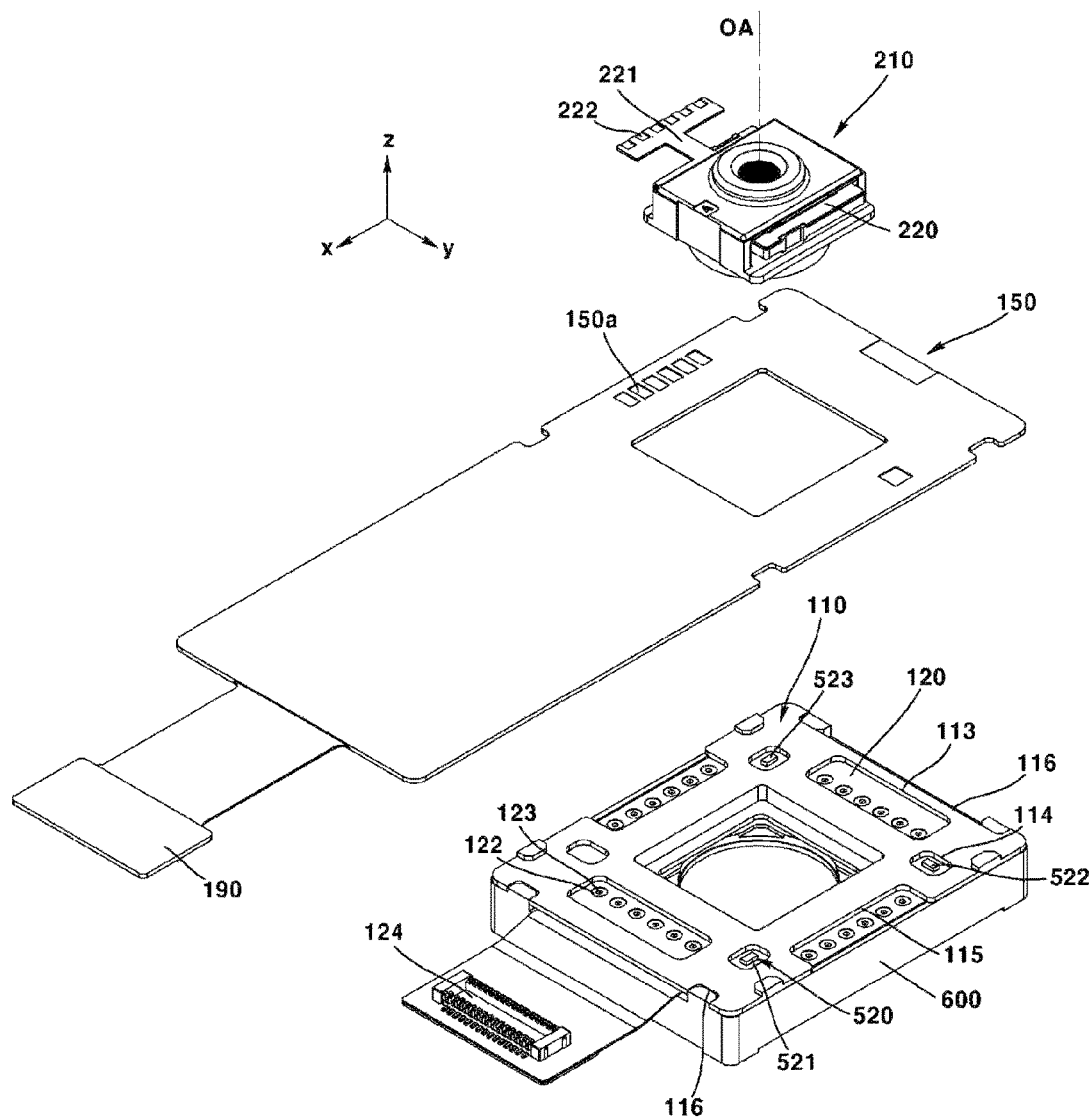

[FIG. 6]
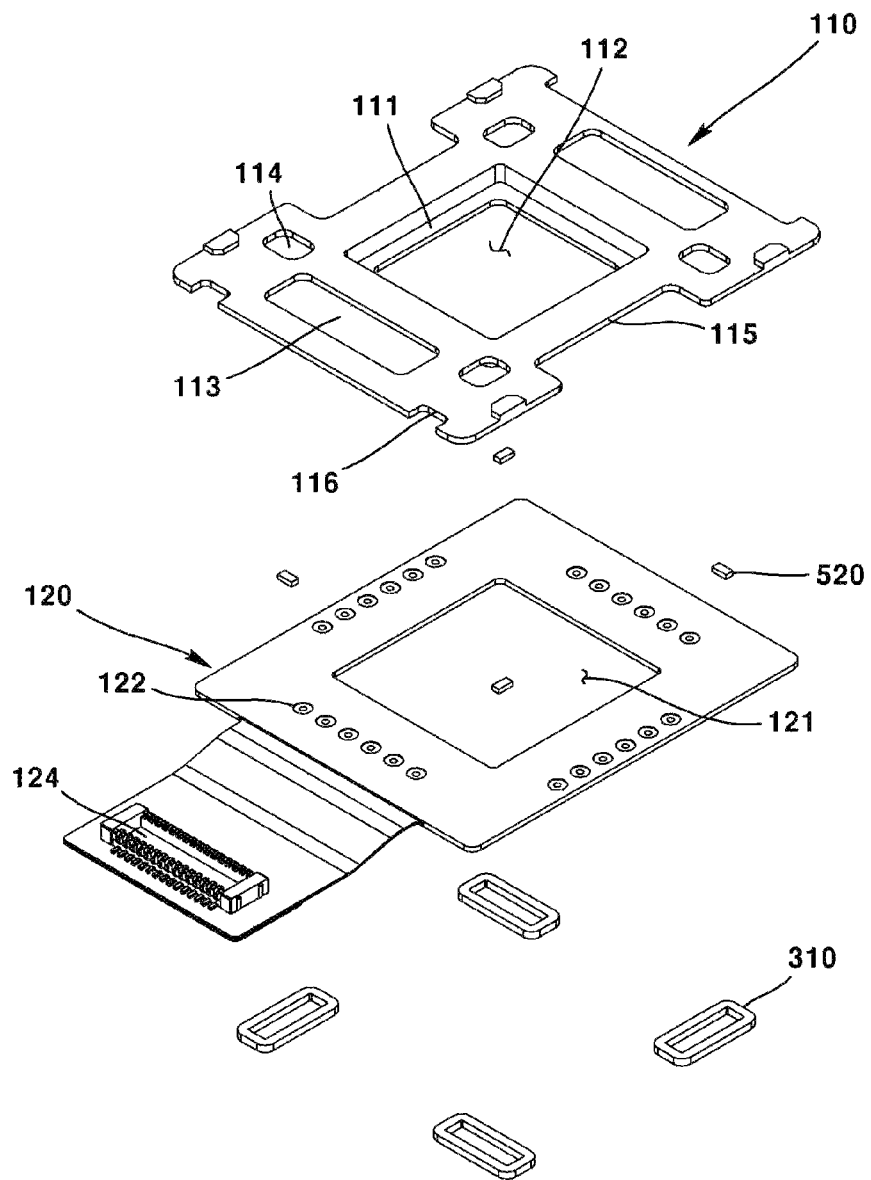

[FIG. 7]
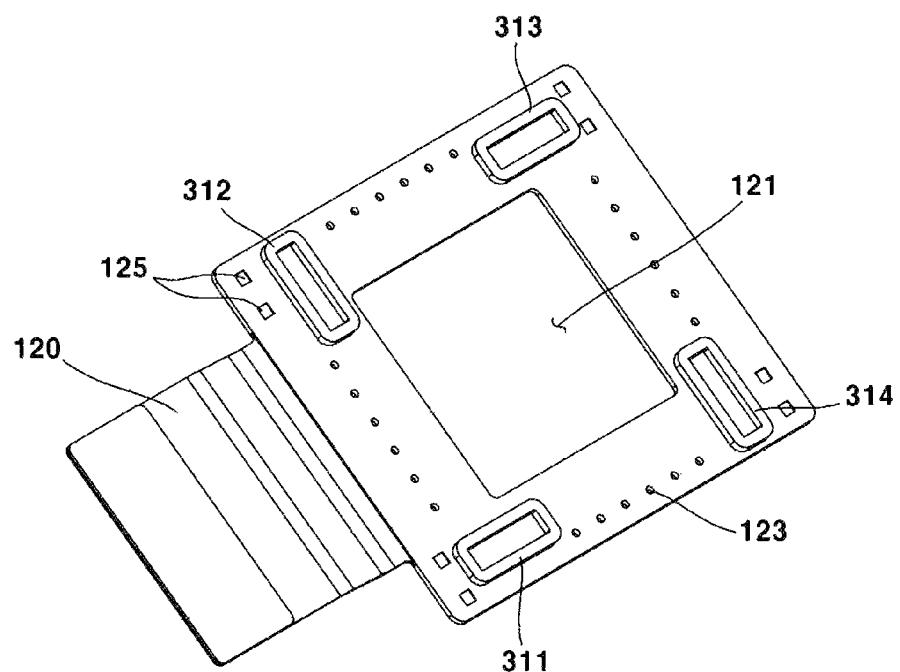

[FIG. 8]
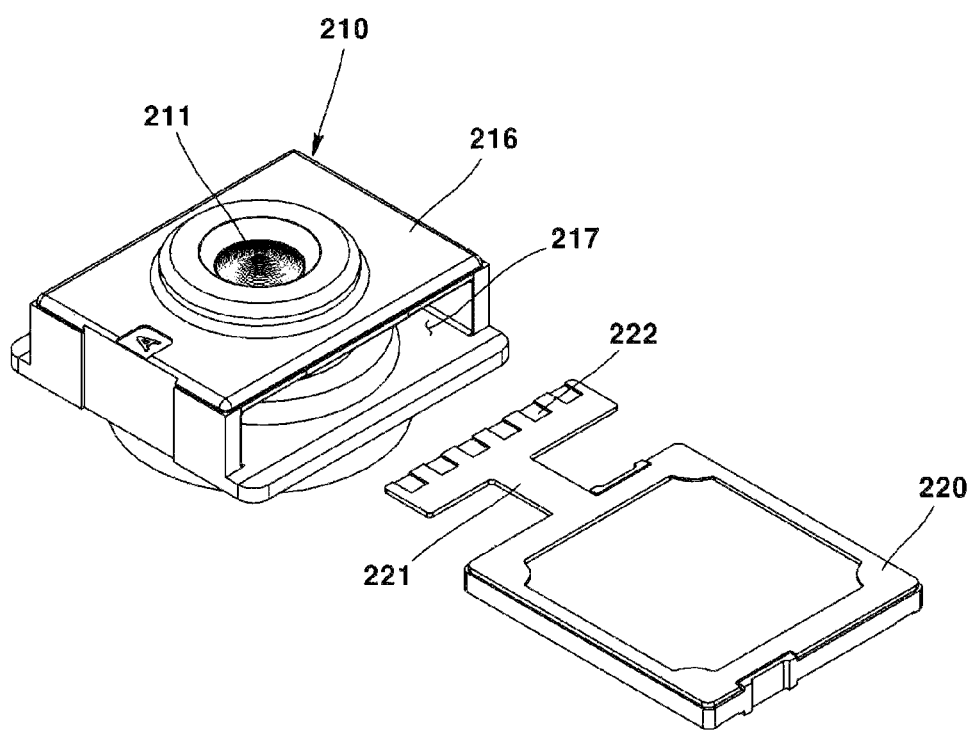

【FIG. 9a】
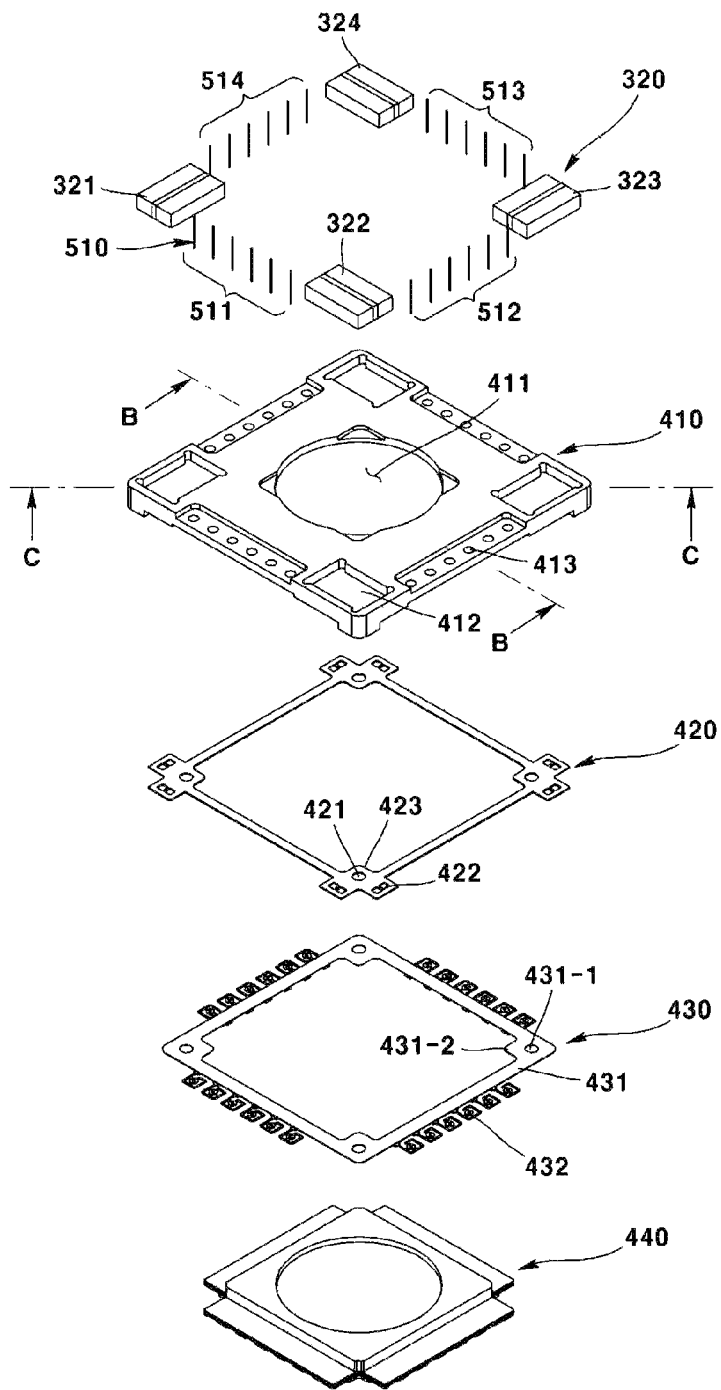

【FIG. 9b】
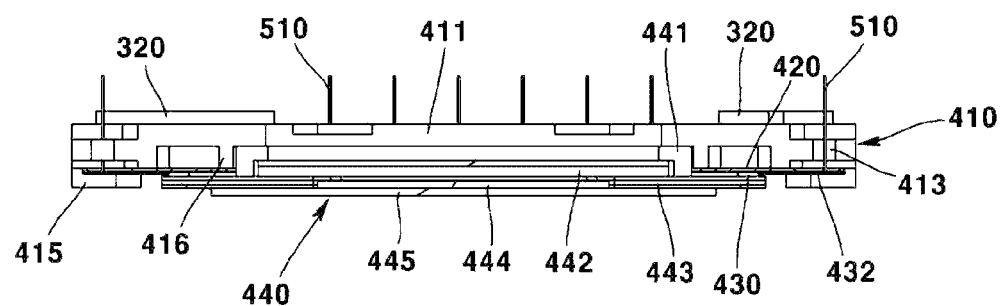
【FIG. 9c】
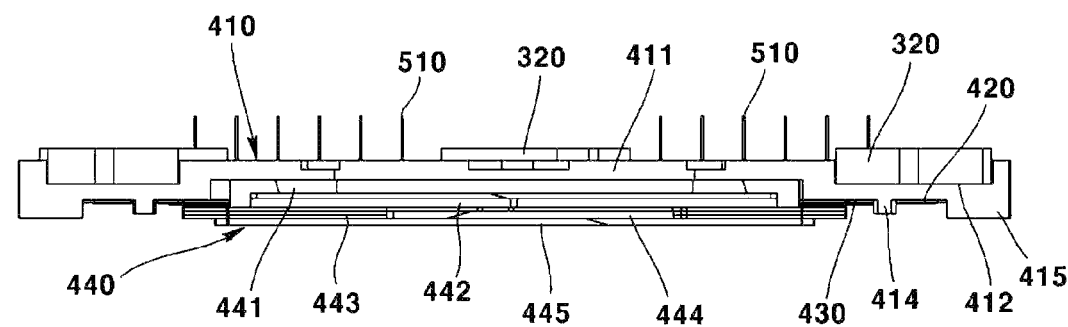

[FIG. 10]
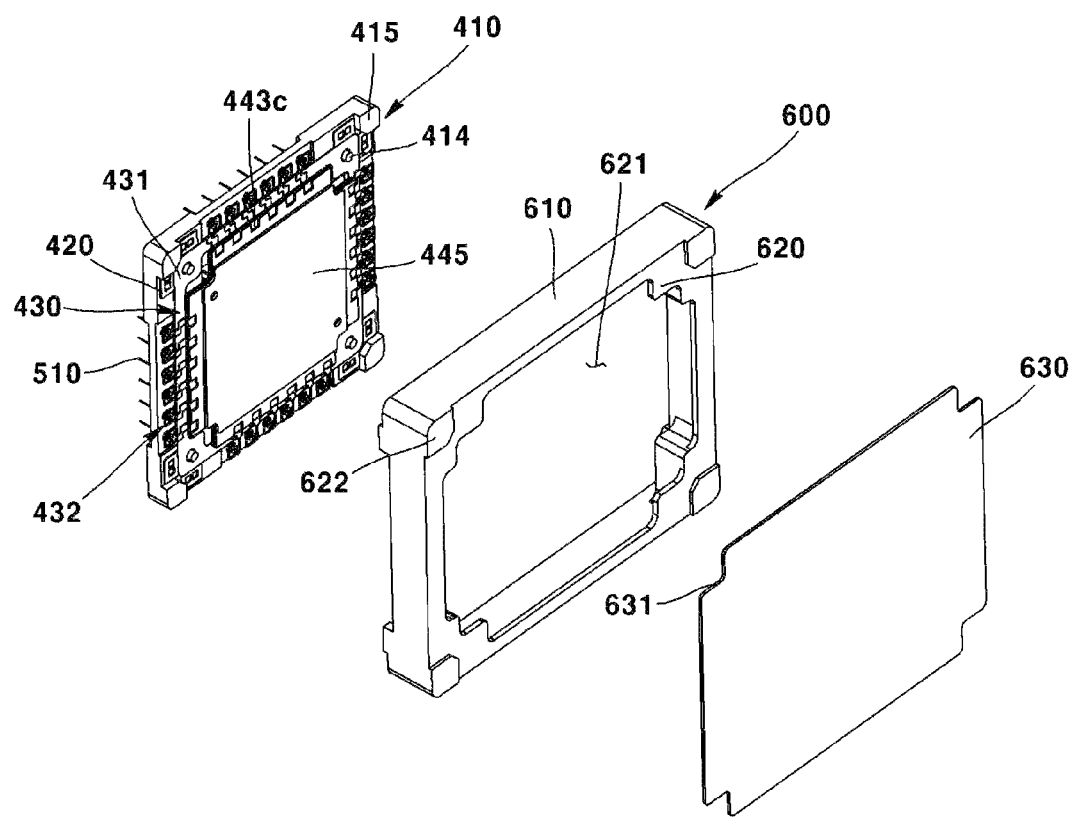

[FIG. 11a]
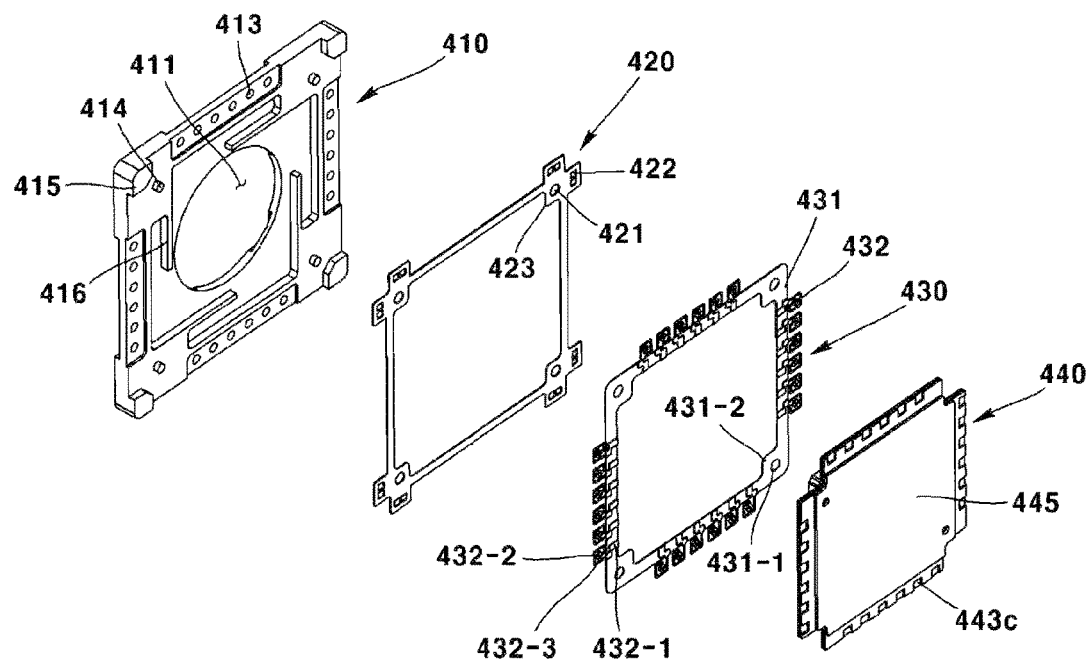

[FIG. 11b]
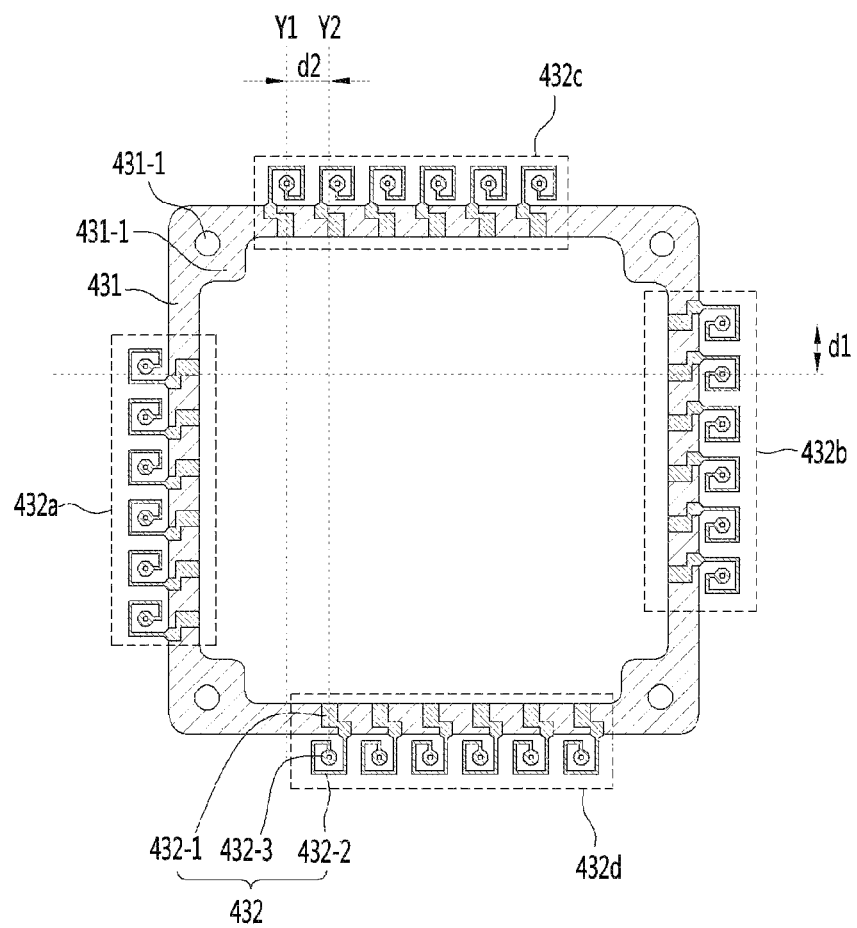

[FIG. 11c]
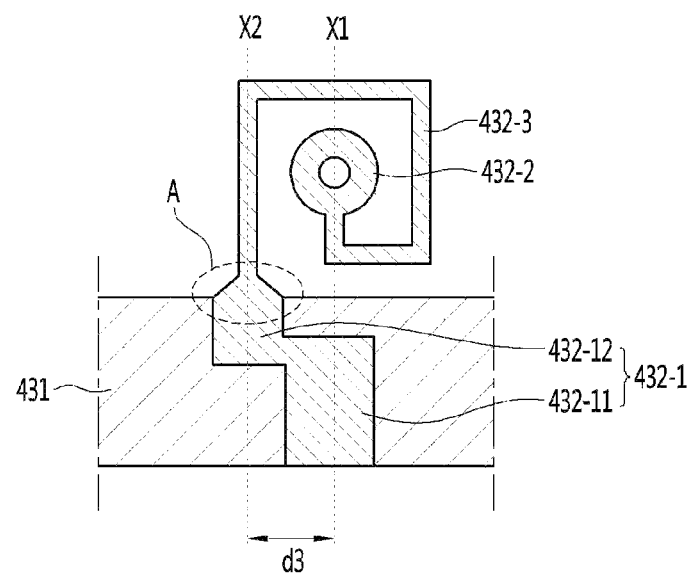

[FIG. 11d]
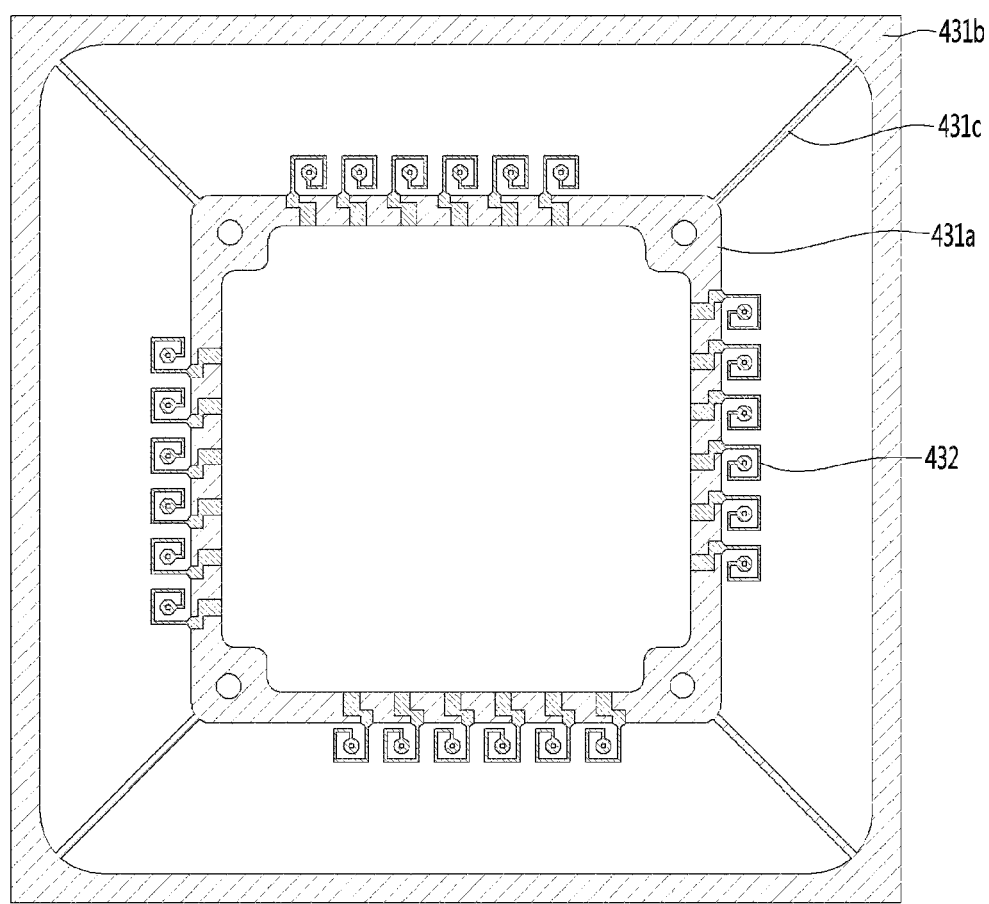

[FIG. 12]
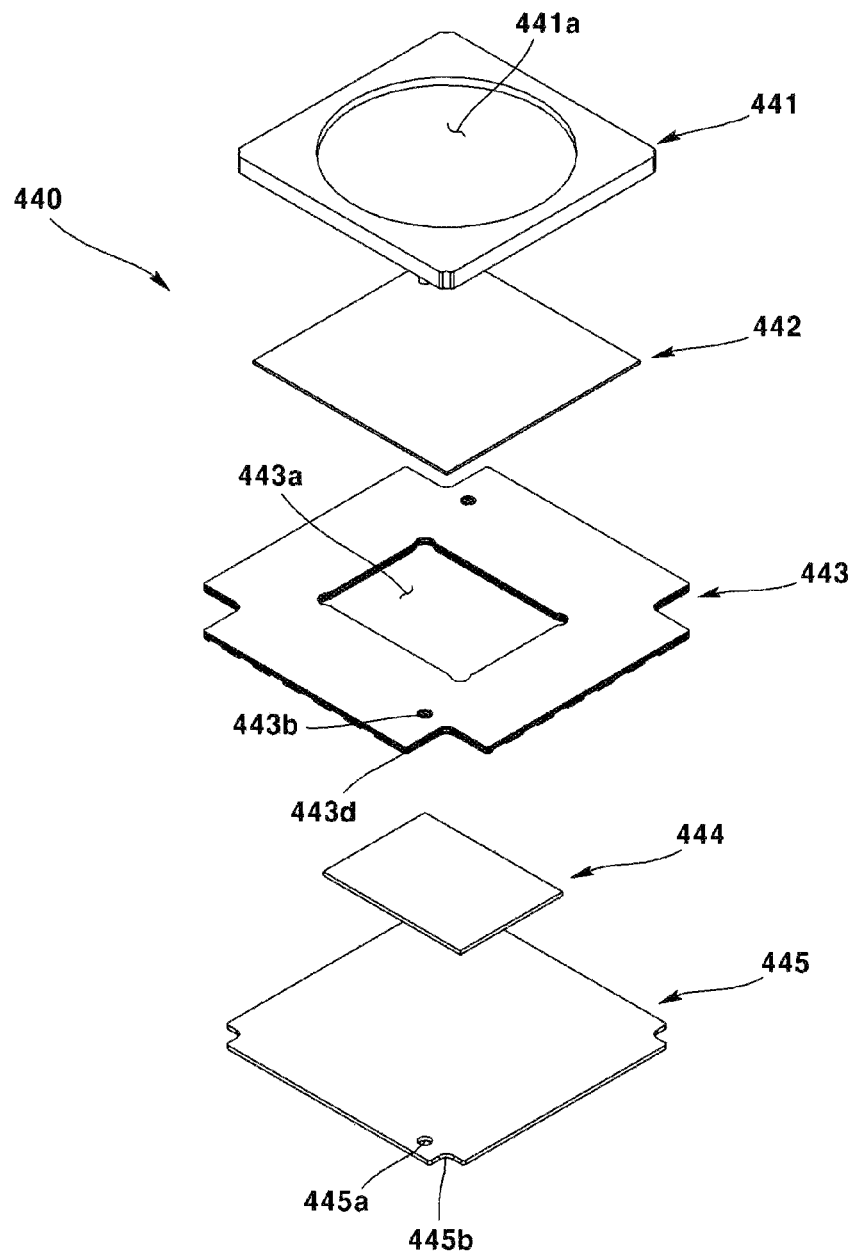

[FIG. 13]
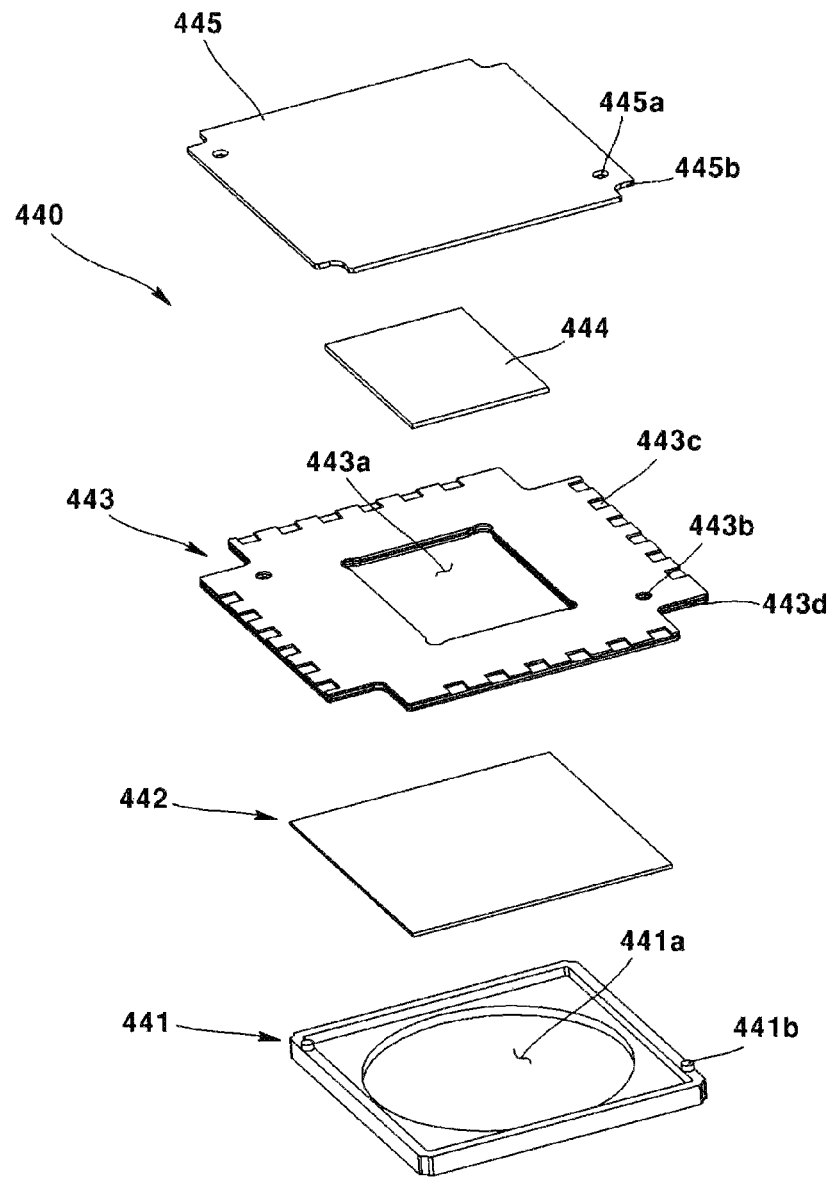

[FIG. 14]
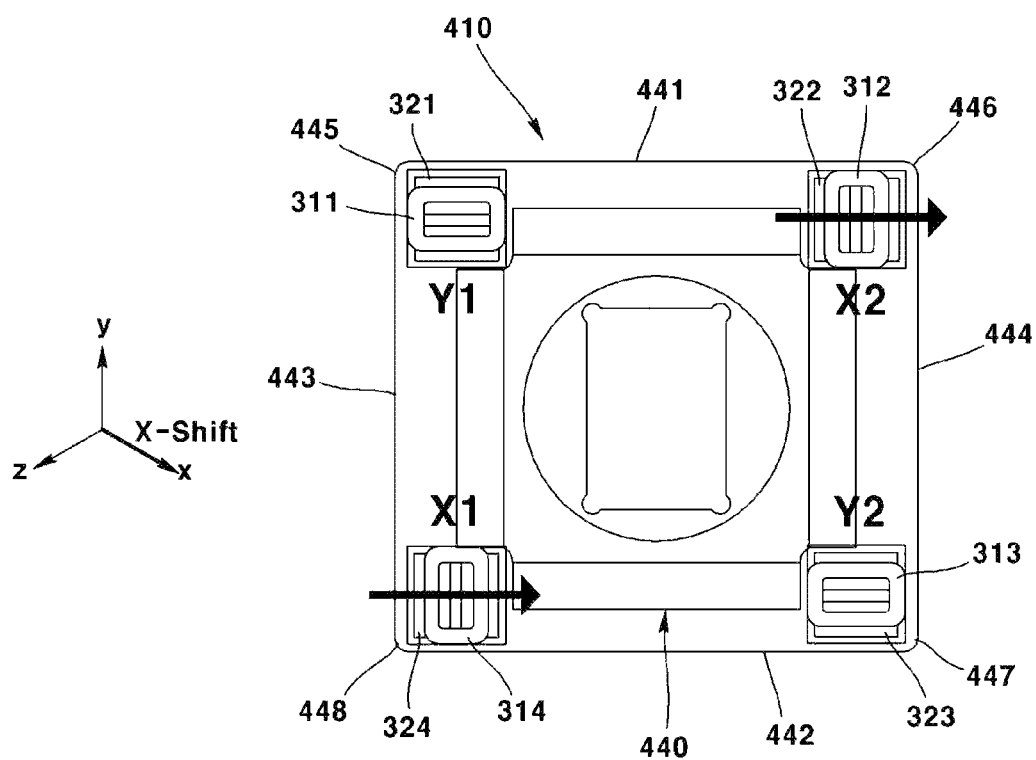

[FIG. 15]
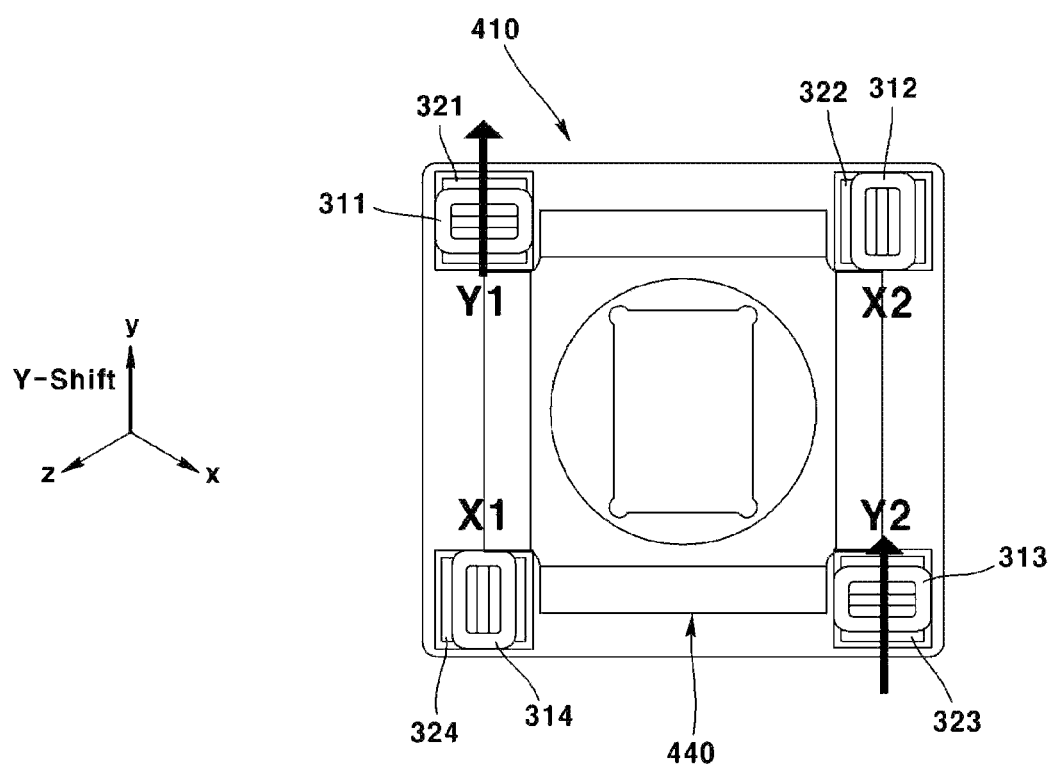

[FIG. 16]
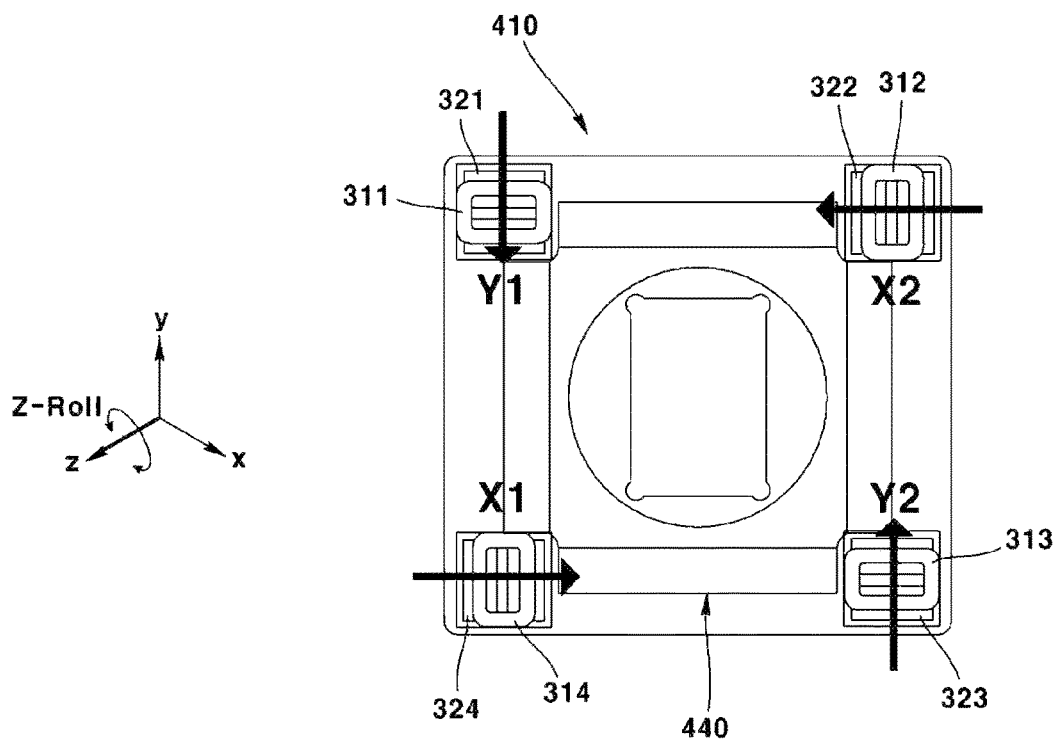
[FIG. 17]
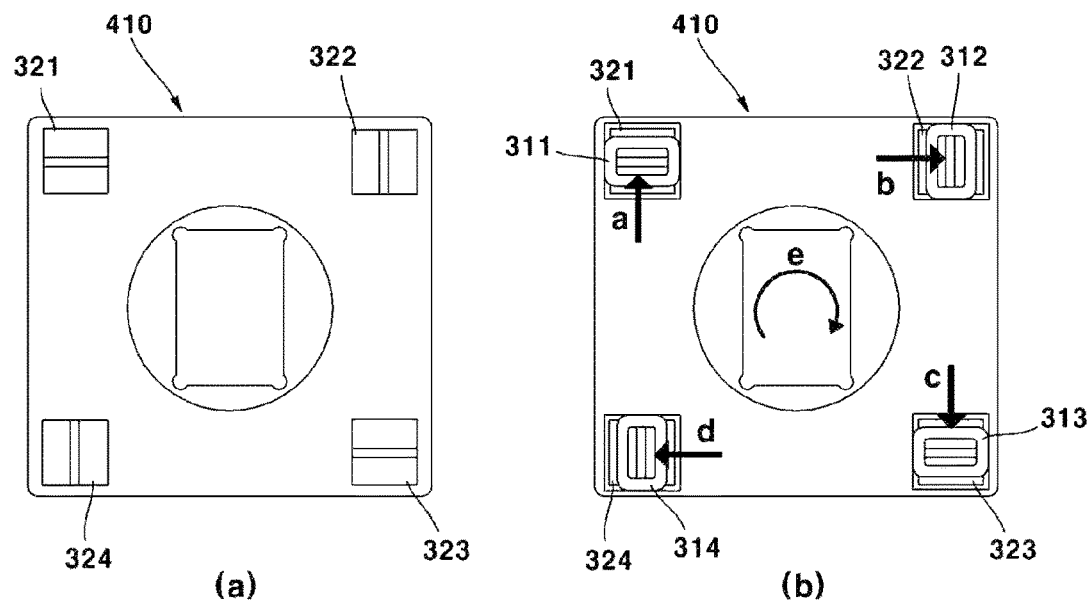

[FIG. 18]
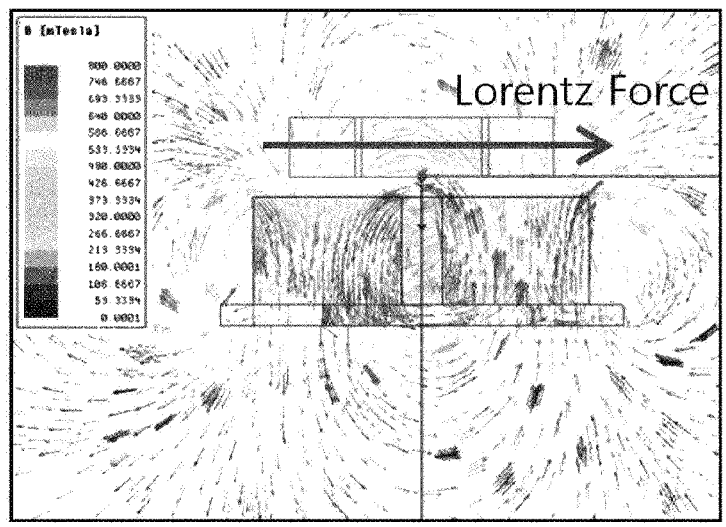
[FIG. 19]
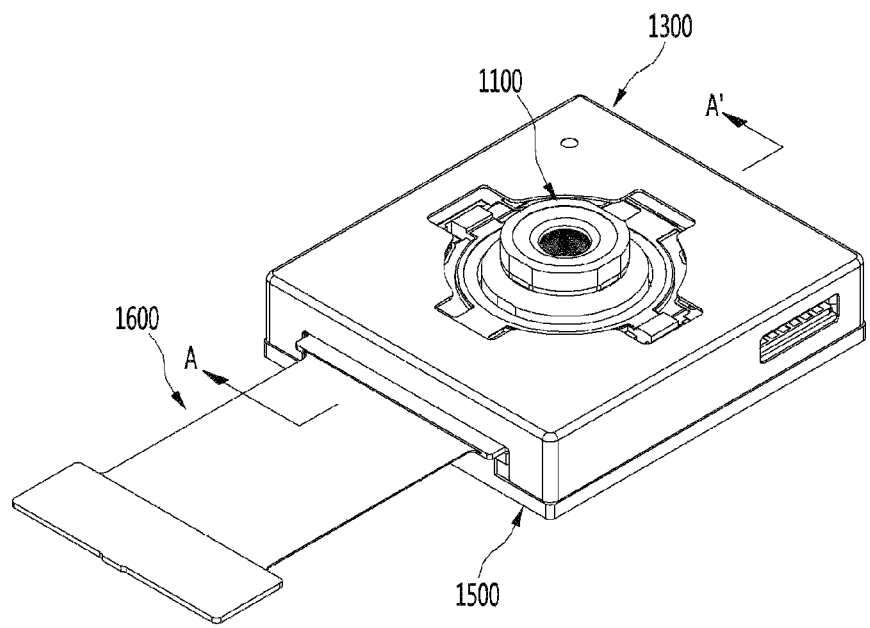

[FIG. 20]
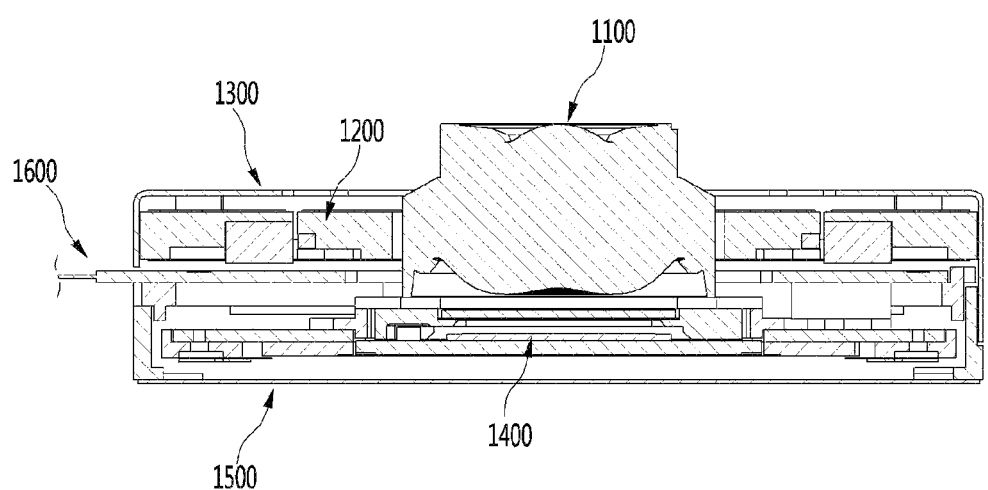

【FIG. 21】
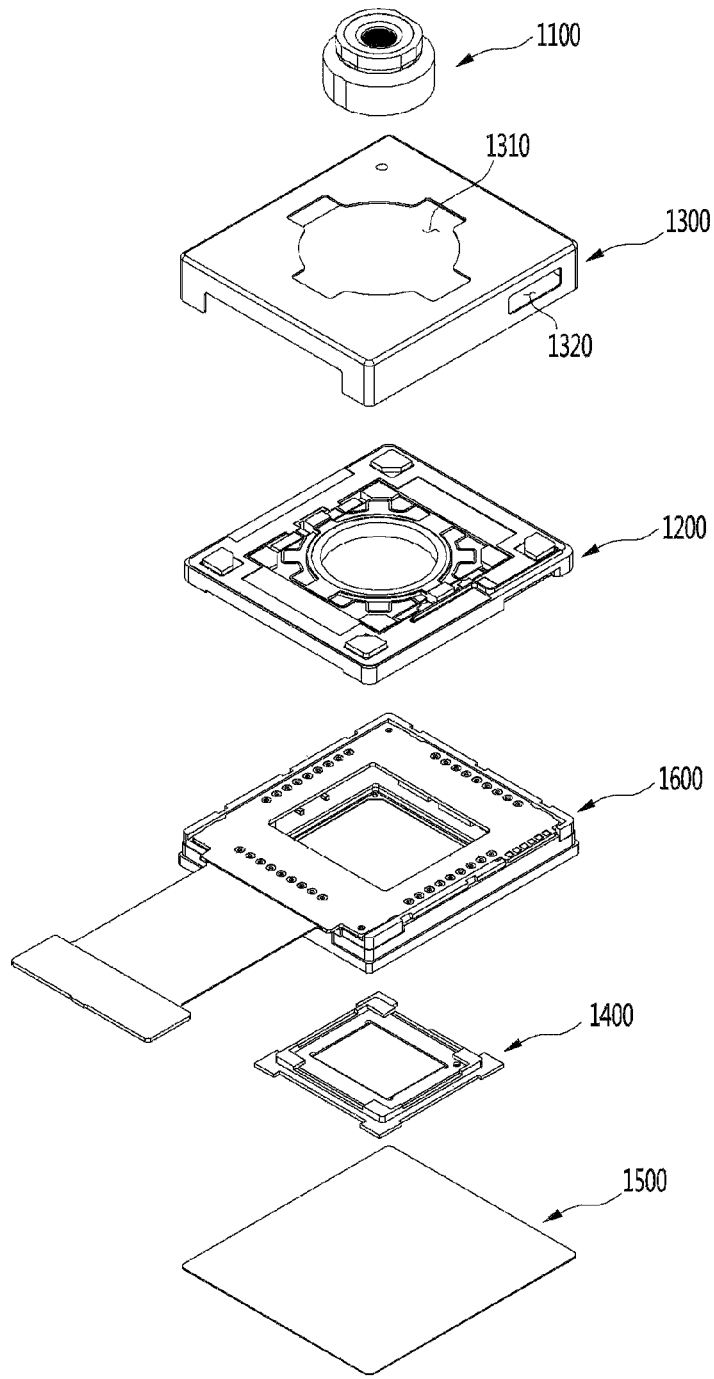

[FIG. 22]
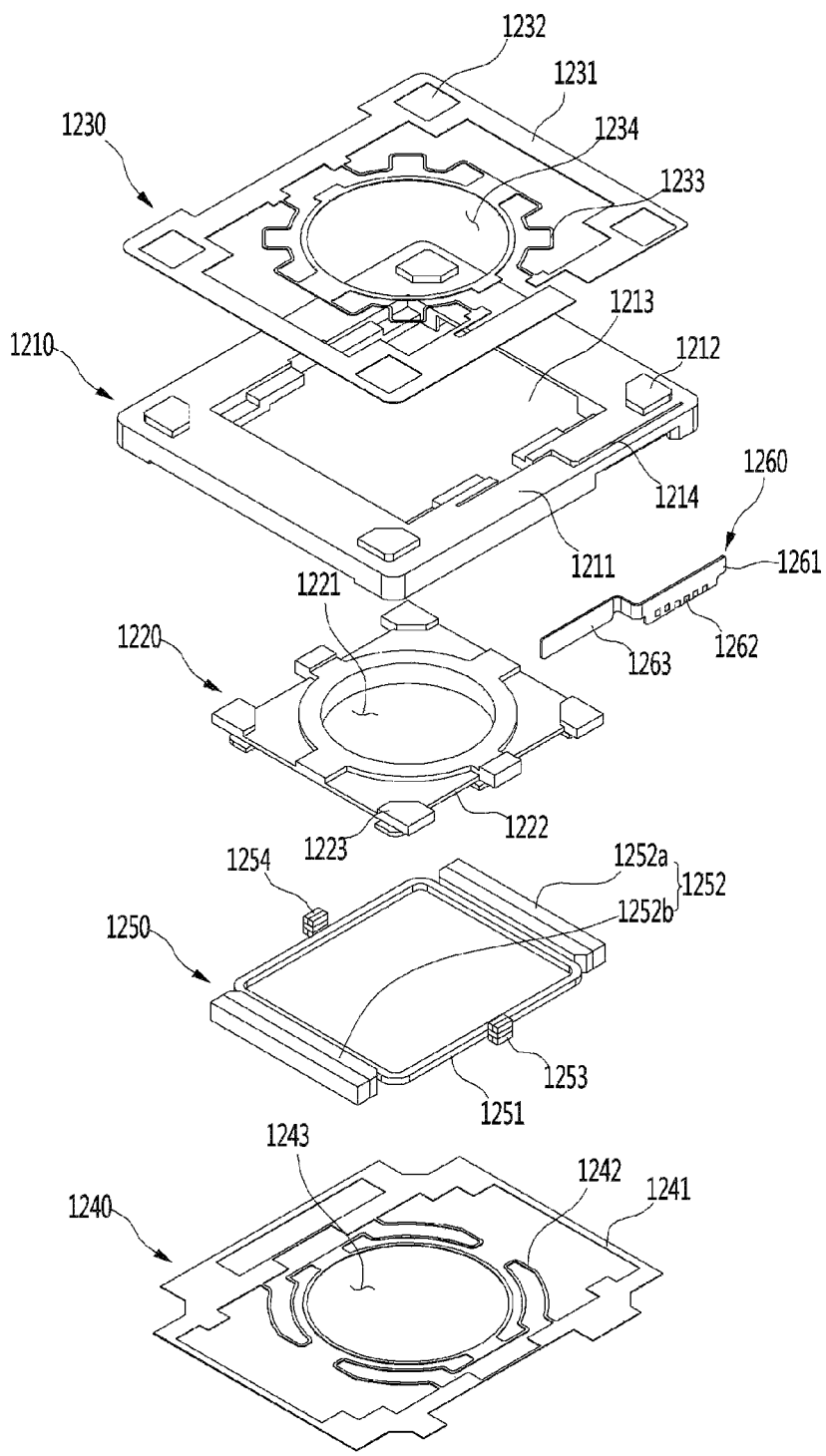

【FIG. 23】
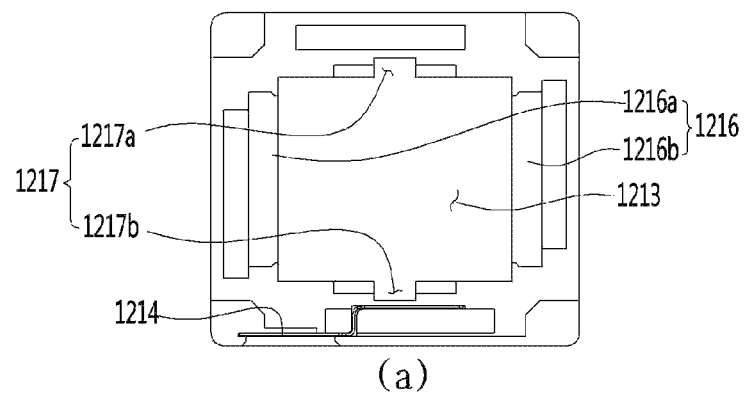
(a)
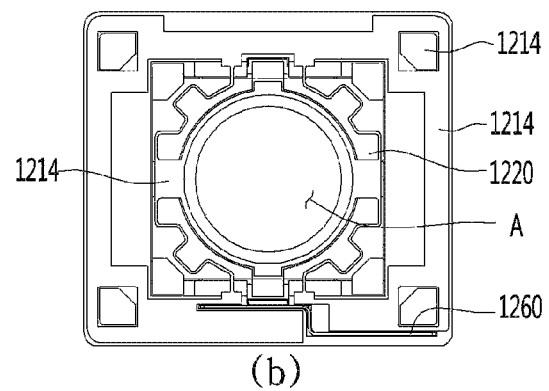
(b)
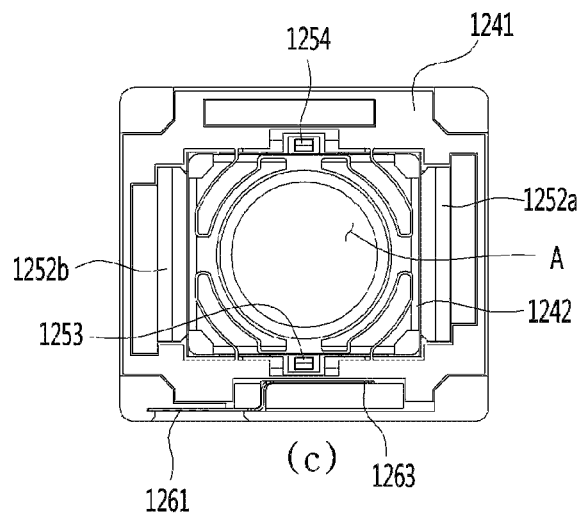
(c)

[FIG. 24]
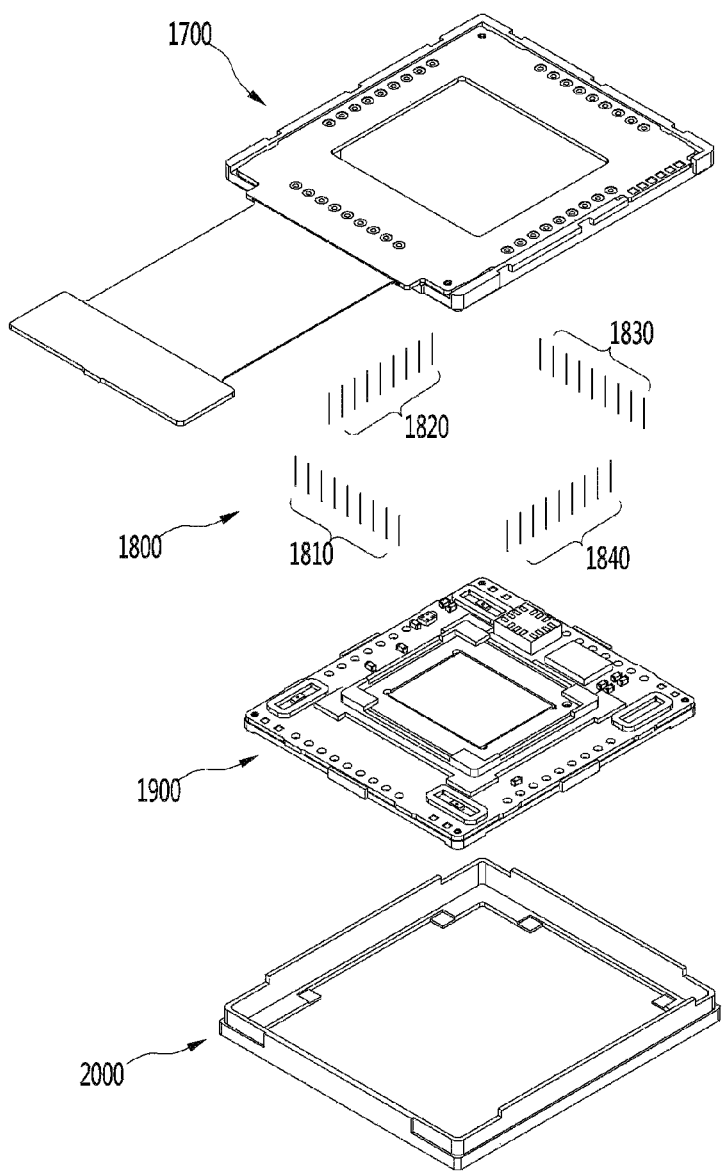

[FIG. 25]
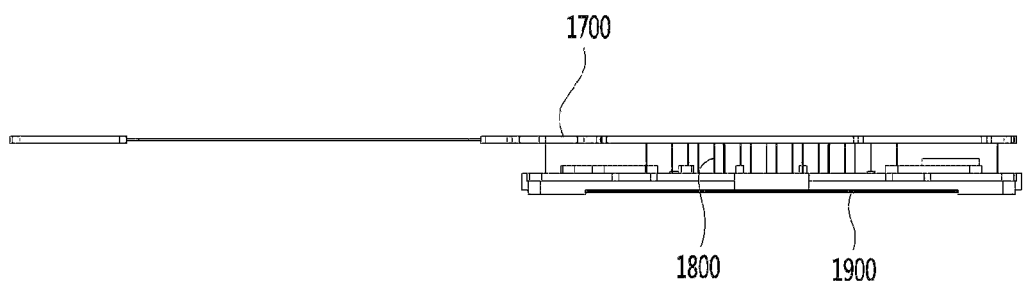

[FIG. 26]
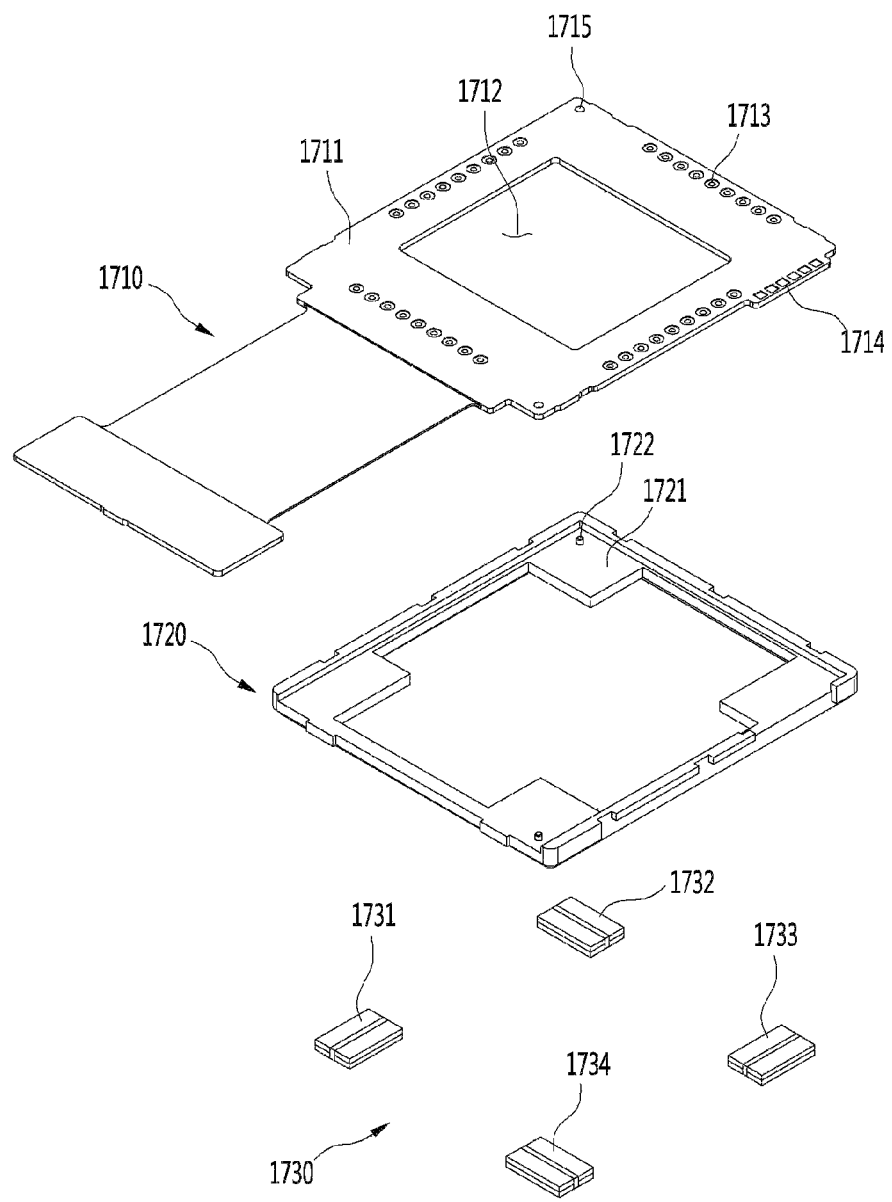

【FIG. 27】
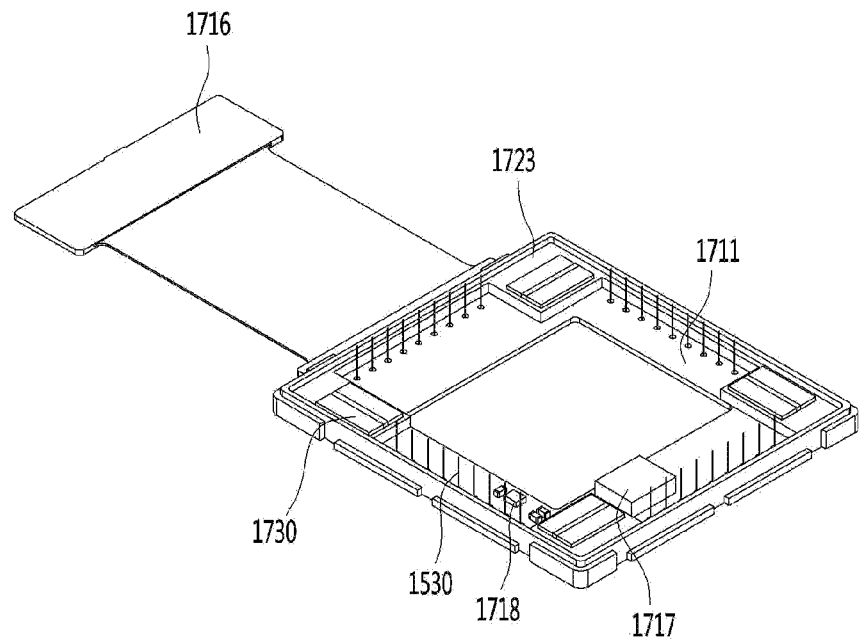
【FIG. 28】
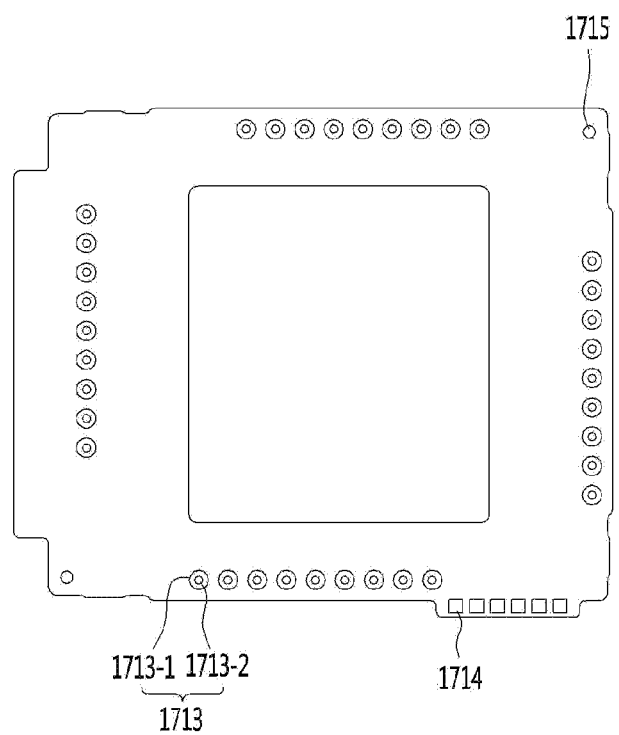

[FIG. 29]
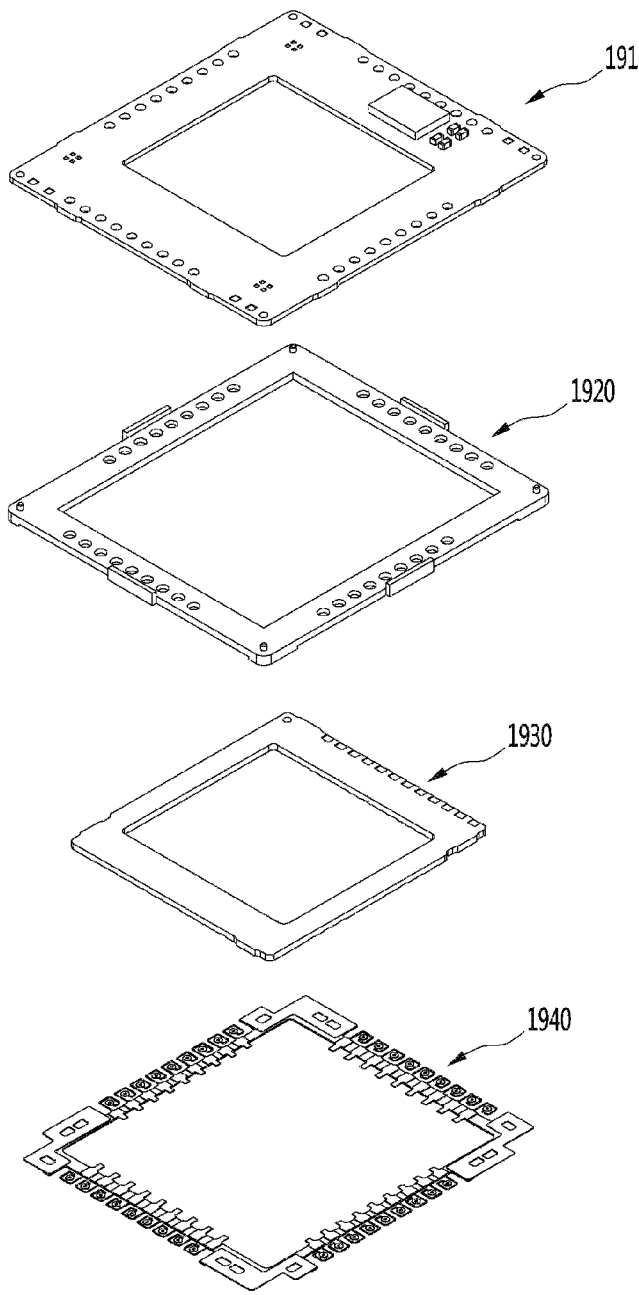

[FIG. 30]
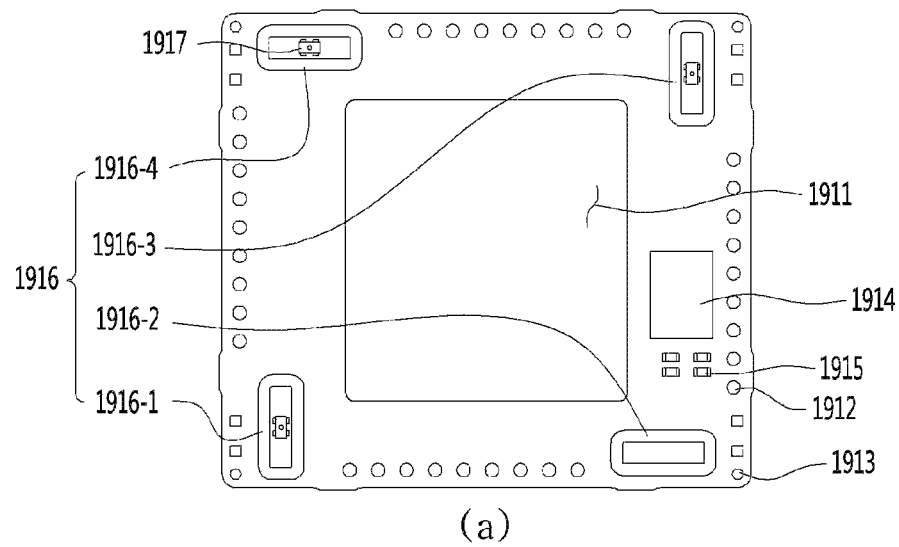
(a)
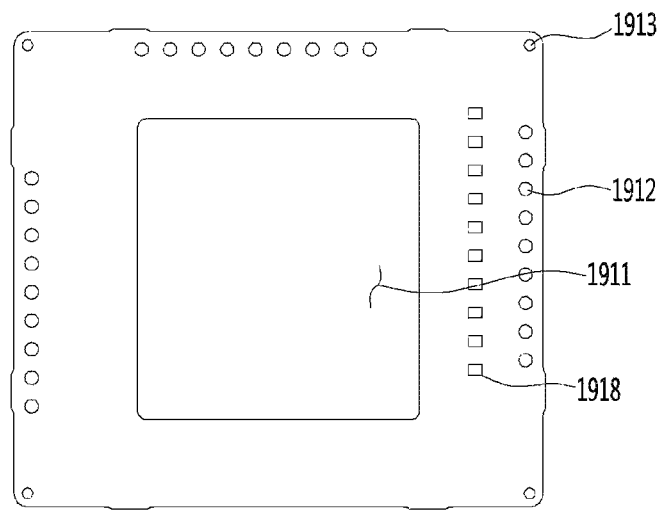
(b)

[FIG. 31]
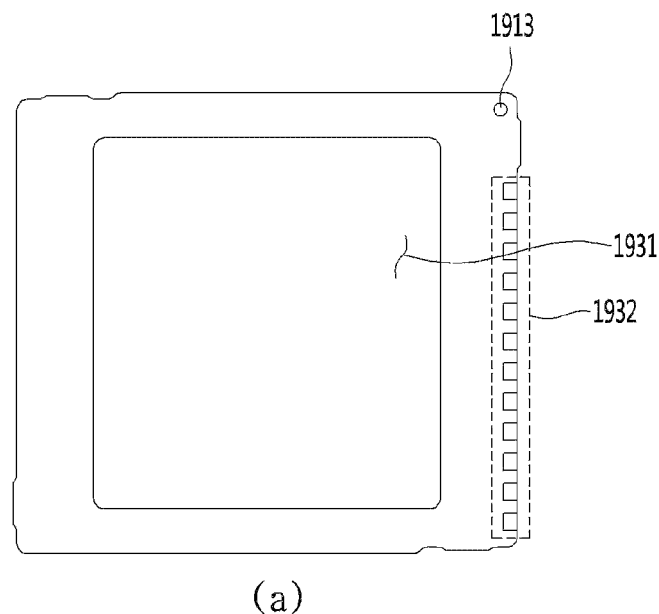
(a)
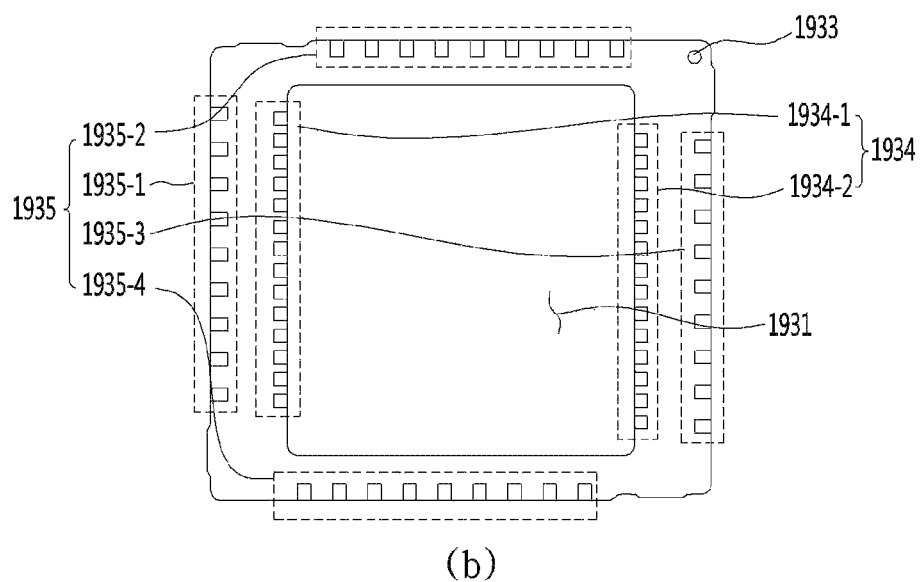
(b)

[FIG. 32]
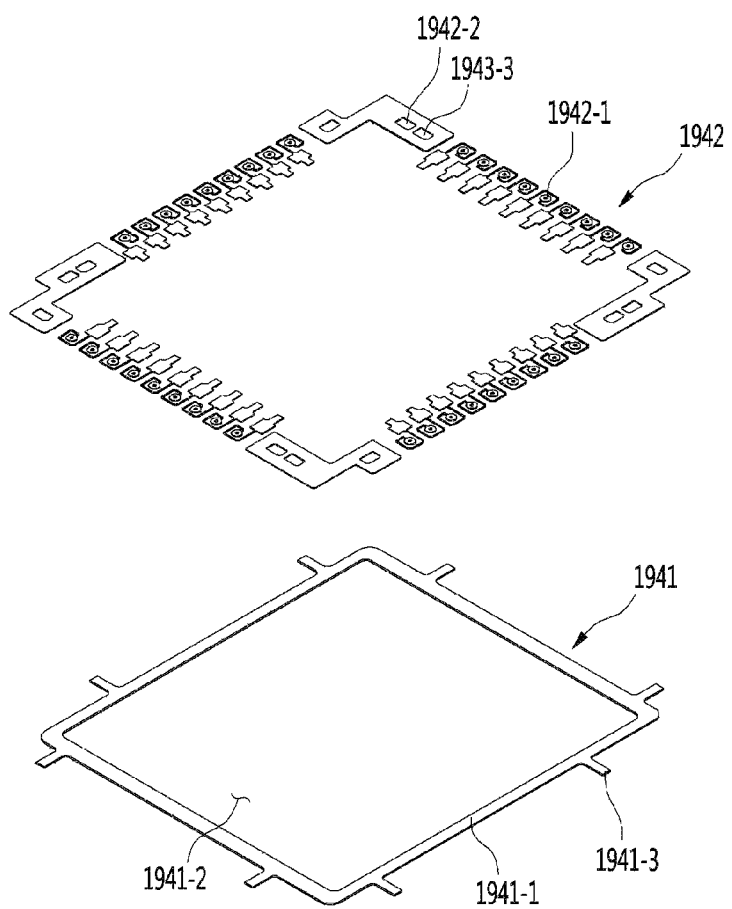

[FIG. 33]
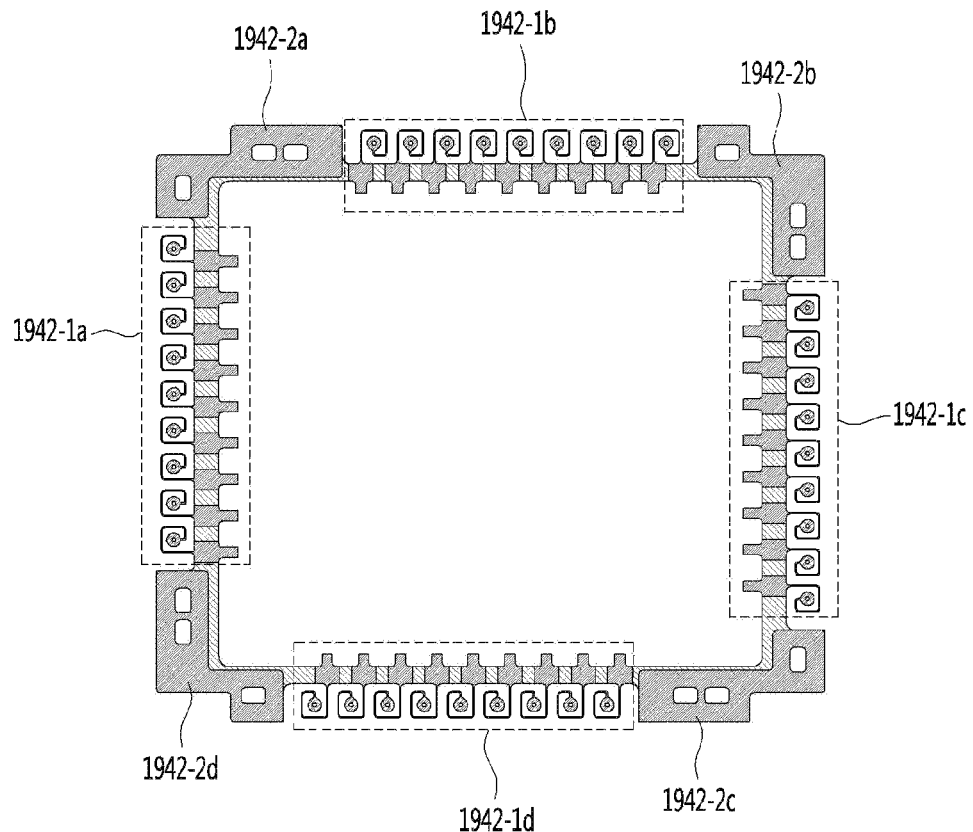
[FIG. 34]
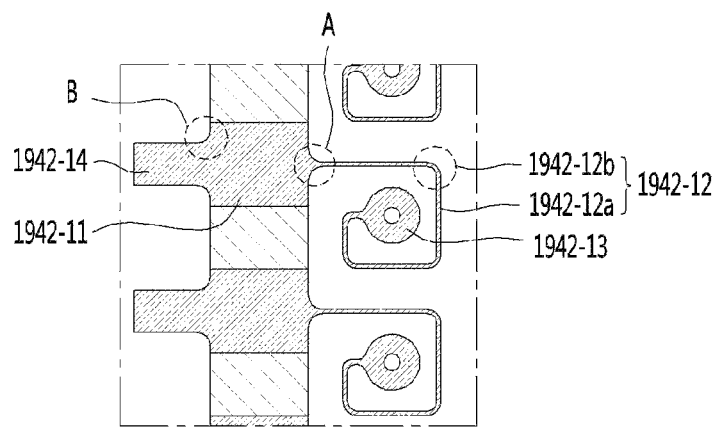

[FIG. 35]
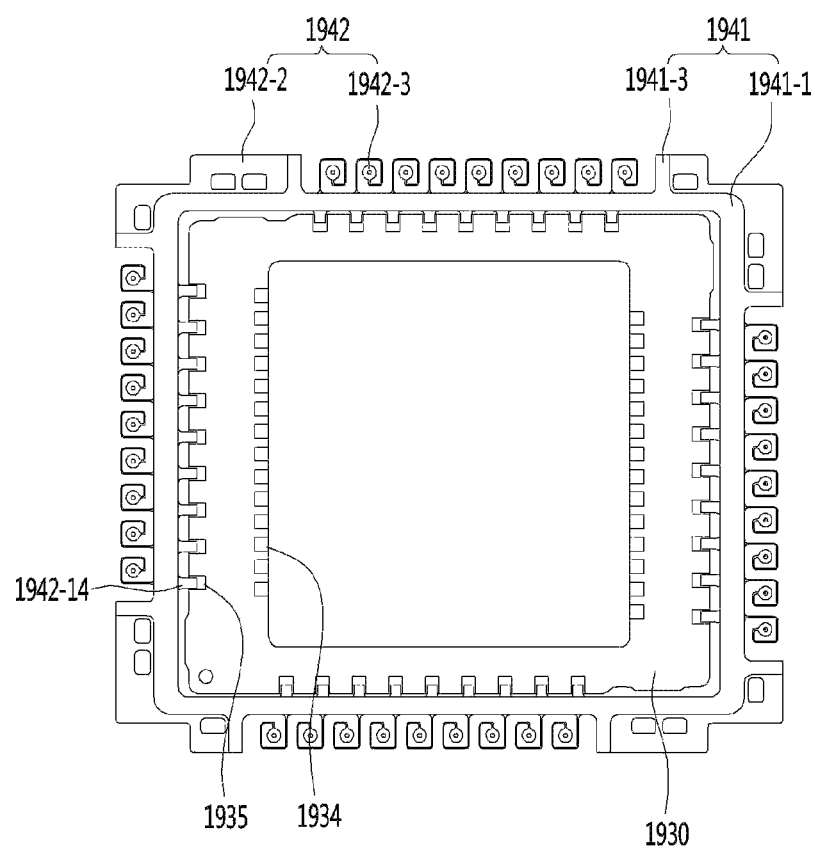

【FIG. 36】
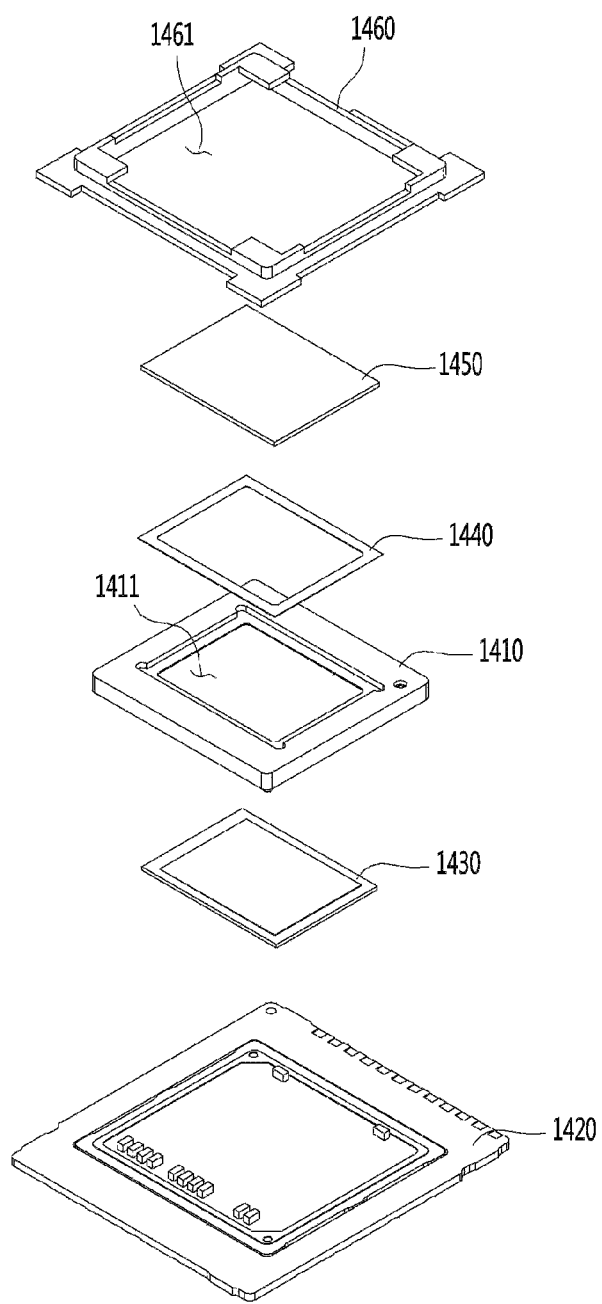

【FIG. 37】
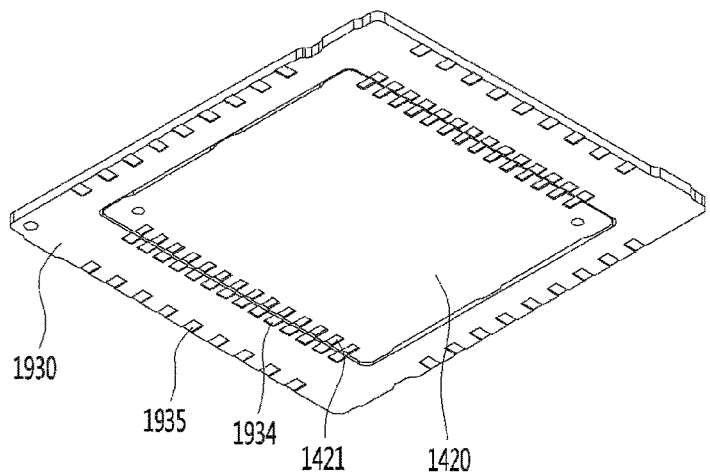
【FIG. 38】
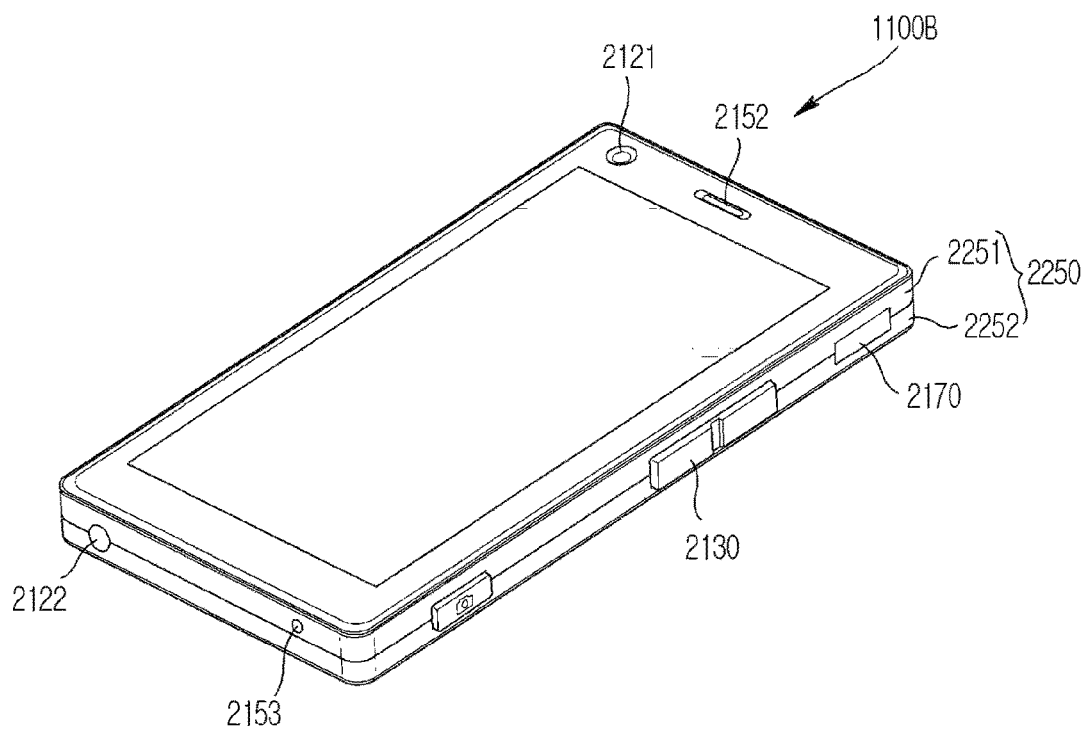

[FIG. 39]
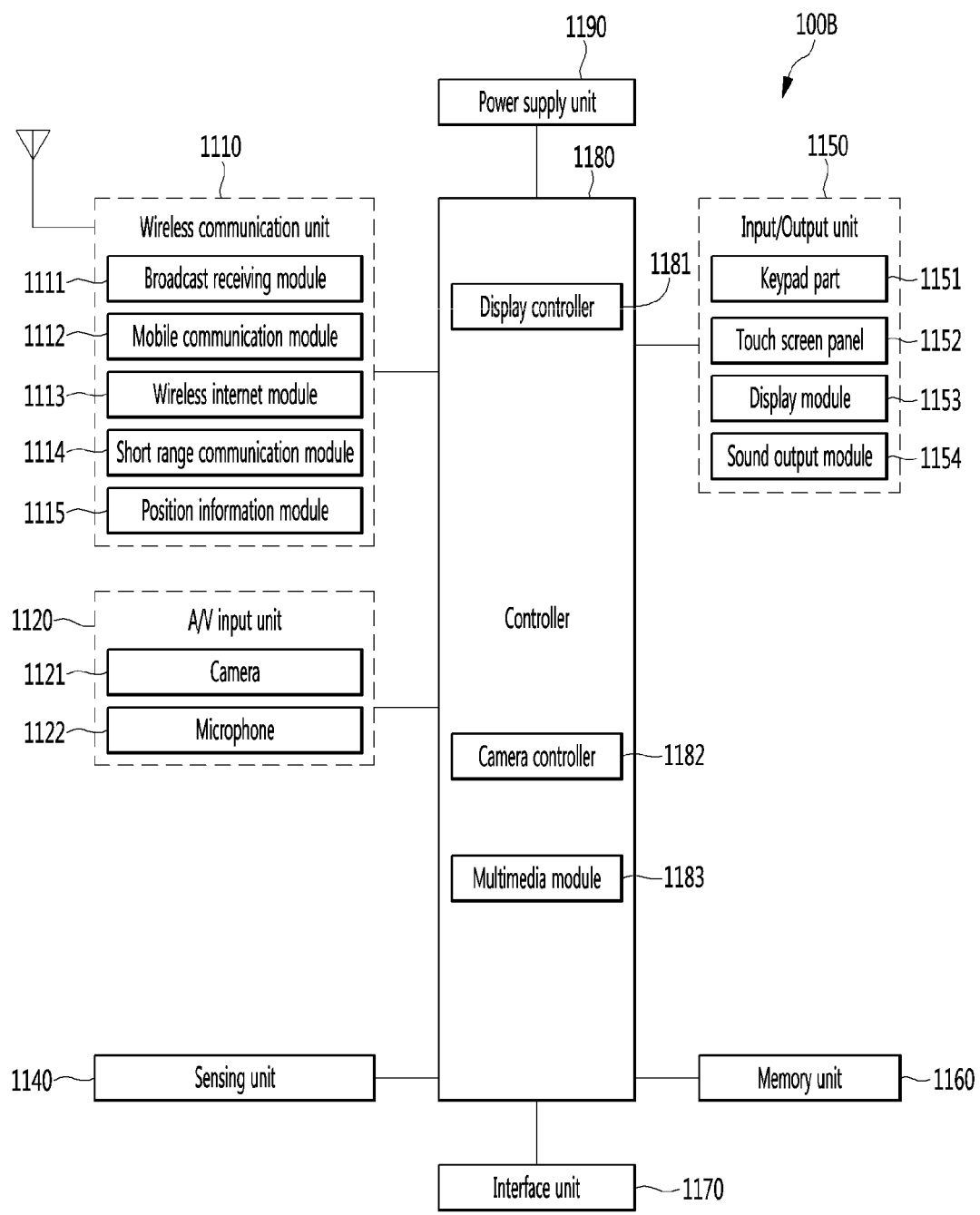

IMAGE SENSOR SUBSTRATE

CROSS REFERENCE TO RELATED APPLICATIONS

This application is the National Phase of PCT International Application No. PCT/KR2020/002982, filed on Mar. 3, 2020, which claims priority under 35 U.S.C. 119(a) to Patent Application Nos. 10-2019-0024661, filed in the Republic of Korea on Mar. 4, 2019, and 10-2019-0107737, filed in the Republic of Korea on Aug. 30, 2019, all of which are hereby expressly incorporated by reference into the present application.

TECHNICAL FIELD

Embodiments relate to an image sensor substrate, and more particularly to an image sensor substrate that may be relatively moved around a lens barrel and on which an image sensor is mounted.

BACKGROUND ART

As various portable terminals are widely used and the wireless Internet service is commercialized, needs of consumers related to the portable terminals are diversified, and various kinds of additional devices are installed in the portable terminals.

A representative one of them is a camera device for photographing a subject in a photograph or a moving image. Meanwhile, recent camera devices employ a camera shake correction function for preventing a phenomenon in which an image shakes due to camera shake of a photographer.

However, the lens shift in a x-axis/y-axis directions used in a conventional camera shake correction module has a limitation in correcting various kinds of camera shake.

DISCLOSURE

Technical Problem

In an embodiment, it is possible to provide an image sensor substrate having a new structure, and a camera module including the same.

In addition, in an embodiment, it is possible to provide an image sensor substrate in which an image sensor is relatively movable with respect to a lens barrel, and a camera module including the same.

Further, in an embodiment, it is possible to provide an image sensor substrate that can perform tilt correction as well as X-axis, Y-axis and Z-axis movement, and a camera module including the same.

Furthermore, in an embodiment, it is possible to provide an image sensor substrate that can simplify a spring structure for providing an autofocus function and a handshake compensation function and a camera module including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

An image sensor substrate according to an embodiment includes: an insulating layer including a first open region; and a first lead pattern part disposed on the insulating layer, wherein the first lead pattern part includes: a first pattern part disposed on the insulating layer; a connection portion extending from the first pattern part; and a second pattern part connected to the first pattern part through the connection portion, wherein the second pattern part and the connection portion are disposed to fly on a region not overlapped with the insulating layer in a vertical direction.

In addition, the connection portion is bent a plurality of times between the first pattern part and the second pattern part.

Further, a center of the first pattern part is aligned on the same vertical extension line or horizontal extension line as a center of the second pattern part.

Furthermore, the first pattern part includes: a mounting part disposed on the insulating layer and on which an image sensor is mounted; and an extension part disposed on the insulating layer and bent and extending from the mounting part.

In addition, a first extension line that crosses a center of the mounting part is spaced apart from a second extension line that crosses a center of the extension part by a third distance.

Further, the extension part may include a region in which one end is connected to the mounting part, the other end is connected to the connection portion, and a width gradually decreases from the one end to the other end.

In addition, the first lead pattern part includes: a plurality of first-first lead pattern parts disposed on a first region of the insulating layer; and a plurality of first-second lead pattern parts disposed on a second region facing the first region of the insulating layer, wherein a center of the first-first lead pattern part disposed at the outermost side of the plurality of first-first lead pattern parts is spaced apart from a center of the first-second lead pattern part disposed at the outermost portion of the plurality of first-second lead pattern parts by a first distance.

Further, the plurality of first-first lead pattern parts are disposed to be biased in a first direction with respect to a center of the first region, and the plurality of first-second lead pattern parts are disposed to be biased in a second direction opposite to the first direction with respect to a center of the second region.

Furthermore, the second pattern part includes a first insertion hole through which a wire passes.

An image sensor substrate module according to an embodiment includes: an image sensor substrate on which an image sensor is mounted; and a substrate holder disposed on the image sensor substrate, wherein the image sensor substrate includes: an insulating layer including a first open region; and a first lead pattern part disposed on the insulating layer, and the substrate holder includes a third open region overlapped with the first open region in a vertical direction, wherein the first lead pattern part includes: a first pattern part disposed on the insulating layer; a connection portion extending from the first pattern part; and a second pattern part connected to the first pattern part through the connection portion, wherein the second pattern part and the connection portion are disposed to fly on a region not overlapped with the insulating layer in the vertical direction.

In addition, the substrate holder is formed in a corner region of an upper surface thereof, and includes an accommodating groove into which a magnet or coil is inserted.

Further, a reinforcing member disposed between the substrate holder and the insulating layer of the image sensor substrate and including a second open region overlapped with the first and second open regions in the vertical direction is included.

Furthermore, the second pattern part includes a first insertion hole through which a wire passes, and the substrate holder includes a second insertion hole aligned with the first insertion hole in the vertical direction.

An image sensor actuator according to an embodiment includes: a driving substrate including a second lead pattern part; an image sensor substrate module disposed spaced apart from the driving substrate at a predetermined distance and including a first lead pattern part; an image sensor coupled to the image sensor substrate module and connected to the first lead pattern art; and a wire having one end connected to the first lead pattern part and the other end connected to the second lead pattern part, wherein the image sensor substrate module includes: a substrate holder; and an image sensor substrate coupled to a lower portion of the substrate holder, wherein the image sensor substrate includes: an insulating layer including a first open region; and the first lead pattern part disposed on the insulating layer, wherein the first lead pattern part includes: a first pattern part disposed on the insulating layer and connected to the image sensor; a connection portion bent and extending from the first pattern part; and a second pattern part extending from the connection portion and connected to the other end of the wire, wherein the second pattern part and the connection portion are disposed to fly on an region not overlapped with the insulating layer in a vertical direction.

In addition, the first lead pattern part includes: a plurality of first-first lead pattern parts disposed on a first region of the insulating layer; and a plurality of first-second lead pattern parts disposed on the second region facing the first region of the insulating layer and facing the first-first lead pattern parts, wherein the plurality of first-first lead pattern parts are disposed to be biased in a first direction with respect to a center of the first region, and the plurality of first-second lead pattern parts are disposed to be biased in a second direction opposite to the first direction with respect to a center of the second region.

Further, insertion holes aligned with each other in the vertical direction and through which the wire passes are formed in the first lead pattern part, the substrate holder, the second lead pattern part, and the driving substrate, respectively.

Furthermore, a coil disposed in a corner region of a lower surface of the drive substrate and a magnet disposed in a corner region of an upper surface of the substrate holder and facing the coil are included.

Meanwhile, a substrate according to another embodiment includes: an insulating layer; and a lead pattern part disposed on the insulating layer, wherein the lead pattern part includes: a first portion disposed on one surface of the insulating layer; a second portion extending from one end of the first portion; a third portion connected to the first portion through the second portion and including a through-hole; and a fourth portion extending from the other end opposite to the one end of the first portion, wherein the second to fourth portions are disposed on a region not overlapped with the insulating layer in the vertical direction.

In addition, the second portion is bent a plurality of times between the first portion and the third portion.

Further, the second portion includes a second-first portion extending in a first direction, a second-second portion extending in a second direction different from the first direction, and a bent portion between the second-first portion and the second-second portion, and a line width of each of the second-first portion and the second-second portion is smaller than that of the bent portion.

In addition, a side surface of the bent portion has a curved surface.

Further, a curvature R of the side surface of the bent portion has a range between 30 and 100.

Furthermore, the bent portion includes an inner surface and an outer surface, and the curvature R of the inner surface is different from that of the outer surface.

In addition, the insulating layer includes an opening in the center thereof, and the fourth portion of the lead pattern part is positioned on the opening.

Further, the substrate includes a reinforcing pattern disposed on the insulating layer, and the reinforcing pattern is formed of the same metal material as the lead pattern part.

In addition, the insulating layer includes: a first insulating region in contact with the first portion of the lead pattern part and the reinforcing pattern; and a second insulating region protruding from an outer surface of the first insulating region in a direction in which the reinforcing pattern is disposed, and contacting the reinforcing pattern.

Further, the reinforcing pattern includes at least one coupling hole disposed on a region not overlapped with the insulating layer in the vertical direction.

Furthermore, in the lead pattern part, a line width of the first portion is larger than that of the fourth portion, and a line width of the second portion is smaller than that of the fourth portion.

In addition, the lead pattern part includes: a first buffer part disposed between the first portion and the second portion, having a side surface having a curved surface, and having a width decreased as going from the first portion toward the second portion; and a second buffer portion disposed between the first portion and the fourth portion, having a side surface having a curved surface, and having a width decreased as going from the first portion toward the fourth portion.

Further, the substrate includes an adhesive member disposed between the insulating layer and the first portion of the lead pattern part and including roughness on a surface thereof.

Meanwhile, an image sensor substrate module according to an embodiment includes: a first substrate having a driver IC and a coil disposed on an upper surface thereof and a first pad portion connected to the driver IC disposed on a lower surface thereof; a second substrate disposed under the first substrate and having a second pad portion connected to the first pad portion disposed on an upper surface thereof and a third pad portion disposed on a lower surface thereof; and a lead pattern part disposed under the second substrate, disposed on an insulating layer, and connected to the third pad portion, wherein the lead pattern part includes a first portion disposed on a region overlapped with the insulating layer in a vertical direction, and a second portion connected to one end of the first portion and disposed on a region not overlapped with the insulating layer in the vertical direction, and which does not contact the insulating layer, wherein the third pad portion is disposed in a region overlapped with at least a part of the second portion of the lead pattern part in the vertical direction, and is connected to the second portion.

In addition, the second substrate includes a fourth pad portion connected to the image sensor substrate on which the image sensor is mounted.

Further, the fourth pad portion includes a fourth-first pad portion disposed in a first region of the lower surface of the second substrate, to which an image signal is transmitted from the image sensor substrate, and a fourth-second pad portion disposed in a second region opposite to the first region of the lower surface of the second substrate, to which a signal other than the image signal is transmitted from the image sensor substrate.

Furthermore, the first region is a region of the lower surface of the second substrate, which is not overlapped with the first pad portion, the second pad portion, and the driver IC in the vertical direction.

In addition, the second substrate includes a substrate holder disposed below the first substrate and having an opening formed in a region overlapped with the first pad portion in the vertical direction, and the second substrate is disposed in the opening of the substrate holder.

In addition, the lead pattern part includes a third portion connected to the other end of the first portion and disposed on a region not overlapped with the insulating layer in the vertical direction, and the third portion is bent a plurality of times.

Effects of the Invention

According to the embodiment, in order to realize OIS and AF functions of the camera module, instead of moving the conventional lens barrel, the image sensor is moved relative to the lens barrel in the X-axis, Y-axis, and Z-axis directions. Accordingly, the camera module according to the embodiment may remove a complicated spring structure for realizing the OIS and AF functions, thereby simplifying a structure. In addition, the structure that is more stable than the existing one may be formed by moving the image sensor according to the embodiment relative to the lens barrel.

In addition, according to the embodiment, the terminal portion electrically connected to the image sensor has a spring structure and is disposed to be floated at a position not overlapped with the insulating layer in the vertical direction. Accordingly, the camera module may move the image sensor relative to the lens barrel while supporting the image sensor stably and elastically.

According to the above-described embodiment, a X-axis direction shift, a Y-axis direction shift, and a Z-axis-centered rotation corresponding to camera shake with respect to the image sensor may be performed, and accordingly, the camera shake correction with respect to the lens corresponding to the camera shake correction with respect to the image sensor may be performed together, thereby providing a more enhanced camera shake correction function.

In addition, according to the embodiment, it is possible to reduce a total height of the camera device by embedding electrical elements required for a camera circuit by utilizing an internal space of the second actuator for moving the image sensor relative to the lens barrel.

Further, according to the embodiment, a camera assembly process may be simplified by integrating and fusing components of the camera circuit and components of the second actuator.

DESCRIPTION OF DRAWINGS

FIG. 1 is a view showing a camera module according to a comparative example.

FIG. 2 is a perspective view of a camera device according to a first embodiment.

FIG. 3 is a cross-sectional view taken along line A-A in FIG. 2.

FIG. 4 is a cross-sectional view taken along line B-B in FIG. 2

FIG. 5 is an exploded perspective view of a part of a configuration of the camera device according to the first embodiment.

FIG. 6 is an exploded perspective view of a part of a configuration of the camera device according to the first embodiment.

FIG. 7 is a bottom perspective view of a part of a configuration of the camera device according to the first embodiment.

FIG. 8 is a perspective view of a part of a configuration of the camera device according to the first embodiment.

FIG. 9A is an exploded perspective view of an image sensor substrate module of the camera device according to the first embodiment.

FIG. 9B is a cross-sectional view taken along line C-C in a state in which the image sensor substrate module of the camera device of FIG. 9A is coupled.

FIG. 9C is a cross-sectional view taken along line D-D in a state in which the image sensor substrate module of the camera device of FIG. 9A is coupled.

FIGS. 10 and 11 are exploded perspective views of a part of a configuration of the camera device according to the first embodiment as viewed from a direction different from that of FIG. 9A.

FIG. 12 is an exploded perspective view of an image sensor module of the camera device according to the first embodiment.

FIG. 13 is an exploded perspective view of the image sensor module of the camera device according to the first embodiment as viewed from a direction different from that of FIG. 12.

FIG. 14 is a view for describing an x-axis direction shift drive through a part of a configuration of the camera device according to the first embodiment.

FIG. 15 is a view for describing a y-axis direction shift drive through a part of a configuration of the camera device according to the first embodiment.

FIG. 16 is a view for describing a z-axis-centered rotational drive through a part of a configuration of the camera device according to the first embodiment.

FIG. 17A is a view illustrating magnets disposed on a substrate holder together with an x-axis and a y-axis.

FIG. 17B is a view illustrating the substrate holder, the magnets, and coils together with a z-axis direction rotational drive.

FIG. 18 is a view illustrating a magnetic flow and a Lorentz force between a magnet and a coil of the camera device according to the first embodiment.

FIG. 19 is a perspective view of a camera device according to a second embodiment.

FIG. 20 is a cross-sectional view taken along line A-A in FIG. 19.

FIG. 21 is an exploded perspective view of the camera device according to the second embodiment.

FIG. 22 is an exploded perspective view of a first actuator shown in FIG. 21.

FIG. 23A is a plan view of a base of FIG. 22.

FIG. 23B is a plan view of the first actuator of FIG. 22.

FIG. 23C is a bottom view of the first actuator of FIG. 22.

FIG. 24 is an exploded perspective view of a second actuator according to the second embodiment.

FIG. 25 is a cross-sectional view briefly illustrating a connection relationship between a first substrate and a moving part in FIG. 24.

FIG. 26 is an exploded perspective view of a fixing part of FIG. 24.

FIG. 27 is a bottom view of the fixing part of FIG. 24.

FIG. 28 is a view showing an upper surface of the first substrate in more detail.

FIG. 29 is an exploded perspective view of the moving part according to the second embodiment.

FIG. 30A is a plan view of a second substrate, and FIG. 30B is a bottom view of the second substrate.

FIG. 31A is a plan view of a third substrate, and FIG. 31B is a bottom view of the third substrate.

FIG. 32 is an exploded perspective view of a fourth substrate.

FIG. 33 is a plan view of the fourth substrate.

FIG. 34 is an enlarged view enlarging a specific region of FIG. 33.

FIG. 35 is a connection view of the third substrate and the fourth substrate.

FIG. 36 is an exploded perspective view of an image sensor module 400 according to the second embodiment.

FIG. 37 is a connection view of the third substrate and the image sensor module 400.

FIG. 38 is a perspective view of an optical device according to the present embodiment.

FIG. 39 is a configuration diagram of the optical device shown in FIG. 38.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, an embodiment of the present disclosure will be described in detail with reference to the accompanying drawings.

FIG. 1 is a view showing a camera module according to Comparative Example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and drivers 71, 72, 73, and 74.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable. The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, an image sensor substrate, a camera module, and a camera device including the same according to an embodiment will be described.

"Optical axis direction" used below is defined as an optical axis direction of a lens and/or an image sensor coupled to a lens driving device.

"Vertical direction" used below may be a direction parallel to the optical axis direction. The vertical direction may correspond to "z-axis direction". "Horizontal direction" used below may be a direction perpendicular to the vertical direction. That is, the horizontal direction may be a direction perpendicular to the optical axis. Therefore, the horizontal direction may include "x-axis direction" and "y-axis direction".

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor. Meanwhile, "auto focus" may correspond to "AF (Auto Focus)".

"Camera shake correction function" used below is defined as a function of moving the lens and/or the image sensor so as to cancel vibration (movement) generated in the image sensor by external force. Meanwhile, "Camera shake correction function" may correspond to "Optical Image Stabilization (OIS).

Hereinafter, a camera device according to a first embodiment will be described.

FIG. 2 is a perspective view of a camera device according to a first embodiment, FIG. 3 is a cross-sectional view taken along line A-A in FIG. 2, and FIG. 4 is a cross-sectional view taken along line B-B in FIG. 2, FIG. 5 is an exploded perspective view of a part of a configuration of the camera device according to the first embodiment, FIG. 6 is an exploded perspective view of a part of a configuration of the camera device according to the first embodiment, FIG. 7 is a bottom perspective view of a part of a configuration of the camera device according to the first embodiment, FIG. 8 is a perspective view of a part of a configuration of the camera device according to the first embodiment, FIG. 9A is an exploded perspective view of an image sensor substrate module of the camera device according to the first embodiment, FIG. 9B is a cross-sectional view taken along line C-C in a state in which the image sensor substrate module of the camera device of FIG. 9A is coupled, FIG. 9C is a cross-sectional view taken along line D-D in a state in which the image sensor substrate module of the camera device of FIG. 9A is coupled. FIGS. 10 and 11 are exploded perspective views of a part of a configuration of the camera device according to the first embodiment as viewed from a direction different from that of FIG. 9A, FIG. 12 is an exploded perspective view of an image sensor module of the camera device according to the first embodiment, FIG. 13 is an exploded perspective view of the image sensor module of the camera device according to the first embodiment as viewed from a different direction from that of FIG. 12, FIG. 14 is a view describing an x-axis direction shift drive through a part of a configuration of the camera device according to the first embodiment, and FIG. 15 is a view describing a y-axis direction shift drive through a part of a configuration of the camera device according to the first embodiment, FIG. 16 is a view describing a z-axis-centered rotational drive through a part of a configuration of the camera device according to the first embodiment, FIG. 17A is a view illustrating magnets disposed on a substrate holder together with an x-axis and a y-axis. FIG. 17B is a view illustrating the substrate holder, the magnets, and coils together with a z-axis direction rotational drive, and FIG. 18 is a view illustrating a magnetic flow and a Lorentz force between a magnet and a coil of the camera device according to the first embodiment.

A camera device 100A may include a camera module. The camera device 100A may include a lens driving device. The lens driving device may be a voice coil motor (VCM). The lens driving device may be a lens driving motor. The lens driving device may be a lens driving actuator. The lens driving device may include an AF module. The lens driving device may include an OIS module.

The camera device 100A may include an actuator. The actuator may drive an image sensor 444. The actuator may tilt the image sensor 444. The actuator may move the image sensor 444. The actuator may rotate the image sensor 444. The actuator may move the image sensor 444 in a first direction perpendicular to an optical axis, move in a second direction perpendicular to the optical axis and the first direction, and rotate based on the optical axis. In this case, the first direction may be the x-axis direction, the second direction may be the y-axis direction, and the optical axis may be the z-axis direction. The actuator may include a coil 310 and a magnet 320. The actuator may move the image sensor 444 by an electromagnetic force.

That, the actuator of the camera device 100A may move the image sensor 444 with respect to a lens barrel. The actuator will be described in more detail below.

The camera device 100A may include a holder 110. The holder 110 may be disposed on a lower surface of a flexible circuit board 150. The holder 110 may include a protrusion for coupling to a groove of the flexible circuit board 150. The holder 110 may be disposed on an upper surface of a driving substrate 120. The holder 110 may be disposed between the flexible circuit board 150 and the driving substrate 120. A lens module 210 may be disposed on the holder 110. An optical module may be disposed on the holder 110. The holder 110 may be coupled to the housing 600. In this case, the driving substrate 120 may be one configuration of an image sensor actuator electrically connected to the image sensor 444. One end of the driving substrate 120 may be connected to an image sensor substrate 430, thereby receiving an image signal transmitted from the image sensor 444 coupled to the image sensor substrate 430. In addition, the other end of the driving substrate 120 may be connected to the flexible circuit board 150, thereby transmitting the image signal provided from the image sensor 444 to the outside. That is, the driving substrate 120 may transfer the image signal obtained from the image sensor 444 to a main substrate.

To this end, the flexible circuit board 150 may be connected between the camera module and a main substrate of an external device. Specifically, the flexible circuit board 150 may connect between the image sensor substrate of the camera module and a main substrate of an optical device (for example, a portable terminal).

To this end, a part of the flexible circuit board 150 may be disposed inside the camera device to be connected to the driving substrate 120 of the image sensor actuator, and the other part may be disposed outside the camera device to be connected to the main substrate of the optical device.

The holder 110 may include a step 111. The step 111 may be formed around the inserting portion 112 of the holder 110. The lens module 210 may be disposed at the step 111. The step 111 may support a lower surface of a part of the lens module 210. Through this, it is possible to prevent the lens module 210 from being detached downward in a state in which the lens module 210 is placed on the step 111.

The holder 110 may include the inserting portion 112. The inserting portion 112 may be a hollow hole. The inserting portion 112 may be an opening. The lens module 210 may be disposed in the inserting portion 112. A part of the lens module 210 may extend below the step 111 through the inserting portion 112.

The holder 110 may include a first hole 113. The first hole 113 may be formed in order to expose a portion of the driving substrate 120 to be coupled to a wire 510. The first hole 113 may be provided in plural. For example, the first hole 113 may be provided in two.

The holder 110 may include a second hole 114. The second hole 114 may be formed in order to expose a sensor 520 coupled to the driving substrate 120. The second hole 114 may be provided in plural. For example, the second hole 114 may be provided in four.

The holder 110 may include a first groove 115. The first groove 115 may be formed in order to expose a portion of the driving substrate 120 to be coupled to the wire 510. The first groove 115 may be formed on a side surface of the holder 110. The first grooves 115 may be formed on both side surfaces of the holder 110, respectively. The first groove 115 may be provided in plural. For example, the first groove 115 may include two grooves disposed on both side surfaces of the holder 110 facing each other.

The holder 110 may include a second groove 116. The second groove 116 may be formed in a shape corresponding to a protrusion of a housing 600 to be coupled to the protrusion of the housing 600. However, the second groove 116 may not be provided in the shape corresponding to the protrusion of the housing 600. The second groove 116 may be formed at the side surface of the holder 110. The second grooves 116 may be formed on both side surfaces of the holder 110, respectively. The second grooves 116 may be provided in plural. For example, three second grooves 116 may be provided in three. The second groove 116 may include two grooves disposed on one side surface of the holder 110, and may be formed as one groove of a form in which two grooves connected to one on the other side surface.

The camera device 100A may include the driving substrate 120. The driving substrate 120 may be disposed in the holder 110. The driving substrate 120 may be disposed on a lower surface of the holder 110. The upper surface of the driving substrate 120 may be in contact with the lower surface of the holder 110.

The driving substrate 120 may be disposed under the flexible circuit board 150. The driving substrate 120 may be coupled to the wire 510. The driving substrate 120 may be a rigid flexible PCB (RFPCB). The driving substrate 120 may include first to fourth corners. In this case, the driving substrate 120 may be coupled to the image sensor substrate 430 on which the image sensor 444 is disposed, and may be a configuration of the image sensor actuator for moving the image sensor substrate 430.

The driving substrate 120 may include a fourth open region 121. The fourth open region 121 may be formed at the center of the driving substrate 120. The fourth open region 121 may be a hollow hole passing through the upper and lower surfaces of the driving substrate 120. The fourth open region 121 may be an opening. The fourth open region 121 of the driving substrate 120 may be aligned on an optical axis OA with the image sensor 444 disposed below and the lens module 210 disposed above.

Preferably, the fourth open region 121 may be aligned on the optical axis OA with the image sensor 444 disposed below, a first open region 433 of the image sensor substrate 430, and a second open region 424 of a reinforcing member 420, and a third open region 411 of the substrate holder 410. The lens module 210 may be disposed on the fourth open region 211. The fourth open region 121 of the driving substrate 120 may be formed to have a larger width than the insertion portion 112 of the holder 110.

The driving substrate 120 may include a coupling portion. The driving substrate 120 may be coupled to the wire 510 at the coupling portion. That is, the driving substrate 120 may include a lead pattern part coupled to the wire 510. For example, the driving substrate 120 may include a second lead pattern part 122 electrically connected to one end of the wire 510. The second lead pattern part 122 and the wire 510 of the driving substrate 120 may be coupled by soldering. The second lead pattern part 122 may be a portion in which a solder register is opened to be electrically connected to the wire 510. A third insertion holes 123 into which wires are inserted may be formed in the second lead pattern part 122 and the driving substrate 120. Accordingly, one end of the wire 510 may be inserted into the second lead pattern part 122 and the third insertion hole 123 of the driving substrate 120. Preferably, one end of the wire 510 may pass through the surface of the second lead pattern part 122 to protrude onto a surface of the second lead pattern part 122, and may be electrically connected to the second lead pattern part 122.

That is, a part of the third insertion hole 123 may be formed in the driving substrate 120, and the remaining of the third insertion hole 123 may be formed on the second lead pattern part 122. A part of the third insertion hole formed on the second lead pattern part 122 may be filled with solder by soldering the wire 510 protruding onto the surface of the second lead pattern part 122.

The driving substrate 120 may include a connector 124. The connector 124 may be electrically connected to the flexible circuit board 150. A connector corresponding to the connector 124 of the driving substrate 120 may be disposed on the flexible circuit board 150. The connector 124 may include a port for electrically connecting to an external device.

The driving substrate 120 may include a terminal 125. The terminal 125 may be formed on a lower surface of the driving substrate 120. The terminal 125 may be electrically connected to the coil 310. The terminal 125 may be coupled to a pair of leader wires of the coil 310 by soldering or Ag epoxy. The terminal 125 may include a plurality of terminals. The terminal 125 may include a total of eight terminals, two for each of four coils. The driving substrate 120 generates a magnetic field on the image sensor substrate 430 using the coil 310, and allows a position of the image sensor substrate 430 to be moved by the generated magnetic field.

That is, the driving substrate 120 may be electrically connected to the image sensor substrate 430 disposed below via a wire 510, and may move the image sensor substrate 430 using the wire 510. In other words, the driving substrate 120 may be fixedly coupled to the holder 110, and the image sensor substrate 430 may move relative to the driving substrate 120. Movement of the image sensor substrate 430 may be achieved by a magnetic force generated from the coil 310 connected to the terminal 125. This will be described below.

The camera device 100A may include the lens module 210. The lens module 210 may be disposed in the holder 110. The lens may be disposed at a position corresponding to the image sensor 444. The lens module 210 may include at least one lens. The lens module 210 may include a plurality of lenses. The lens module 210 may include five lenses. The lens module 210 may include first to fifth lenses 211, 212, 213, and 214, and 215. The lens module 210 may include a barrel 216. A plurality of lenses may be disposed in the barrel 216. The lens module 210 may include a hole 217. The optical module may be disposed in the hole 217 of the lens module 210. The hole 217 of the lens module 210 may be formed so as to pass through the lens module 210 between the plurality of lenses in a horizontal direction. Through this, the optical axis of the plurality of lenses and the optical axis of the optical module may be aligned. The hole 217 of the lens module 210 may be formed between the second lens 212 and the third lens 213.

The camera device 100A may include the optical module. The optical module may perform OIS function. The optical module may perform AF function. The optical module may be disposed to be aligned with the plurality of lenses and the image sensor 444. The optical module may be disposed between the plurality of lenses. The optical module may be disposed between the second lens 212 and the third lens 213. The optical module may include a MEMS actuator 220.

As shown in FIG. 8, the camera device 100A may include the MEMS actuator 220. The MEMS actuator 220 may move a moving lens using a silicon wafer to perform an auto focus function and/or a camera shake correction function.

The MEMS actuator 220 may be connected to a lens substrate 221. The lens substrate 221 may include a terminal 222. The terminal 222 may include a plurality of terminals. Terminal 222 may include six terminals. The terminal 222 of the lens substrate 221 may be connected to a terminal 150a of the flexible circuit board 150.

The camera device 100A may include the coil 310. That is, the actuator for moving the image sensor 444 may include the coil 310.

The coil 310 may be disposed on the driving substrate 120.

The coil 310 may be electrically connected to the driving substrate 120. The coil 310 may be disposed facing the magnet 320 disposed below. When a current is applied to the coil 310, an electric field may be formed around the coil 310. When a current is applied to the coil 310, any one of the coil 310 and the magnet 320 may move relative to the other by electromagnetic interaction between the coil 310 and the magnet 320.

The coil 310 may include four coils. A current may be independently applied to at least three of the four coils. In the first embodiment, the coil 310 may be controlled by three channels. Alternatively, in the second embodiment, the coil 310 may be controlled by four channels. The four coils 310 may be electrically isolated from each other. Any one of a forward current and a reverse current may be selectively applied to each of the four coils 310. In this embodiment, only three of the four coils may be electrically isolated and one coil may be electrically connected to the other coil. Alternatively, all four coils may be electrically isolated. When only three of the four coils are electrically isolated, a total of six lead wires of three pairs may come out from the coil 310, and when all four coils are electrically isolated, a total of eight lead wires of four pairs may come out from the coil 310.

When the four coils are controlled by three channels as in the first embodiment of the present embodiment, a pair of the coil 310 and the magnet 320 should be driven in a z-axis-centered rotational drive, but when the four coils are controlled by four channels as in the second embodiment, two pair of the coil 310 and the magnet 320 may be driven in the z-axis-centered rotational drive.

The coil 310 may include first to fourth coils 311, 312, 313, and 314. The first coil 311 may be disposed to face a first magnet 321. The second coil 312 may be disposed to face a second magnet 322. The third coil 313 may be disposed to face a third magnet 323. The fourth coil 314 may be disposed to face a fourth magnet 324. The first coil 311 may be disposed in a first corner of the driving substrate 120. The second coil 312 may be disposed in a second corner of the driving substrate 120. The third coil 313 may be disposed in a third corner of the driving substrate 120. The fourth coil 314 may be disposed in a fourth corner of the driving substrate 120. The first coil 311 and the third coil 313 may be disposed on a first diagonal direction of the driving substrate 120, and the second coil 312 and the fourth coil 314 may be disposed on a second diagonal direction of the driving substrate 120.

In the present embodiment, the first coil 311 and the third coil 313 may be disposed to be long in a first direction, and the second coil 312 and the fourth coil 314 may be disposed to be long in a second direction. In this case, the first direction and the second direction may be perpendicular. A long side of the first coil 311 and a long side of the third coil 313 may be disposed in parallel to each other. A long side of the second coil 312 and a long side of the fourth coil 314 may be disposed in parallel to each other. The long side of the first coil 311 and the long side of the second coil 312 may not be parallel to each other. In this case, the long side of the first coil 311 and the long side of the second coil 312 may be disposed such that virtual extension lines are orthogonal to each other. An arrangement direction of the first coil 311 and an arrangement direction of the second coil 312 may be orthogonal to each other.

In the present embodiment, a current may be independently applied to at least three coils among the first to fourth coils 311, 312, 313, and 314. The first to fourth coils 311, 312, 313, and 314 may be electrically isolated from each other.

The camera device 100A may include the magnet 320. The magnet 320 may be disposed in the substrate holder 410. The magnet 320 may be disposed at a corner of the substrate holder 410. The magnets 320 may be disposed at four corners of the substrate holder 410, respectively. The magnet 320 may face the coil 310. The magnet 320 may electromagnetically interact with the coil 310. The magnet 320 may move by electromagnetic interaction with the coil 310. That is, when a current is applied to the coil 310, the magnet 320 may move. The magnet 320 may be a flat magnet having a flat plate shape. In the present embodiment, the coil 310 may be fixed and the magnet 320 may move. However, as a modified example, arrangement positions of the coil 310 and the magnet 320 may be changed from each other. In the camera device according to the second embodiment described below, a case in which the positions of the coil 310 and the magnet 320 are changed from each other in the first embodiment will be described.

The magnet 320 may include a plurality of magnets. The magnet 320 may include four magnets. The magnet 320 may include first to fourth magnets 321, 322, 323, and 324. The first magnet 321 may face the first coil 311. The first magnet 321 may be disposed in a first corner 410e of the substrate holder 410. The second magnet 322 may face the second coil 312. The second magnet 322 may be disposed in a second corner 410f of the substrate holder 410. The third magnet 323 may face the third coil 313. The third magnet 323 may be disposed in a third corner 410g of the substrate holder 410. The fourth magnet 324 may face the fourth coil 314. The fourth magnet 324 may be disposed in a fourth corner 410h of the substrate holder 410. Each of the plurality of magnets may be disposed perpendicular to adjacent magnets and may be disposed in parallel with magnets disposed in a diagonal direction.

A polarity of a surface of the first magnet 321 facing the coil 310 may be different between a portion close to a first side surface and a portion close to a second side surface. A polarity of a surface of the second magnet 322 facing the coil 310 may be different between a portion close to a third side surface and a portion close to a fourth side surface. A polarity of a surface of the third magnet 323 facing the coil 310 may be different between a portion close to the first side surface and a portion close to the second side surface. A polarity of a surface of the fourth magnet 324 facing the coil 310 may be different between a portion close to the third side surface and a portion close to the fourth side surface. That is, the first magnet 321 and the third magnet 323 may be disposed in the same direction, and the second magnet 322 and the fourth magnet 324 may be disposed in the same direction. The first magnet 321 may be disposed perpendicular to the second magnet 322. Polarities of the first to fourth magnets 321, 322, 323, and 324 may be the same for inner portions. The polarities of the first to fourth magnets 321, 322, 323, and 324 may be the same for outer portions. Regarding the polarity of each of the first to fourth magnets 321, 322, 323, and 324, the inner portions may be formed as an N pole. Regarding the polarity of each of the first to fourth magnets 321, 322, 323, and 324, the outer portions may be formed as the S pole. However, as a modification, regarding the polarity of each of the first to fourth magnets 321, 322, 323, and 324, the inner portions may be formed as a S pole and the outer portions may be formed as the N pole.

As shown in FIG. 14, when currents in the same direction are applied to the second coil 312 and the fourth coil 314 in the present embodiment, the image sensor 444 coupled to the substrate holder 410 may be moved (shifted) in the x-axis direction by electromagnetic interaction between the second magnet 322 and the fourth magnet 324, respectively. That is, the second coil 312, the second magnet 322, and the fourth coil 314 and the fourth magnet 324 may be used for the x-axis direction shift drive of the image sensor 444. In this case, the second coil 312 and the second magnet 322 may be a first x-axis shift driver X2, and the fourth coil 314 and the fourth magnet 324 may be a second x-axis shift driver X1.

As shown in FIG. 15, when currents in the same direction are applied to the first coil 311 and the third coil 313 in the present embodiment, the image sensor 444 coupled to the substrate holder 410 may be moved (shifted) in the y-axis direction by electromagnetic interaction between the first magnet 321 and the third magnet 323, respectively. That is, the first coil 311, the first magnet 321, the third coil 313, and the third magnet 323 may be used for the y-axis direction shift drive of the image sensor 444. In this case, the first coil 311 and the first magnet 321 may be a first y-axis shift driver Y1, and the third coil 313 and the third magnet 323 may be a second y-axis shift driver Y2.

As shown in FIG. 16, currents in opposite directions are applied to the first coil 311 and the third coil 313 and currents in opposite directions are applied to the second coil 312 and the fourth coil 314 in the present embodiment, and at this time, when a direction in which the magnet 320 is rotated by the current applied to the first coil 311 and the current applied to the second coil 312 is the same, the image sensor 444 coupled to the substrate holder 410 may be rotated (rolled) around the z-axis. An embodiment shown in FIG. 17 illustrates a case in which the coil 310 is controlled by four channels, and when the coil 310 is controlled by three channels, the image sensor 444 may be rolled by the first coil 311 and the third coil 313 or the second coil 312 and the fourth coil 314. This is because when there is a coil bundled into one channel among the first coil 311 and the third coil 313, and the second coil 312 and the fourth coil 314, the current may not be applied in the opposite direction.

As shown in FIG. 17B, in the present embodiment, a forward current is applied to the first coil 311, whereby the first coil 311 pushes out the first magnet 321 in the first direction (see FIG. 17A), a forward current is applied to the second coil 312, whereby the second coil 312 pushes out the second magnet 322 in the second direction (see FIG. 17B), a reverse current is applied to the third coil 313, whereby the third coil 313 pushes out the third magnet 323 in a third direction (see FIG. 17C), and a reverse current is applied to the fourth coil 314, whereby the fourth coil 314 pushes out the fourth magnet 324 in a fourth direction (see in FIG. 17D), so that the image sensor 444 coupled to the substrate holder 410 may be rotated around the z-axis (see in FIG. 17E). In this case, the first to fourth directions may correspond to a clockwise direction around the center of the substrate holder 410.

In the present embodiment, a magnetic flow of the magnet 320 is shown in FIG. 18. Referring to FIG. 18, it may be confirmed that lines of magnetic force passing perpendicular to the coil 310 exists, and when a current is applied to the coil 310 in this state, the coil 310 may move with respect to the magnet 320 by the Lorentz force.

The camera device 100A may include the substrate holder 410 which is one configuration of a substrate module. The substrate holder 410 may be spaced apart from the holder 110. The substrate holder 410 may be a mover which is a portion that moves together with the magnet 320 when a current is applied to the coil 310. In addition, the substrate holder 410 may be a sensor PCB holder. The substrate holder 410 may be shifted in the x-axis direction. The substrate holder 410 may be shifted in the y-axis direction. The substrate holder 410 may be rotated around the z-axis (optical axis).

The substrate holder 410 may include the third open region 411. The third open region 411 may be a hollow hole. The third open region 411 may be an opening. Preferably, the third open region 411 may be aligned on the fourth open region 121 of the driving substrate 120, the image sensor 444, the first open region 433 of the image sensor substrate 430, the second open region 424 of the reinforcing member 420, and the optical axis (OA).

The substrate holder 410 may include a magnet accommodating groove 412. The groove 412 may be formed on an upper surface of the substrate holder 410. The magnet accommodating groove 412 may accommodate at least a part of the magnet 320.

The magnet 320 may be disposed in the magnet accommodating groove 412 of the substrate holder 410. The magnet accommodating groove 412 may be formed in a shape corresponding to the magnet 320. However, a depth of the magnet accommodating groove 412 may be smaller than a thickness of the magnet 320 in a corresponding direction. In this case, a part of the magnet 320 disposed in the magnet accommodating groove 412 may protrude from the substrate holder 410. The magnet accommodating groove 412 may include a plurality of grooves. The magnet accommodating groove 412 may be formed in a number corresponding to a number of the magnets 320. The magnet accommodating groove 412 may include four grooves. However, the magnet accommodating groove 412 of the substrate holder 410 may be replaced with a coil accommodating groove, and thus a coil may be disposed instead of the magnet. In this case, the magnet may be disposed on the driving substrate facing the coil placed in the substrate holder 410.

The substrate holder 410 may include a second insertion hole 413 through which a wire passes. The second insertion hole 413 may be formed passing through the substrate holder 410 in a direction parallel to the optical axis. The wire 510 may be inserted into the second insertion hole 413. The wire 510 may pass through the second insertion hole 413. The second insertion hole 413 may include a plurality of holes. The second insertion hole 413 may be formed in a number corresponding to a number of wires 510. The second insertion hole 413 may include 24 holes. The second insertion hole 413 of the substrate holder 410 may be aligned with the third insertion hole 123 of the driving substrate 120 in a vertical direction. That is, the wire 510 may pass through the third insertion hole 123 of the driving substrate 120 and the second insertion hole 413 of the substrate holder 410 in common.

The substrate holder 410 may include a first protrusion 414. The first protrusion 414 may be formed on a lower surface of the substrate holder 410. The first protrusion 414 may be inserted into a first hole 421 of the reinforcing member 420 and a hole 431-1 of the image sensor substrate 430. The first protrusion 414 may be formed in a shape corresponding to the first hole 421 of the reinforcing member 420 and the hole 431-1 of the image sensor substrate 430. The first protrusion 414 may include a plurality of protrusions. The first protrusion 414 may include four protrusions. The four protrusions may be formed at four corners of the substrate holder 410, respectively.

The substrate holder 410 may include a second protrusion 415. The second protrusion 415 may be formed on the lower surface of the substrate holder 410. The second protrusion 415 may be spaced apart from the first protrusion 414. The second protrusion 415 may extend from a side surface of the substrate holder 410. A lower surface of the second protrusion 415 may be disposed lower than a lower surface of the reinforcing plate 445 of the image sensor module 440. The second protrusion 415 may include a plurality of protrusions. The second protrusion 415 may include four protrusions. The four protrusions may be formed at four corners of the substrate holder 410, respectively.

The substrate holder 410 may include a guide protrusion 416. The guide protrusion 416 may be formed on the lower surface of the substrate holder 410. The guide protrusion 416 may guide an assembly position of the image sensor module 440. The guide protrusion 416 may contact a cover 441 of the image sensor module 440. The guide protrusion 416 may contact four side surfaces of the cover 441 of the image sensor module 440.

The substrate holder 410 may include a plurality of side surfaces. The substrate holder 410 may include four side surfaces. The substrate holder 410 may include first to fourth side surfaces. The substrate holder 410 may include the first side surface and the second side surface disposed opposite to each other, and the third side surface and the fourth side surface disposed opposite to each other between the first side surface and the second side surface.

The substrate holder 410 may include a corner formed between the plurality of side surfaces. The substrate holder 410 may include a plurality of corners. The substrate holder 410 may include four corners. The substrate holder 410 may include first to fourth corners. The first corner of the substrate holder 410 may be disposed between the first side surface and the third side surface. The second corner of the substrate holder 410 may be disposed between the third side surface and the second side surface. The third corner of the substrate holder 410 may be disposed between the second side surface and the fourth side surface. The fourth corner of the substrate holder 410 may be disposed between the fourth side surface and the first side surface. That is, the substrate holder 410 may include the four side surfaces and the four corners disposed between the four side surfaces. The second insertion hole 413 through which the wire 510 passes may be formed in the four side surfaces, and the groove 412 into which the magnet is inserted may be formed in the four corners.

The camera device 100A may include the reinforcing member 420. The reinforcing member 420 may be formed of stainless steel (SUS). The reinforcing member 420 may reinforce the image sensor substrate 430. The reinforcing member 420 may be coupled to the image sensor substrate 430. The reinforcing member 420 may be adhered to the image sensor substrate 430 by an adhesive. The reinforcing member 420 may be disposed on the lower surface of the substrate holder 410.

The reinforcing member 420 may include the first coupling hole 421. The first coupling hole 421 may be coupled to the first protrusion 414 of the substrate holder 410. The reinforcing member 420 may include a second coupling hole 422. An adhesive may be applied to the second coupling hole 422. The second coupling hole 422 may be formed in a protruding portion of the reinforcing member 420. The second coupling hole 422 may include a plurality of holes. The second coupling holes 422 may be formed in a total of 16, two for each of eight protruding portions, two for each of four corners of the reinforcing member 420.

The reinforcing member 420 may include a protruding part 423. The protruding part 423 may be formed protruding inward from a corner of the reinforcing member 420. A space in which the first coupling hole 421 is to be formed may be secured in the reinforcing member 420 by the protruding part 423. The first coupling hole 421 may be formed in the protruding part 423.

The reinforcing member 420 may include the second open region 424. The second open region 424 may be aligned on the optical axis OA with the fourth open region 121 of the driving substrate 120, the image sensor 444, the first open region 433 of the image sensor substrate 430, and the third open region 411 of the substrate holder 410.

The camera device 100A may include the image sensor substrate 430. The image sensor substrate 430 may be disposed on the lower surface of the substrate holder 410. The image sensor substrate 430 may be coupled to the reinforcing member 420. The image sensor substrate 430 may be coupled to the image sensor module 440. The image sensor substrate 430 may be an image sensor mounting substrate on which an image sensor is mounted. The image sensor substrate 430 may be provided in a state of being suspended below the driving substrate 120 by relying on a wire, and may be moved with respect to the driving substrate 120 by the coil and the magnet.

That is, the substrate holder 410, the image sensor substrate 430, and the image sensor module 440 are disposed below the driving substrate 120.

Here, a structure in which the driving substrate 120, the substrate holder 410, the image sensor substrate 430, and the image sensor module 440 are coupled may be referred to as an image sensor actuator.

In this case, the driving substrate 120 and the image sensor substrate 430 are electrically connected to each other by the wire 510. Here, a length of the wire 510 is greater than a sum of a thickness of the driving substrate 120, a thickness of the substrate holder 410, a thickness of the reinforcing member 420, and a thickness of the image sensor substrate 430. Accordingly, the substrate holder 410 disposed below the driving substrate 120 is placed at a position spaced apart from the driving substrate 120 by a predetermined distance. In addition, the substrate holder 410, the image sensor substrate 430, and the image sensor module 440 may be fixed by the wire 510 at a position spaced apart from the driving substrate 120 by a predetermined distance. That is, the substrate holder 410, the image sensor substrate 430, and the image sensor module 440 are supported by the wire 510, and may be disposed in a structure flying below the driving substrate 120.

The image sensor substrate 430 may include an insulating layer 431. The insulating layer 431 may be coupled to the lower surface of the substrate holder 410. The insulating layer 431 may be coupled to the reinforcing member 420. The insulating layer 431 may be coupled to the image sensor module 440. The insulating layer 431 may include a coupling hole 431-1. The coupling hole 431-1 may be coupled to the first protrusion 414 of the substrate holder 410. The insulating layer 431 may include a protruding part 431-2. The protruding part 431-2 may be formed protruding inward from a corner of the insulating layer 431. A space in which the coupling hole 431-1 is formed may be secured by the protruding part 431-2. The coupling hole 431-1 may be formed in the protruding part 431-2.

In addition, the insulating layer 431 may include a first open region 433.

Preferably, the first open region 433 may be aligned on the optical axis OA with a fourth open region 121 of the driving substrate 120, the image sensor 444 disposed below, the second open region 424 of the reinforcing member 420, and the third open region 411 of the substrate holder 410.

The image sensor substrate 430 may include the insulating layer 431 and a first lead pattern part 432 disposed on the insulating layer 431.

The first lead pattern part 432 may be electrically connected to a terminal of the image sensor 444. The first lead pattern part 432 may be configured in plural. For example, the first lead pattern part 432 may include a total of 24 terminal portions.

In this case, the first lead pattern part 432 may include a first-first lead pattern part 432a disposed in a first region of the insulating layer 431 and a first-two lead pattern part 432b disposed in a second region facing the first region of the insulating layer 43, a first-third lead pattern part 432c disposed in a third region between the first and second region of the insulating layer 431, and a first-fourth lead pattern part 432d may be disposed in a fourth region facing the third region of the insulating layer 431.

In addition, each of the first-first to first-fourth lead pattern parts 432a, 432b, 432c, and 432d may include a first pattern part 432-1 disposed on the insulating layer 431, a second pattern part 432-2 coupled to the wire 510, and a connection portion 432-3 connecting the first pattern part 432-1 and the second pattern part 432-2. A hole through which the wire 510 passes may be formed in the second pattern part 432-2. The second pattern part 432-2 may be coupled to the wire 510 by soldering. The connection portion 432-3 may include a bent portion. The connection portion 432-3 may be bent a plurality of times in one direction. The connection portion 432-3 may have elasticity. The first lead pattern part 432 may have elasticity.

The first pattern part 432-1 may be electrically connected to the image sensor module. That is, the first pattern part 432 may be a mounting pad for mounting the image sensor 444 or the image sensor module.

The second pattern part 432-2 may be a bonding pad electrically connected to the wire 510. That is, the second pattern part 432-2 may be a soldering pad soldered to the wire 510. To this end, the second pattern part 432-2 may include a first insertion hole through which the wire 510 passes. The first insertion hole may be aligned in a vertical direction with a second insertion hole formed in the substrate holder and a third insertion hole formed in the driving substrate.

The connection portion 432-3 may connect the first pattern part 432-1 and the second pattern part 432-2 with each other. To this end, the connection portion 432-3 may include a plurality of bent portions. In this case, the connection portions 432-3 of each of the first lead pattern parts 432a, 432b, 432c, and 432d may be bent in the same direction. For example, as shown in FIG. 12B, the connection portions 432-3 of each of the first lead pattern parts 432a, 432b, 432c, and 432d may include bent portions that rotate clockwise. That is, the connection portion 432-3 may be bent in a direction corresponding to a rotation direction in the z-axis direction of the image sensor module. Accordingly, the connection portion 432-3 may minimize damage to the first lead pattern part 432 when rotating in the z-axis direction, and accordingly, it is possible to prevent cracks generated in the first lead pattern part 432 or detachment from the insulating layer. Meanwhile, in an embodiment, an adhesive member (not shown) may be disposed between the insulating layer 431 and the first lead pattern part 432. The adhesive member may be interposed between the insulating layer 431 and the first lead pattern part 432 to prevent the first lead pattern part 432 from being detached on the insulating layer 431. The adhesive member may include a curing adhesive or the like.

Meanwhile, the first lead pattern part 432 is a wiring for transmitting an electrical signal, and may be formed of a metal material having high electrical conductivity. To this end, the conductive pattern part 640 may be formed of at least one metal material selected from among gold (Au), silver (Ag), platinum (Pt), titanium (Ti), tin (Sn), copper (Cu), and zinc (Zn). In addition, the first lead pattern part 432 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the first lead pattern part 432 may serve as a wiring for transmitting an electrical signal, and may be formed of a metal material having an elastic force capable of moving the image sensor substrate 430 in the X-axis, Y-axis, and Z-axis directions with respect to the driving substrate 120. To this end, the first lead pattern part 432 may be formed of a metal material having a tensile strength of 1000 MPa or more. For example, the first lead pattern part 432 may be a binary alloy or ternary alloy containing copper. For example, the first lead pattern part 432 may be a binary alloy of copper (Cu)-nickel (Ni). For example, the first lead pattern part 432 may be a binary alloy of copper (Cu)-tin (Sn). For example, the first lead pattern part 432 may be a binary alloy of copper (Cu)-beryllium (Be). For example, the first lead pattern part 432 may be a binary alloy of copper (Cu)-cobalt (Co). For example, the first lead pattern part 432 may be a ternary alloy of copper (Cu)-nickel (Ni)-tin (Sn). For example, the first lead pattern part 432 may be a ternary alloy of copper (Cu)-beryllium (Be)-cobalt (Co). In addition, in addition to the metal material, the first lead pattern part 432 may be formed of an alloy of iron (Fe), nickel (Ni), zinc, and the like having an elastic force capable of acting as a spring and having good electrical characteristics. Further, the first lead pattern part 432 may be surface-treated with a plating layer containing a metal material such as gold (Au), silver (Ag), palladium (Pd), and the like, thereby improving electrical conductivity.

Meanwhile, the first lead pattern part 432 may be formed by a general process of manufacturing a printed circuit board, such as an additive process, a subtractive process, a modified semi additive process (MSAP), a semi additive process (SAP), etc.

The image sensor substrate 430 will be described in more detail with reference to FIGS. 11B, 11C and 11D.

As shown in FIG. 11B, first lead pattern parts 432a, 432b, 432c, and 432d are disposed in each region of the insulating layer 431.

In this case, disposition positions of the first lead pattern parts 432a, 432b, 432c, and 432d are not aligned on the same vertical extension line or horizontal extension line, and may be shifted by a predetermined distance.

For example, the first-first lead pattern part 432a and the first-second lead pattern part 432b may be disposed on the first and second regions of the insulating layer 431 facing each other, respectively. Disposition positions of the first-first lead pattern part 432a and the first-second lead pattern part 432b are not aligned on the same horizontal extension line, and may be shifted by a first distance d1. For example, a center X1 of the first-first lead pattern part 432a disposed at the uppermost side of the first-first lead pattern part 432a may be spaced apart from a center X2 of the first-second lead pattern part 432b disposed at the uppermost side of the first-second lead pattern part 432b by the first distance d1.

In addition, the first-third lead pattern part 432c and the first-fourth lead pattern part 432d may be disposed on the third and fourth regions of the insulating layer 431 facing each other. Disposition positions of the first-third lead pattern part 432c and the first-fourth lead pattern part 432d are not aligned on the same vertical extension line, and may be shifted by a second distance d2. For example, a center Y1 of the first-third lead pattern part 432c disposed at the leftmost side of the first-third lead pattern part 432c may be spaced apart from a center Y2 of the first-fourth lead pattern part 432d disposed at the leftmost side of the first-fourth lead pattern part by the second distance d2.

That is, in the embodiment, the first lead pattern part 432 may be disposed in a plurality of regions of the insulating layer 431, respectively, and in this case, may be disposed at a position biased in one direction from the center of each region in order to facilitate rotation on the z-axis. For example, the first-first lead pattern part 432a may be disposed to be biased in a first direction from the center of the first region of the insulating layer 431. That is, the first-first lead pattern part 432a may be disposed to be biased downward in the first region of the insulating layer 431. For example, the first-second lead pattern part 432b may be disposed to be biased in a second direction opposite to the first direction from the center of the second region. That is, the first-second lead pattern part 432b may be disposed to be shifted upward from the center of the second region. The first-third lead pattern part 432c may be disposed to be biased in a third direction from the center of the third region of the insulating layer 431. For example, the first-third lead pattern part 432c may be disposed to be shifted to the left from the center of the third region. The first-fourth lead pattern part 432d may be disposed to be biased in a fourth direction opposite to the third direction from the center of the fourth region of the insulating layer 431. For example, the first-fourth lead pattern part 432d may be disposed to be shifted to the right from the center of the fourth region.

Meanwhile, the first pattern part 432-1 may include a mounting part 432-11 on which the image sensor 444 or the image sensor module 440 is mounted, and an extension part 432-12 extending from the mounting part 432-11. In this case, the mounting part 432-11 may have a square pad shape in a plane so that the image sensor 444 or the image sensor module 440 is stably mounted. The extension part 432-12 may extend from the mounting part 432-11 and be connected to the connection portion 432-3.

In this case, the extension part 432-12 may be bent from the mounting part 432-11. Accordingly, a center line of the extension part 432-12 may be spaced apart from a center line of the mounting part 432-11 by a third distance d3.

In addition, the extension part 432-12 may include a buffer pattern part for serving as a buffer in a region A connected to the connection portion 432-3. The buffer pattern part may have a shape of which a width gradually decreases toward the direction in which the connection portion 432-3 is disposed. That is, the extension part 432-12 may include a bent part that is bent and extends from the mounting part 432-11, and a buffer part that is a region extending from the bent part and gradually decreasing in width as a distance from the bent part increases. The buffer part may solve a problem such as a pattern breakage caused by a difference in pattern width between the first pattern part 432-1 and the connection portion 432-3, and may stably connect the connection portion 432-3 and the mounting part 432-11.

In addition, the buffer part may not be overlapped with the insulating layer in a vertical direction. Accordingly, when the substrate is not only moved in the X-axis, Y-axis, and Z-axis but also tilted, a point in which the connection portion and the pattern part are connected does not exist on the insulating layer, but is formed outside the insulating layer, and thus a pattern breakage due to a difference in width between the connection portion and the pattern part may be effectively reduced.

Meanwhile, a center of the second pattern part 432-2 and a center of the first pattern part 432-1 may be disposed on the same vertical extension line or horizontal extension line. That is, the center of the second pattern part 432-2 and the center of the first pattern part 432-1 may be aligned on the same vertical line or the horizontal line. To this end, the first pattern part 432-1 may include the extension part 432-12 that is bent from the mounting part 432-11. Accordingly, the wires 510 connected to the second pattern part 432-2 and the terminal of the image sensor 444 disposed on the first pattern part 432-1 may be aligned on the same vertical line or horizontal line, and accordingly, accuracy of a movement position of the image sensor 444 may be improved.

Meanwhile, the first pattern part 432-1 of the first lead pattern part 432 is disposed on the insulating layer 431, and the second pattern part 432-2 and the connection portion 432-3 are flying lead pattern parts extending in the horizontal direction from the insulating layer 431. That is, the first pattern part 432-1 is disposed at a position overlapped with the insulating layer 431 in the vertical direction. In addition, the second pattern part 432-2 and the connection portion 432-3 are disposed at positions not overlapped with the insulating layer 431 in the vertical direction. That is, the insulating layer 431 may be disposed under the first pattern part 432-1, and the insulating layer 431 may not be disposed under the second pattern part 432-2 and the connection portion 432-3.

As described above, a manufacturing process for making the first lead pattern part 432 to have a flying structure will be briefly described as follows.

As shown in FIG. 11D, the insulating layer 431 which is a basic material of the image sensor substrate 430 may be prepared. At this time, the insulating layer 431 may include a main insulating part 431a, a dummy insulating part 431b, and a connection insulating part 431c between the main insulating part 431a and the dummy insulating part 431b in order to form a pattern having the flying structure.

That is, when the insulating layer 431 is prepared, the insulating layer 431 is punched or etched to remove a region excluding the dummy insulating part 431b and the connection insulating part 431c. The dummy insulation part 431b and the connection insulation part 431c may serve to support a metal layer (not shown) disposed in order to form the first lead pattern part 432.

When the region excluding the dummy insulation part 431b and the connection insulation part 431c is removed, the metal layer (not shown) is disposed on the insulating layer 431. In this case, the metal layer may include a region disposed on the dummy insulation part 431b, a region disposed on the connection insulation part 431c, and a region disposed on the main insulation part 431a. In addition, the first lead pattern part 432 may have the flying structure by etching the disposed metal layer to form the first lead pattern part 432. At this time, when manufacturing of the first lead pattern part 432 is completed, the main insulation part 431b may be separated from the dummy insulation part 431a by dicing between the main insulation part 431a and the connection insulation part 431c.

Meanwhile, the camera device 100A may include the image sensor module 440. The image sensor module 440 may be coupled to the substrate holder 410. The image sensor module 440 may be fixed to the substrate holder 410. The image sensor module 440 may move integrally with the substrate holder 410. The image sensor module 440 may include the cover 441, a filter 442, a substrate 443, the image sensor 444, and the reinforcing plate 445. However, any one or more of the cover 441, the filter 442, the package substrate 443, the image sensor 444, and the reinforcing plate 445 of the image sensor module 440 may be omitted.

The image sensor module 440 may include the cover 441. The cover 441 may cover the filter 442 and the image sensor 444. The cover 441 may include an upper plate part and a side wall part. The cover 441 may include a hole 441a. The hole 441a may be a hollow hole. The hole 441a may be an opening. The cover 441 may include a protrusion 441b. The protrusion 441b may protrude from a lower surface of the cover 441. The protrusion 441b may be inserted into a second hole 443b of the substrate 4430 and a hole 445a of the reinforcing plate 445.

The image sensor module 440 may include the filter 442. The filter 442 may serve to block light having a specific frequency band of light passing through the lens module 210 from being incident on the image sensor 444. The filter 442 may be disposed to be parallel to an x-y plane. The filter 442 may be disposed between the lens module 210 and the image sensor 444. The filter 442 may be disposed between the cover 441 and the package substrate 443. As a modified example, the filter 442 may be disposed in the hole 441a of the cover 441. The filter 442 may include an infrared filter. The infrared filter may absorb or reflect infrared light incident on the infrared filter.

The image sensor module 440 may include the package substrate 443. The package substrate 443 may be a substrate for mounting the image sensor 444 in a package form. The package substrate 443 may include a printed circuit board (PCB). The package substrate 443 may include a circuit board. The image sensor 444 may be disposed on the package substrate 443. The package substrate 443 may be coupled to the image sensor substrate 430. The package substrate 443 may include a first hole 443a having a shape and a size corresponding to the image sensor 444. The image sensor 444 may be inserted into the first hole 443a of the package substrate 443. The package substrate 443 may include the second hole 443b. The protrusion 441b of the cover 441 may be inserted into the second hole 443b of the package substrate 443. The package substrate 443 may include a terminal 443c. The terminal 443c of the package substrate 443 may be disposed at each of four side ends of the package substrate 443. The terminal 443c of the package substrate 443 may be connected to the first lead pattern part 432 of the image sensor substrate 430. More specifically, the terminal 443c of the package substrate 443 may be connected to the first pattern part 432-1 of the first lead pattern part 432 of the image sensor substrate 430.

The package substrate 443 may include a groove 443d. The groove 443d of the package substrate 443 may be formed at each of four corners of the package substrate 443. The first protrusion 414 of the substrate holder 410 may be avoided by the groove 443d of the package substrate 443.

The image sensor module 440 may include the image sensor 444. The image sensor 444 may be coupled to the substrate holder 410. The image sensor 444 may move integrally with the substrate holder 410. However, the package substrate 443 to which the image sensor 444 is coupled may be coupled to the substrate holder 410 without the image sensor 444 being directly coupled to the substrate holder 410. As a modified example, the image sensor 444 may be directly coupled to the substrate holder 410. The image sensor 444 may be disposed to be aligned with the optical module. The image sensor 444 may be a configuration in which light passing through the lens and the filter 442 is incident to form an image. The image sensor 444 may be mounted on the package substrate 443. The image sensor 444 may be electrically connected to the package substrate 443. As an example, the image sensor 444 may be coupled to the package substrate 443 by surface mounting technology (SMT). As another example, the image sensor 444 may be coupled to the substrate 443 by flip chip technology. The image sensor 444 may be disposed such that the optical axis coincides with the lens. That is, the optical axis of the image sensor 444 and the optical axis of the lens may be aligned. The image sensor 444 may convert light irradiated to an effective image region of the image sensor 444 into an electrical signal. The image sensor 444 may be any one of a charge coupled device (CCD), a metal oxide semi-conductor (MOS), a CPD, and a CID.

In the present embodiment, the image sensor 1440 may be rotated around the x-axis, the y-axis, and the z-axis. The image sensor 1440 may move around the x-axis, the y-axis, and the z-axis. The image sensor 1440 may be tilted around the x-axis, the y-axis, and the z-axis.

The image sensor module 440 may include the reinforcing plate 445. The reinforcing plate 445 may be disposed on the lower surface of the image sensor 444 and the package substrate 443. The reinforcing plate 445 may be formed of stainless steel (SUS). The reinforcing plate 445 may reinforce the image sensor 444 and the package substrate 443. The reinforcing plate 445 may include the hole 445*a*. The hole 445*a* may be coupled to the protrusion 441*b* of the cover 441. The reinforcing plate 445 may include a groove 445*b*. The groove 445*b* may be formed at each of four corners of the reinforcing plate 445. The groove 445*b* may be formed such that a corner of the reinforcing plate 445 is recessed inward.

The camera device 100A may include the wire 510. The wire 510 may connect the driving substrate 120 and the image sensor substrate 430. The wire 510 may have elasticity. The wire 510 may be an elastic member. The wire 510 may be a wire spring. In this case, in a state in which the driving substrate 120 and the image sensor substrate 430 are spaced apart from each other by a predetermined distance, the wire 510 may electrically connect the second lead pattern part 122 of the driving substrate 120 and the first lead pattern part 432 of the image sensor substrate 430.

The wire 510 may be formed of metal. The wire 510 may be electrically connected to the image sensor 444. The wire 510 may be used as a conductive line of the image sensor 444. One end of the wire 510 may be coupled to the driving substrate 120, and the other end of the wire 510 may be coupled to the first lead pattern part 432. The wire 510 may elastically support movement of the substrate holder 410.

The wire 510 may include a plurality of wires. The plurality of wires may include a number of wires corresponding to a number of terminals of the image sensor 444. The plurality of wires may include a total of 24 wires, six for each between adjacent corners of four corners of the substrate holder.

The camera device 100A may include a sensor 520. The sensor 520 may be disposed on an upper surface of the driving substrate 120. The sensor 520 may include a hall sensor (Hall IC). The sensor 520 may sense the magnetic force of the magnet 320. Movement of the image sensor 444 may be grasped in real time via the magnetic force of the magnet 320 sensed by the sensor 520. Through this, OIS feedback control may be possible.

The sensor 520 may include a plurality of sensors. The sensor 520 may include three sensors. Through the three sensors, an x-axis movement, a y-axis movement, and a z-axis-centered rotation of the image sensor 444 may be sensed. The sensor 520 may include first to third sensors. The first sensor may face the first magnet 321, the second sensor may face the second magnet 322, and the third sensor may face the third magnet 323.

The camera device 100A may include the housing 600. The housing 600 may be coupled to the holder 110. The housing 600 may provide a space therein by coupling with the holder 110. The appearance of the camera device 100A may be formed by the housing 600 and the holder 110. The housing 600 may accommodate a configuration such as the coil 310, the magnet 320, and the like. The housing 600 may include a shield can.

The housing 600 may include a sidewall 610. The sidewall 610 may include a plurality of sidewalls. The sidewall 610 may include four sidewalls. The housing 600 may include a lower portion 620. The lower portion 620 may extend inward from a lower end of the sidewall 610. The lower portion 620 may include a hole. A lower surface of the housing 600 may be formed by a separate lower plate 630. The lower plate 630 may be understood as one configuration or a separate configuration of the housing 600. The lower plate 630 may include a groove 631 coupled to a protrusion 622 protruding from a lower surface of the lower portion 620 of the housing 600.

The camera device 100A may include the flexible circuit board 150. The flexible circuit board 150 may be electrically connected to the coil 310. The flexible circuit board 150 may include the terminal 150*a* coupled to the terminal 222 of the MEMS actuator 220. The flexible circuit board 150 may include a hole through which the lens module 210 passes.

The camera device 100A may include a connector 190. The connector 190 may be electrically connected to the flexible circuit board 150. The connector 190 may include a port for electrically connecting with an external device.

The camera device 100A may include a motion sensor. The motion sensor may be mounted on the flexible circuit board 150. The motion sensor may be electrically connected to a controller through a circuit pattern provided on the flexible circuit board 150. The motion sensor may output information of a rotational angular velocity due to the movement of the camera device 100A. The motion sensor may include at least one of a two-axis gyro sensor, a three-axis gyro sensor, and an angular velocity sensor.

The camera device 100A may include the controller. The controller may be disposed on the flexible circuit board 150. The controller may be electrically connected to the coil 310. The controller may individually control a direction, intensity, and amplitude of a current supplied to the first to fourth coils 311, 312, 313, and 314. The controller may control a current applied to the coil 310 and a current applied to the MEMS actuator 220 to perform the auto focus function and/or the camera shake correction function. Further, the controller may perform auto focus feedback control and/or camera shake correction feedback control.

The camera device 100A according to the present embodiment may be for mobile camera application. That is, it may be distinguished from a camera device for digital camera application. When down-sizing for mobile camera application, a driving force of VCM is relatively lowered, and thus there is a problem that a current consumed in order to implement three operations (X-Shift, Y-Shift, Z-Rotation (Roll)) is increased.

The magnet 320 and the coil 310 are rotated 90 degrees at each corner of the substrate holder 410, so that the magnet 320 and the coil 310 positioned at diagonal angles may be assembled in the same direction. In this case, a Lorentz force in the same direction may be generated when the image sensor 444 is shift driven, and two pairs of torque may be generated by a force in an opposite direction during a z-axis rotational drive.

In the present embodiment, since four coils located at the corners require current inputs that are independent of each other, it is possible to have a system in which a power terminal of the coil 310 is separated to control by four channels. That is, the present embodiment may include a magnet diagonal arrangement structure in the same magnetic flux direction and an individual current input structure of four coils.

The present embodiment may include two pairs of torque generating structures (increasing in rotation moment). It is possible to generate rotation moment higher than the conventional one by the structures that generate the two pairs of torque, and to reduce total current consumption when driving three modes of X-Shift, Y-Shift, and Z-Rotation (Roll).

Simulation results of the camera device according to the present embodiment are as follows. When "rotation moment=rotational torque*distance between torques=(electromagnetic force*input current)*distance between centers of magnets 320", and 50 mA as an input current is applied to the coil 310 of the camera device 100A according to the present embodiment, it was confirmed that a rotational moment of {(0.094 mN/mA×50 mA)×12.14 mm}×2=114.1 mN·mm was generated.

In the present embodiment, a camera shake correction for the lens corresponding to a camera shake correction for the image sensor 444 may be performed together. For example, when the camera shake correction is performed only by the MEMS actuator 220, positive distortion may occur at an edge of an image obtained by the image sensor 444. Meanwhile, when the camera shake correction is performed by moving only the image sensor 444, negative distortion may occur at the edge of the image obtained by the image sensor 444. In the present embodiment, the camera shake correction of the image sensor 444 and the camera shake correction of the MEMS actuator 220 may be performed together to minimize distortion generated at the edge of the image. In the present embodiment, it is possible to perform the camera shake correction function at the lens side through the MEMS actuator 220, and move so as to correspond to the image sensor 444. Through this, it is possible to provide a camera shake correction of a level corresponding to the module moving method which is a method of integrally moving the lens and the image sensor 444. However, the MEMS actuator 220 according to the present embodiment may provide only the AF function and perform an OIS function by moving the image sensor 444.

Hereinafter, a camera device according to a second embodiment will be described.

FIG. 19 is a perspective view of a camera device according to a second embodiment, FIG. 20 is a cross-sectional view taken along line A-A of FIG. 19, and FIG. 21 is an exploded perspective view of the camera device to the second embodiment.

The camera device in the second embodiment may include a camera module. The camera device may include a lens driving device. Here, the lens driving device may be a voice coil motor (VCM). The lens driving device may be a lens driving motor. The lens driving device may be a lens driving actuator. The lens driving device may include an AF module. The lens driving device may include an OIS module.

<Camera Device>

A camera device may include a lens module 1100.

The lens module 1100 may include a lens and a lens barrel.

The camera device may include an actuator.

In detail, the camera device may include a first actuator 1200 for shifting the lens module 1100. The first actuator 1200 may be an AF module. The first actuator 1200 may move the lens module 1100 in a vertical direction (obviously, an optical axis direction). That is, the first actuator 1200 may perform an auto focus function by moving the lens module 1100 in the optical axis direction.

A second actuator 1600 may drive an image sensor 1430. The second actuator 1600 may tilt or rotate the image sensor 1430. The second actuator 1600 may move the image sensor 1430. The second actuator 1600 may move the image sensor 1430 in a first direction perpendicular to an optical axis, move the image sensor 1430 in a second direction perpendicular to the optical axis and the first direction, and rotate the image sensor 1430 based on the optical axis. In this case, the first direction may be an x-axis direction, the second direction may be a y-axis direction, and the optical axis may be a z-axis direction.

Meanwhile, the first actuator 1200 and the second actuator 1600 may include a driver to move the lens module 1100 and the image sensor 1430, respectively. That is, the first actuator 1200 may include a first driver (described later). In addition, the second actuator 1600 may include a second driver (described later). Each of the first and second drivers may include a coil and a magnet. In addition, the coil and the magnet may generate an electromagnetic force therebetween to drive the lens module 1100 and the image sensor 1430, respectively.

The camera device may include cases 1300 and 1500.

The cases 1300 and 1500 may include a first case 1300 and a second case 1500. The first case 1300 may be an upper case covering an upper region of the camera device. In this case, the first case 1300 may be a shield can.

The first case 1300 may be disposed surrounding side surfaces of the first actuator 1200, the second actuator 1600, and an image sensor module 1400 constituting the camera device. A first open region 1310 may be formed on an upper surface of the first case 1300. The first open region 1310 of the first case 1300 may be a hollow hole. The lens module 1100 coupled to the first actuator 1200 may be disposed in the first open region 1310 of the first case 1300. In this case, the first open region 1310 of the first case 1300 may have a diameter larger than that of the lens module 1100.

Specifically, the first case 1300 may include a top plate and a plurality of side plates that are curved or bent at an edge of the top plate and extended downward. For example, the top plate of the first case 1300 may have a quadrangular shape, thereby including four side plates extending downward from four edges of the top plate. For example, the first case 1300 may be formed with the first open region 1310 into which the lens module 1100 is inserted on the upper surface thereof, and may have a rectangular parallelepiped shape in which a bottom surface thereof is opened and a corner is rounded.

Meanwhile, a second open region 1320 may be formed on any one of four side plates of the first case 1300. The second open region 1320 may be an exposure hole that exposes a part of the configuration of the first actuator 1200 disposed in the first case 1300 to the outside. For example, the second open region 1320 of the first case 1300 may expose a terminal 1262 of a flexible circuit board 1260 of the first actuator 1200. This will be described in detail later.

The second case 1500 may be a lower case covering a lower region of the camera device. The second case 1500 may block an opened lower region of the first case 1300.

Each of the first actuator 1200, the second actuator 1600, and the image sensor module 1400 constituting the camera device may be disposed in an accommodating space formed by the first case 1300 and the second case 1500.

The image sensor module 1400 may be coupled to the second actuator 1600. Preferably, the second actuator 1600 may be composed of a fixing part (to be described later) and a moving part (described later). In addition, the moving part of the second actuator 1600 may be connected to the fixing part through a wire (described later). The moving part of the second actuator 1600 may move with respect to the fixing part by the electromagnetic force of the second driving part. Here, the movement of the fixing part may include all of the movement in the first direction, a movement in the second direction, and a movement in the optical axis direction.

In addition, the image sensor module 1400 may be coupled to the moving part of the second actuator 1600. The image sensor module 1400 may include an image sensor 1440. The image sensor 1440 may be any one of a charge coupled device (CCD), a metal oxide semi-conductor (MOS), a CPD, and a CID.

In the present embodiment, the image sensor 1440 may be rotated around an x-axis, a y-axis, and a z-axis. The image sensor 1440 may move around the x-axis, the y-axis, and the z-axis. The image sensor 1440 may be tilted around the x-axis, the y-axis, and the z-axis.

That is, the image sensor module 1400 is coupled to the moving part of the second actuator 1600, and when the moving part of the second actuator 1600 moves relative to the fixing part of the second actuator 1600, it is possible to move relative to the fixing part of the second actuator 1600 together with the moving part of the second actuator 1600. As a result, the camera shake correction function may be performed.

As described above, in the embodiment, an AF function may be performed through the first actuator 1200, and a camera shake correction function may be performed through the second actuator 1600. Alternatively, the second actuator 1600 may perform both the AF function and the camera shake correction function.

The camera device according to the present embodiment moves the image sensor module 1400 relative to the lens module 1100 to perform the camera shake correction function and/or the auto focus function.

That is, recently, as the camera technology has been developed, an image resolution has been increased, thereby increasing a size of the image sensor 1440. At this time, as the size of the image sensor 1440 increases, a size of the lens module 1100 and parts of the actuator for shifting the lens module 1100 are also increase. Accordingly, as a weight of the other actuator components for shifting the lens module 1100 as well as the weight of the lens module 1100 increases, it is difficult to stably shift the lens module 1100 using the conventional VCM technology, and a lot of problems occur in terms of reliability.

Accordingly, in the present embodiment, AF is performed using the first actuator 1200 implementing a lens shift method, and OIS is executed using the second actuator 1600 implementing the image sensor shift method, thereby, the reliability of the camera device is improved.

Furthermore, there is a 5-axis camera shake in the camera shake of the camera device. For example, in the 5-axis camera shake, there are two camera shakes that are shaken at an angle, two camera shakes that is shaken by a shift, and one camera shake that are shaken by rotation. At this time, only the 4-axis camera shake correction is possible with the lens shift method, and the camera shake that are shaken in rotation cannot be corrected. This is because the camera shake caused by rotation should be corrected by rotation of the optical module, and even when the lens module 1100 is rotated, an incident optical path is maintained as it is, and accordingly, the 5-axis camera shake correction is not possible with the lens shift method. Therefore, in the present embodiment, it is possible to solve a reliability problem of the lens shift method according to the development of the camera technology as described above, while applying the sensor shift method so as to enable the 5-axis camera shake correction.

Hereinafter, each configuration of the camera device according to the second embodiment will be described in more detail.

<First Actuator>

FIG. 22 is an exploded perspective view of a first actuator shown in FIG. 21, FIG. 23A is a plan view of a base of FIG. 22, FIG. 23B is a plan view of the first actuator of FIG. 22, and FIG. 23 is a bottom view of the first actuator of FIG. 22.

Referring to FIGS. 22 and 23, a first actuator 1200 may include a base 1210, a bobbin 1220, a first elastic member 1230, a second elastic member 1240, and a first driver 1250.

In the first actuator 1200 in an embodiment, the bobbin 1220 may be elastically supported in a vertical direction by the base 1210 via the first elastic member 1230 and the second elastic member 1240, and the bobbin 1220 may move in the vertical direction by electromagnetic interaction of the first driver 1250 disposed at the bobbin 1220. Accordingly, a lens module 1100 coupled to the bobbin 1220 may move in the optical axis direction. In addition, an auto focus (AF) function may be performed as the lens module 1100 moves in the optical axis direction.

The base 1210 may be a fixing member of the first actuator 1200. The base 1210 may be disposed at an inner side of a first case 1300 to be coupled to the first case 1300.

The base 1210 may include a body 1211 having a first opening 1213 formed at a center thereof. A shape of the body 1211 may have a shape corresponding to the first case 1300. For example, the shape of the body 1211 of the base 1210 may have a rectangular parallelepiped shape or a square cross-sectional shape corresponding to a shape of the first case 1300.

A plurality of first protrusions 1212 are formed on an upper surface of the body 1211 of the base 1210. The plurality of first protrusions 1212 may formed protruding in an upward direction on the upper surface of the body 1211. In addition, correspondingly, a plurality of lower protrusions (not shown) may be formed protruding in a downward direction on a lower surface of the body 1211. The plurality of first protrusions 1212 may be a fixing protrusion for fixing the first elastic member 1230 disposed on the base 1210. The plurality of first protrusions 1212 may be disposed at four corner regions on the upper surface of the body 1211 of the base 1210.

A first opening 1213 is formed in the body 1211 of the base 1210. The first opening 1213 may have a shape corresponding to a shape of the bobbin 1220. For example, the bobbin 1220 may have a quadrangular plate shape, and accordingly, the first opening 1213 may also have a quadrangular shape. However, the present embodiment is not limited thereto, and the bobbin 1220 may have a cylindrical shape, and accordingly, the first opening 1213 may also have a circular shape. A size of the first opening 1213 may be larger than that of the bobbin 1220. For example, in a state in which the bobbin 1220 is inserted into the first opening 1213, a predetermined gap may exist between an inner surface of the body 1211 of the base 1210 and an outer surface of the bobbin 1220.

A stepped protrusion 1215 may be formed on the inner surface of the body 1211 of the base 1210. The stepped protrusion 1215 may limit movement of the bobbin 1220 while selectively supporting the bobbin 1220 disposed in the first opening 1213. For example, the stepped protrusion 1215 may function as a stopper for limiting movement of the bobbin 1220 in a downward direction. That is, when the bobbin 1220 in a normal state may not be in contact with the stepped protrusion 1215 in a state in which the bobbin 1220 is disposed in the first opening 1213, and the bobbin 1220 may be in contact with the stepped protrusion 1215 when the bobbin 1220 moves to a movement limit range in a downward direction.

Meanwhile, a first recess 1217 recessed in an outward direction may be formed on the inner surface of the body 1211 of the base 1210. The first recess 1217 may include a first-first recess 1217*a* and a first-second recess 1217*b* respectively formed on two inner surfaces facing each other of the inner surfaces of the body 1211. At least a part of the bobbin 1220 may be disposed in the first-first recess 1217*a* and the second-recess 1217*b*. For example, a sensor magnet mounting part (not shown) formed in the bobbin 1220 may be disposed in the first-first recess 1217*a* and the first-second recess 1217*b*. The first-first recess 1217*a* and the first-second recess 1217*b* may be formed in order to minimize a distance between sensor magnets 1253 and 1254 mounted on the sensor magnet mounting part of the bobbin 1220 and a driver IC (not shown) mounted on the flexible circuit board 1260.

A first driving magnet mounting groove 1216 is formed in a region facing each other around the first opening 1213 on the lower surface of the body 1211 of the base 1210. That is, a first-first driving magnet mounting groove 1216*a* is formed in a first region of the lower surface of the body 1211 of the base 1210. In addition, a first-second driving magnet mounting groove 1216*b* is formed in a second region facing the first region of the lower surface of the body 1211 of the base 1210. A first-first driving magnet 1252*b* may be disposed in the first-first driving magnet mounting groove 1216*a*, and a first-second driving magnet 1252*a* may be disposed in the first-second driving magnet mounting groove 1216*b*. In this case, the first actuator 1200 according to the embodiment moves the bobbin 1220 in the optical axis direction using two driving magnets 1252*a* and 1252*b* disposed to face each other. In this case, the first driving magnets 1252*a* and 1252*b* may be disposed extending long in a longitudinal direction in order to move the bobbin 1220 in the optical axis direction by only the two first driving magnets 1252*a* and 1252*b*. In this case, the first driving magnets 1252*a* and 1252*b* may be disposed in a region other than a corner region of the lower surface of the body 1211 in order to minimize a region overlapped with a second drive magnet (described later) of the second actuator 1600 in the optical axis direction. In addition, the first driving magnets 1252*a* and 1252*b* may generate magnetic field interference with the second driving magnet of the second actuator 1600. In this case, the first driving magnets 252*a* and 252*b* are disposed in a state in which the first driving magnets 252*a* and 252*b* are fixed to the body 1211 of the base 1210. In addition, the second driving magnet of the second actuator 1600 is also disposed to be fixed to a fixing part, not a moving part. As described above, in the embodiment, the first driving magnets 1252*a* and 1252*b* and the second driving magnet are disposed at fixed positions, respectively. That is, in the embodiment, a coil is disposed at a portion moving depending on a lens shift and an image sensor shift, and accordingly, the driving magnets are continuously positioned in the fixed position, thereby minimizing magnetic interference with each other.

Meanwhile, the body 1211 of the base 1210 includes a substrate groove 1214 into which the flexible circuit board 1260 is inserted. In this case, the flexible circuit board 1260 may be inserted into the substrate groove 1214 vertically in an upright state. In this case, the substrate groove 1214 may have a bent shape bent at least once. That is, the flexible circuit board 1260 is inserted into the substrate groove 1214, and in this case, a driver IC is disposed in the flexible circuit board 1260. The driver IC may be a hall sensor built-in driver. Accordingly, the driver IC may sense a position of the lens module 1100 by sensing a change in electric field magnitude that changes depending on positions of the sensor magnets 1253 and 1254, and accordingly, control an output signal.

In this case, the driver IC is disposed to face the sensor magnets 1253 and 1254. In this case, as a distance between the sensor magnets 1253 and 1254 and the driver IC is closer, accuracy of position sensing information of the bobbin 1220 or the lens module 1100 obtained via the driver IC may be improved. In addition, a terminal 1262, which is electrically connected to a first substrate (described later) of the second actuator 1600, is disposed in the flexible circuit board 1260. In this case, in order to electrically connect between the terminal 1262 and the first substrate, a process such as soldering should be performed. Accordingly, the terminal 1262 should be positioned close to an outer surface of the base 1210.

That is, the flexible circuit board 1260 includes a first substrate region 1261 in which the terminal 1262 is disposed and a second substrate region 1262 in which the driver IC is disposed. In addition, the flexible circuit board 1260 has the first substrate region 1261 positioned adjacent to the outer surface of the base 1210 and the second substrate region 1263 positioned adjacent to an inner surface of the base 1210, and to this end, a bent region may be included between the first and second substrate regions.

The bobbin 1220 is disposed in the first opening 1213 of the base 1210.

A second opening 1221 may be formed at a center of the bobbin 1220. The second opening 1221 may have a shape corresponding to the lens module 1100. For example, the second opening 1221 may have a circular shape corresponding to a shape of the lens module 1100, but is not limited thereto. The bobbin 1220 may be coupled to the lens module 1100. For example, the lens module 1100 may be inserted into the second opening 1221 of the bobbin 1220 and coupled to the bobbin 1220.

A plurality of second protrusions 1223 in contact with the first elastic member 1230 may be formed on an upper surface of the bobbin 1220. The plurality of second protrusions 1223 may be a stopper that limits a movement range of the bobbin 1220 in an upward direction while the bobbin 1220 is elastically supported by the first elastic member 1223. For example, when the bobbin 1220 is out of the movement range in an upward direction, the second protrusion 1223 is in contact with an inner surface of an upper surface of the first case 1300 positioned in an upper portion of the bobbin 1220 to limit the movement of the bobbin 1220.

A coil winding part 1222 to which a first coil part 1251 is wound may be formed on the outer surface of the bobbin 1220. For example, a coil winding part 1222 having a recessed shape recessed in an inward direction may be formed on the outer surface of the bobbin 1220. In addition, the first coil part 1251 may be wound around the coil winding part 1222. The first coil part 251 may be in the form of a "coil block". The first coil part 1251 may be an "electromagnet". The first coil part 1251 may be disposed to face the first driving magnets 1252*a* and 1252*b*, and accordingly, an electromagnetic force may be generated by electromagnetic interaction with the first driving magnets 1252*a* and 1252*b*. In this case, the first coil part 1251 may be electrically connected to the second elastic member 1240. Accordingly, the first coil part 1251 may receive a current from the second elastic member 1240 to generate an electromagnetic force. As a result, the bobbin 1220 may move in an optical axis direction to perform an AF function.

A sensor magnet mounting part (not shown) which protrudes in an inner surface direction of the base 1210 and in which the sensor magnets 1253 and 1254 may be disposed may be formed on outer surfaces of the bobbin 1220 other than the outer surfaces facing the first driving magnets 1252a and 1252b. In addition, the sensor magnets 1253 and 1254 may be mounted on the sensor magnet mounting part and positioned in the first-first recess 1217a and the first-second recess 1217b of the base 1210. The sensor magnets 1253 and 1254 move together with the bobbin 1220 as the bobbin 1220 moves. In addition, magnitude of the magnetic field sensed by the driver IC disposed on the flexible circuit board 1260 may be changed depending on positions of the sensor magnets 1253 and 1254, and the driver IC may sense positions of the sensor magnets 1253 and 1254, further that of the bobbin 1220, and further that of the lens module 1100 based on a change in the magnitude of the changing magnetic field.

The first elastic member 1230 is disposed above the base 1210 and the bobbin 1220. The second elastic member 1240 is disposed below the base 1210 and the bobbin 1220. Accordingly, the bobbin 1220 may be elastically supported in a vertical direction via the first elastic member 1230 and the second elastic member 1240 in the first opening of the base 1210.

The first elastic member 1230 may be a plate spring. The first elastic member 1230 may be a metal. Alternatively, the first elastic member 1230 may be nonmagnetic. Therefore, the first elastic member 1230 may not be affected by a magnetic force of the first driving magnets 1252a and 1252b and an electromagnetic force of the first coil part 1251.

The first elastic member 1230 may be disposed on the base 1210. In addition, the first elastic member 1230 may be disposed above the bobbin 1220. The first elastic member 1230 may be coupled to the base 1210 and the bobbin 1220. That is, the first elastic member 1230 may include a first-first elastic portion 1231 coupled to the base 1210 and first-second elastic portion 1233 extending from the first-first elastic portion 1231 and coupled to the bobbin 1220. A coupling groove 1232 inserted into the plurality of first protrusions 1212 disposed on the upper surface of the body 1211 of the base 1210 is formed in the first-first elastic portion 1232. Accordingly, the first elastic member 1230 may elastically support an upper side of the bobbin 1220 in a state in which the coupling groove 1232 is coupled to the first protrusion 1212. In addition, the first elastic member 1230 may include an opening 1234 into which the lens module 1100 is inserted at a center thereof.

The second elastic member 1240 may be disposed below the base 1210.

In addition, the second elastic member 1240 may be disposed below the bobbin 1220. The second elastic member 1240 may be coupled to the base 1210 and the bobbin 1220. That is, the second elastic member 1240 may include a second-first elastic portion 1241 coupled to the base 1210 and a second-second elastic portion 1242 coupled to the bobbin 1220. Accordingly, the second elastic member 1240 may elastically support a lower side of the bobbin 1220 in a state in which the second elastic member 1240 is coupled to the base 1210. In addition, the second elastic member 1240 may include an opening 1243 into which the lens module 1100 is inserted at a center thereof.

The second elastic member 1240 may be electrically connected to the first coil part 1251. The second elastic member 1240 may be electrically connected to the flexible circuit board 1260. The second elastic member 1240 may electrically connect the first coil part 1251 and the flexible circuit board 1260. Therefore, in the flexible circuit board 1260, a current may be supplied to the first coil part 1251 via the second elastic member 1240. In this case, a direction, wavelength, intensity, etc. of the current supplied to the first coil part 1251 may be controlled.

<Second Actuator>

Hereinafter, the second actuator 1600 will be described.

The second actuator 1600 may be positioned under the first actuator 1200 and operated separately from the first actuator 1200 to shift the image sensor module 1400.

To this end, the second actuator 1600 may include a fixed part 1700 of which position is fixed, and a moving part 1800 of which position is moved by an electromagnetic force of a driver in a state in which the second actuator 1600 is coupled to the fixing part.

FIG. 24 is an exploded perspective view of a second actuator according an embodiment, FIG. 25 is a cross-sectional view briefly illustrating a connection relationship between a first substrate and a moving part of FIG. 24, FIG. 26 is an exploded perspective view of a fixing part of FIG. 24, FIG. 27 is a bottom view of the fixing part of FIG. 24, FIG. 28 is a view showing an upper surface of the first substrate in more detail, FIG. 29 is an exploded perspective view of the moving part according to the embodiment, FIG. 30A is a plan view of a second substrate, FIG. 30B is a bottom view of the second substrate, FIG. 31A is a plan view of a third substrate, FIG. 31B is a bottom view of the third substrate, FIG. 32 is an exploded perspective view of a fourth substrate, FIG. 33 is a plan view of the fourth substrate, FIG. 34 is an enlarged view enlarging a specific region of FIG. 33, and FIG. 35 is a connection view of the third substrate and the fourth substrate.

Referring to FIGS. 24 to 35, the second actuator 1600 may include a fixed substrate part 1700, a moving substrate part 1900, a connection wire 1800, and a substrate housing 2000.

The fixed substrate part 1700 and the moving substrate part 1900 are electrically connected to each other by the connection wire 1800. Here, a length of the connection wire 1800 is larger than a sum of both thicknesses of the fixed substrate part 1700 and the moving substrate part 1900. Accordingly, the moving substrate part 1900 disposed below the fixed substrate part 1700 is positioned at a predetermined distance from the fixed substrate part 1700. That is, the moving substrate part 1900 may move relative to the fixed substrate part 1700 by an electromagnetic force generated by the magnet part and the coil part to be described later in the suspended state (flown state) to a lower portion of the fixed substrate part 1700 by the connection wire 1800.

The connection wire 1800 may connect the fixed substrate part 1700 and the moving substrate part 1900. The connection wire 1800 may have elasticity. The connection wire 1800 may be an elastic member. The connection wire 1800 may be a wire spring. The connection wire 1800 may connect between a circuit pattern portion of the fixed substrate part 1700 and a circuit pattern portion of the moving substrate part 1900 in a state in which the fixed substrate part 1700 is spaced apart from the moving substrate part 1900 at a predetermined interval. The connection wire 1800 may be formed of metal. The connection wire 1800 may elastically support a movement of the moving substrate part 1900.

The connection wire 1800 may include a plurality of wires. The plurality of wires may correspond to the number of channels of signals exchanged between the moving substrate part 1900 and the fixed substrate part 1700. The connection wire 1800 may include a total of thirty-six wires, nine each on side surface between adjacent corners of the four corners of the fixed substrate part 1700 and the moving substrate part 1900.

For example, the connection wire 1800 may include nine first wires 1810 disposed on each of first side surfaces of the fixed substrate part 1700 and the moving substrate part 1900, nine second wires 1820 disposed on a second side surface, nine third wires 1830 disposed on a third side surface, and nine fourth wires 1840 disposed on the fourth side surface.

As described above, the connection wire 1800 may be evenly distributed on four side surfaces. That is, the connection wire 1800 may form a symmetrical structure with side surfaces facing each other at the four side surfaces. In this case, the connection wire 1800 should elastically support the moving substrate part 1900 with respect to the fixed substrate part 1700 while transmitting a signal. In this case, when the connection wire 1800 is asymmetrically disposed, the moving substrate part 1900 may not perform a normal shift operation, a difference occurs in an amount of movement between a portion in which the connection wire is disposed a lot and other portions, and accordingly, problems in operation reliability may occur. Therefore, in an embodiment, the connection wire 1800 are circularly disposed evenly in each region to improve reliability of the image sensor shift operation.

The substrate housing 2000 is disposed below the fixed substrate part 1700 to accommodate the moving substrate part 1900 therein.

The second actuator 1600 configured as described above will be specifically described as follows.

The fixed substrate part 1700 may include a first substrate 1710, a magnet holder 1720, and a magnet part 1730.

The first substrate 1710 may include a first substrate region 1711 in which a first opening 1712 at a center thereof is formed, and a second substrate region 1716 in which a connector extending from the first substrate region 1711 and connected to an external device is disposed.

The first substrate 1710 may include a first lead pattern part 1713 disposed in the first substrate region 1711. The first substrate 1710 may be coupled to the connection wire 1800 in the first lead pattern part 1713. That is, one end of the connection wire 1800 may be coupled to the first lead pattern part 1713 of the first substrate 1710. A coupling of the first lead pattern part 1713 and the connection wire 1800 may be performed via soldering. The first lead pattern part 1713 may be a portion in which a solder resist is opened for electrical connection with the connection wire 1800.

In detail, the first lead pattern part 1713 includes a first hole 1713-2 and a first lead pattern part 1713-3 disposed surrounding the first hole 1713-2. That is, the first lead pattern part 1713 may be a pad including the first hole 1713-2 through which the connection wire 1800 passes. Accordingly, the connection wire 1800 may be soldered in a state in which the connection wire 1800 is passing through the first hole 1713-2 to be electrically connected to the lead pattern part 1713-1 disposed around the first hole 1713-2.

The connector may be disposed in the second substrate region 1716 connected to the first substrate region 1711. The connector may be a port for electrically connecting with the external device.

In this case, the first substrate region 1711 may be disposed in the camera device, and the second substrate region 1716 may extend from the first substrate region 1711 to be exposed to outside the camera device.

That is, the first substrate region 1711 may be disposed inside the first case 1300, and the second substrate region 1716 may be disposed outside the first case 1300 to include the connector connected to the external device.

The first substrate 1710 may transmit a signal to the moving substrate part 1900, or may receive the signal transmitted from the moving substrate part 1900. That is, the first substrate 1710 is electrically connected to the moving substrate part 1900 via a connection wire 1800, and accordingly, a power signal or a communication signal may be transmitted to the moving substrate part 1900 via the connection wire 1800, and information including an image signal obtained by the moving substrate part 1900 may be received.

A first pad portion 1714 may be disposed in an edge region of the first substrate region 1711 of the first substrate 1710. The first pad portion 1714 may be electrically connected to the flexible circuit board 1260 included in the first actuator 1200.

At least one first coupling hole 1715 is formed in a corner region of the first substrate region 1711 of the first substrate 1710. The first coupling hole 1715 may be formed to fix the first substrate 1710 on the magnet holder 1720.

The first substrate 1710 may be positioned in a fixed state within the first case 1300 of the camera device. That is, the first substrate 1710 may be disposed in a fixed state without moving.

The magnet holder 1720 is disposed below the first substrate 1710. The magnet holder 1720 may be provided with a substrate seating portion 1721 on which the first substrate 1710 is seated. In addition, a first coupling protrusion 1722 coupling to the first coupling hole 1715 formed in the first substrate 1710 may be formed in the substrate seating portion 1721.

The first substrate 1710 may be seated on the substrate seating portion 1721 in the state in which the first coupling hole 1715 is inserted into the first coupling protrusion 1722.

In this case, the magnet holder 1720 may include an open region overlapping the first opening 1712 of the first substrate 1710 in an optical axis direction. In addition, in the magnet holder 1720, a position overlapped in the optical axis direction with the first lead pattern part 1713 formed in the first actuator 1200 may be opened.

A gyro sensor 1717 may be disposed on a lower surface of the first substrate 1710. That is, the gyro sensor 1717 according to the present embodiment may be disposed on a lower surface of the first substrate 1710 and accommodated in the first case 1300 of the camera device.

That is, in the present embodiment, the gyro sensor 1717 for implementing an anti-shake function may be built in a state mounted on the lower surface of the first substrate 1710, so that an angular velocity/linear velocity sensing information due to a camera shake may be fed back to the moving substrate part 1900. Accordingly, in an embodiment, the gyro sensor 1717 is disposed in a space between the first substrate 1710 and the moving substrate part 1900, and thus there is an effect in which it is not necessary to provide an additional space for disposing the gyro sensor 1717.

A magnet-seating groove (not shown) in which the magnet part 1730 is disposed may be formed on a lower surface of the magnet holder 1720. The magnet part 1730 may be disposed in the magnet-seating groove of the magnet holder 1720. In this case, the magnet part 1730 may be disposed to face a coil part 1916 disposed on the moving substrate part 1900. In this case, when a current is applied to the coil part 1916, an electric field may be formed around the coil part 1916. When the current is applied to the coil part 1916, the coil part 1916 may move relative to the magnet part 1730 via electromagnetic interaction between the coil part 1916 and the magnet part 1730.

In this case, the magnet part 1730 may be disposed at a corner of the lower surface of the magnet holder 1720. That is, the magnet part 1730 may be disposed at four corners of the lower surface of the magnet holder 1720, respectively. In addition, the magnet part 1730 may face the coil. The magnet part 1730 may be a flat plate magnet having a flat plate shape.

The magnet part 1730 may include a plurality of magnets. The magnet part 1730 may include four magnets. The magnet part 1730 may include first to fourth magnets 1731, 1732, 1733, and 1734.

The first magnet 1731 may face a first coil 1916-1 disposed on the moving substrate part 1900. The first magnet 1731 may be disposed at a first corner disposed on an upper left side of the magnet holder 1720.

The second magnet 1732 may face a second coil 1916-2 disposed on the moving substrate part 1900. The second magnet 1732 may be disposed at a second corner disposed on an upper right side of the magnet holder 1720.

The third magnet 1733 may face a third coil 1916-3 disposed on the moving substrate part 1900. The third magnet 1733 may be disposed at a third corner disposed at a lower right side of the magnet holder 1720.

The fourth magnet 1734 may face a fourth coil 1916-4 disposed on the moving substrate part 1900. The fourth magnet may be disposed at a fourth corner disposed at a lower left side of the magnet holder 1720.

Each of the magnets constituting the magnet part 1730 may be disposed to be perpendicular to adjacent magnets, and may be disposed to be parallel to magnets disposed in a diagonal direction.

Here, polarity of a surface that faces the coil part 1916 of the surfaces of the first magnet 1731 from a portion close to one side and a portion close to the other side surface may be different. In addition, polarity of a surface that faces the coil part 1916 of the second magnet 1732 from a portion close to one side and a portion close to the other side surface may be different. Further, polarity of a surface that faces the coil part 1916 of the third magnet 1733 from a portion close to one side and a portion close to the other side surface may be different. Polarity of a surface that faces the coil part 1916 of the fourth magnet 1734 from a portion close to one side and a portion close to the other side surface may be different.

In addition, the first magnet 1731 and the third magnet 1733 may be disposed in a same direction, and the second magnet 1732 and the fourth magnet 1734 may be disposed in the same direction.

The first magnet 1731 may be disposed perpendicularly to the second magnet 1732. Polarities of inner side portions of the first to fourth magnets 1731, 1732, 1733, and 1734 may be the same. Polarities of outer side portions of the first to fourth magnets 1731, 1732, 1733, and 1734 may be the same. Each of the polarities of inner portions of the first to fourth magnets 1731, 1732, 1733, and 1734 may be formed as an N pole. Each of the polarities of outer portions of the first to fourth magnets 1731, 1732, 1733, and 1734 may be formed as an S pole. However, as a modified example, each of the polarities of inner portions of the first to fourth magnets 1731, 1732, 1733, and 1734 may be formed as an S pole and each of the polarities of outer portions thereof may be formed as an N pole.

Meanwhile, as shown in FIG. 27, one end of the connection wire 1800 may be coupled to the first lead pattern part 1713 of the first substrate 1710, and pass through the first hole 1713-2 constituting the first lead pattern part 1713 so as to extend to a lower portion of the first substrate 1710.

As described above, the fixed substrate part 1700 may be configured such that the first substrate 1710 is disposed on an upper surface of the magnet holder 1720, and the magnet part 1730 is disposed on the lower surface thereof, based on the magnet holder 1720. In addition, a gyro sensor obtaining sensing information necessary to perform camera shake correction may be disposed on the lower surface of the first substrate 1710, and the signal obtained via the gyro sensor may be delivered to the moving substrate part 1900 via the connection wire 1800.

The substrate housing 2000 is coupled below the fixed substrate part 1700. Preferably, the substrate housing 2000 may be provided with a seating portion (not shown) on which the magnet holder 1720 constituting the fixed substrate part 1700 is mounted, and accordingly, the seating portion (not shown) may be coupled to the magnet holder 1720. In addition, the moving substrate part 1900 is disposed in the substrate housing 2000 coupled to the magnet holder 1720.

The moving substrate part 1900 may be electrically connected to the fixed substrate part 1700 via the connection wire 1800, and move relative to the fixed substrate part 1700 by interaction between the magnet part 1730 and the coil part 1916.

To this end, the moving substrate part 1900 may include a second substrate 1910, a substrate holder 1920, a third substrate 1930, and a fourth substrate 1940.

The second substrate 1910 may be a main substrate. The second substrate 1910 may be a driving substrate for driving the second actuator.

The second substrate 1910 may include a second opening 1911. In this case, the second opening 1911 may be overlapped with the first opening 1712 formed in the first substrate 1710 in an optical axis direction.

The coil part 1916 may be disposed at each corner of the second substrate 1910. The coil part 1916 may be electrically connected to the second substrate 1910. The coil part 1916 may be disposed to face the magnet part 1730 disposed in the first actuator 1200. When a current is applied to the coil part 1916, an electric field may be formed therearound.

The coil part 1916 may include four coils. In this case, current may be independently applied to at least three coils of the four coils. In the first embodiment, the coil part 1916 may be controlled by three channels. Alternatively, in the second embodiment, the coil part 1916 may be controlled by four individual channels. The four coils constituting the coil part 1916 may be electrically separated from each other. Any one of the forward current and the reverse current may be selectively applied to each of the four coils of the coil part 1916. In the present embodiment, only three of the four coils may be electrically separated and one coil may be electrically connected to another coil. Alternatively, all four coils may be electrically separated. When only three of the four coils are electrically separated, a total of six lead wires in three pairs may come out of the coil part 1916, and when all four coils are electrically separated, a total of eight lead wires in four pairs may come out of the coil part 1916.

When four coils are controlled by three channels as in the first embodiment of the present embodiment, a pair of the coil part 1916 and the magnet part 1730 should be driven in a z-axis-centered rotational drive, but when four coils are controlled by four channels as in the second embodiment, the coil part 1916 and the magnet part 1730 may be driven in two pairs in the z-axis-centered rotational drive.

The coil part 1916 may include first to fourth coils 1916-1, 1916-2, 1916-3, and 1913-4. In addition, each of the first to fourth coils 1916-1, 1916-2, 1916-3, and 1913-4 may be disposed to face each magnet of the magnet part 1730 disposed on the first substrate 1710.

The first coil 1916-1 may be disposed at a first corner of the second substrate 1910. The second coil 1916-2 may be disposed at a second corner of the second substrate 1910. The third coil 1916-3 may be disposed at a third corner of the second substrate 1910. The fourth coil 1916-4 may be disposed at a fourth corner of the second substrate 1910. The first coil 1916-1 and the third coil 1916-3 may be disposed on a first diagonal direction of the second substrate 1910, and the second coil 1916-1 and the fourth coil 1916-4 may be disposed on a second diagonal direction of the second substrate 1910.

In the present embodiment, the first coil 1916-1 and the third coil 1916-3 may be disposed to be elongated in a first direction, and the second coil 1916-2 and the fourth coil 1916-4 may be disposed to be elongated in a second direction. In this case, the first direction and the second direction may be vertical. A long side of the first coil 1916-1 and a long side of the third coil 1916-3 may be disposed in parallel with each other. A long side of the second coil 1916-2 and a long side of the fourth coil 1916-4 may be disposed in parallel to each other. The long side of the first coil 1916-1 and the long side of the second coil 1916-2 may not be parallel to each other. In this case, the long side of the first coil 1916-1 and the long side of the second coil 1916-2 may be disposed such that the virtual extension lines thereof are orthogonal to each other. A disposition direction of the first coil 1916-1 and a disposition direction of the second coil 1916-2 may be orthogonal to each other.

In the present embodiment, a current may be independently applied to at least three coils among the first to fourth coils 1916-1, 1916-2, 1916-3, and 1916-4. The first to fourth coils 1916-1, 1916-2, 1916-3, and 1916-4 may be electrically separated from each other.

Meanwhile, hall sensors 1917 may be disposed at inner sides of the first to fourth coils 1916-1, 1916-2, 1916-3, and 1916-4. In this case, the hall sensors 1917 may be disposed only at inner sides of three coils among the first to fourth coils 1916-1, 1916-2, 1916-3, and 1916-4. This is because, in the first embodiment, since the first to fourth coils 1916-1, 1916-2, 1916-3, and 1916-4 are controlled by three channels, one coil may not necessarily have a hall sensor. The hall sensor 1917 may sense a magnetic force of the magnet part 1730. A movement of the image sensor module may be identified in real time via a magnetic force of the magnet part 1730 sensed by the hall sensor 1917. In addition, this may allow an optical image stabilization (01S) feedback control.

The hall sensor 1917 may be configured in plural. That is, as described above, the hall sensor 1917 may include three sensors. A movement in the x-axis direction, a movement in the y-axis direction, and a rotation around the z-axis of the image sensor 1440 may be sensed via the three sensors. The hall sensor 1917 may include first to third sensors. The first sensor may face the first magnet, the second sensor may face the second magnet, and the third sensor may face the third magnet.

The hall sensor 1917 may include a first hall sensor for sensing an x-axis movement amount and/or displacement in the magnet part 1730. The hall sensor 1917 may include a second hall sensor for sensing a y-axis movement amount and/or displacement of the magnet part 1730. The hall sensor 1917 may include a third hall sensor for sensing the x-axis movement amount and/or displacement or the y-axis movement amount and/or displacement of the magnet part 1730. A movement of the magnet part 1730 rotating around the z-axis may be sensed via at least two of the first hall sensor, the second hall sensor, and the third hall sensor.

A driver IC 1914 for controlling an operation of the second actuator may be disposed on the second substrate 1910. In addition, various passive elements 1915 for operating the second actuator may be disposed on the second substrate 1910.

In this case, the second substrate 1910 should connect the coil part 1916, the driver IC 1914, and the passive elements 1915 to each other, and then to the first substrate 1710. Here, a terminal may be in twelve required for the electrical connection from the second substrate 1910 to the first substrate 1710. The twelve terminals may be terminals connected to the driver IC 1914.

Accordingly, a plurality of second pad portions 1918 connected to the driver IC 1914 are disposed on a lower surface of the second substrate 1910. The number of the plurality of second pad portions 1918 may be configured to be in twelve for transmitting and receiving necessary signals while controlling the configurations disposed on the second substrate 1910 in the driver IC 1914.

Meanwhile, a second hole 1912 may be formed in an edge region of the second substrate 1910. In this case, the second hole 1912 may be aligned with the first hole 1713-2 formed in the first substrate 1710 in an optical axis direction. The second hole 1912 may be a wire through-hole through which the connection wire 1800 coupled to the first substrate 1710 passes.

In addition, a third coupling hole 1913 is formed at an edge of the second substrate 1910.

The second substrate 1910 is disposed on the substrate holder 1920.

In this case, the substrate holder 1920 includes a guide protrusion 1921 extending in an upward direction at an edge region thereof. The guide protrusion 1921 may be formed on an upper surface of the substrate holder 1920. The guide protrusion 1921 may guide an assembly position of the second substrate 1910. The guide protrusion 1921 may contact a side surface of the second substrate 1910 in a state in which the second substrate 1910 is seated on the substrate holder 1920. In this case, the guide protrusion 1921 may be configured in plural numbers, and accordingly, the guide protrusion 1921 may contact all four-side surfaces of the second substrate 1910.

A third coupling protrusion 1923 may be formed at a corner of the substrate holder 1920. The third coupling protrusion 1923 may be inserted into the third coupling hole 1913 on which the second substrate 1910 is formed while the second substrate 1910 is seated on the substrate holder 1920. In this case, the third coupling protrusion 1923 may be formed in a shape corresponding to the third coupling hole 1913. The third coupling protrusion 1923 may be formed at four corners of the substrate holder 1920, respectively.

A third hole 1922 may be formed at an edge region of the substrate holder 1920. In this case, the third hole 1922 may be aligned in an optical axis direction with the second hole 1912 formed in the second substrate 1910 and the first hole 1713-2 formed in the first substrate 1710. The third hole 1922 may be a wire through-hole through which the connection wire 1800 coupled to the first substrate 1710 passes. Meanwhile, an opening may be provided at a center of the substrate holder 1920.

The third substrate 1930 may be disposed in the opening of the substrate holder 1920.

The third substrate 1930 may relay a connection among the image sensor module 1400, the second substrate 1910, and the fourth substrate 1940.

The third substrate 1930 includes an opening 1931 at a center thereof. The opening 1931 may be aligned in an optical axis direction with an opening of the first actuator 1200 and an opening of the second substrate 1910 disposed above.

A third pad portion 1932 may be disposed on an upper surface of the third substrate 1930. The third pad portion 1932 may face the second pad portion 1918 disposed on the lower surface of the second substrate 1910. That is, the third pad portion 1932 may be disposed to be aligned with the second pad portion 1918 in an optical axis direction. In addition, the third pad portion 1932 may be configured in twelve to correspond to the number of the second pad portions 1918. The second pad portion 1918 and the third pad portion 1932 may be electrically connected to each other via soldering.

In this case, the substrate holder 1920 facilitates coupling between the second substrate 1910 and the third substrate 1930. That is, in a state in which the substrate holder 1920 is absent, in order to couple the second substrate 1910 and the third substrate 1930 to each other, while minimizing a height difference between the second substrate 1910 and the third substrate 1930, a pitch of the second pad portion 1918 should be matched with a pitch of the third pad portions 1932, exactly. However, substantially, it is difficult to minimize the height difference or match the pitch. Accordingly, in an embodiment, the substrate holder 1920 is disposed between the second substrate 1910 and the third substrate 1930, so that a coupling between the second substrate 1910 and the third substrate 1930 may be facilitated.

Meanwhile, a fourth pad portion 1934 is disposed inside a lower surface of the third substrate 1930, and a fifth pad portion 1935 is disposed at an edge thereof.

The fourth pad portion 1934 may be connected to a pad portion of the image sensor module 1400 disposed in the opening 931 of the substrate holder 1920.

In this case, the fourth pad portion 1934 may include a fourth-first pad portion 1934-1 disposed in a first region of the lower surface of the third substrate 1930 and a fourth-second pad portion 1935-1 disposed in a second region facing the first region with the opening 1931 interposed therebetween.

In this case, the fourth-first pad portion 1934-1 is a pad for receiving an image signal obtained via the image sensor 1440 among signals exchanged with the image sensor module 1400. The fourth-second pad portion 1935-1 is a pad for exchanging signals other than the image signal with the image sensor module 1400.

That is, in the present embodiment, pads connected to the image sensor module 1400 may be disposed to separate a pad for receiving an image signal and another pad into different regions. This is because when the pad for receiving the image signal and the pad for receiving the other signals are disposed in the same region, the image signal may include a noise signal, and accordingly, there is a problem that image quality is deteriorated. Therefore, in an embodiment, the pad for receiving the image signal and the other pad are separately disposed in different regions, and thus it is possible to improve quality of the image signal.

In this case, the third pad portion 1932 and the second pad portion 1918 are disposed in a region overlapped with the fourth-second pad portion 1935-2 in an optical axis direction, not a region overlapped with the fourth-first pad portion 1935-1 in an optical axis direction. Accordingly, the noise included in the image signal may be minimized by the signals transmitted from the third pad portion 1932 and the second pad portion 1918.

In addition, a driver IC 1914 and a passive element 1915 are disposed on the second substrate 1910, and the driver IC 1914 and the passive element 1915 are disposed in a region overlapped with the fourth-second pad portion 1935-2 in an optical axis direction, not a region overlapped with the fourth-first pad portion 1935-1 in an optical axis direction. This is to prevent noise from being included in the image signal by preventing signal lines or elements overlapped with the fourth-first pad portion 1935-1 in an optical axis direction.

Meanwhile, a fifth pad portion 1935 is disposed in an edge region of the third substrate 1930. The fifth pad portion 1935 is a pad connected to the fourth substrate 1940. In this case, the fifth pad portion 1935 may be connected 1:1 with the plurality of connection wires 1800 via the fourth substrate 1940, respectively. Accordingly, the fifth pad portion 1935 may include a fifth-first pad portion 1935-1 disposed in a first edge region of the lower surface of the third substrate 1930, a fifth-second pad portion 1935-2 disposed in a second edge region, a fifth-third pad portion 1935-3 disposed in a third edge region, and a fifth-fourth pad portion 1935-4 disposed in a fourth edge region. In this case, in order to minimize the signal line distance, the fourth-first pad portion 1935-1 may be preferentially connected to the fifth-first pad portion 1935-1 adjacent to each other and directly transferred to the first substrate 1710 via the fourth substrate 1940 and the connection wire 1800. That is, in the present embodiment, while a signal path through which an image signal is transmitted is shortened, other pads or elements are not disposed on the signal path through which the image signal is transmitted, and thus it is possible to maintain best quality of the image signal.

The fourth substrate 1940 also enables signal transmission while enabling shifting of the image sensor module 1400.

The fourth substrate 1940 may include an insulating layer 1941 and a pattern portion 942 (or a terminal portion), disposed on the insulating layer 1941.

The insulating layer 1941 may include an opening 1941-2. The opening 1941-2 may be aligned in an optical axis direction with an opening of the first substrate 1710, an opening of the second substrate 1910, an opening of the third substrate 1930, and an opening of the substrate holder 1920.

A pattern portion 1942 is disposed on the insulating layer 1941. In this case, the pattern portion 1942 includes a second lead pattern part 1942-1 having one end thereof connected to the fifth pad portion 1935 of the third substrate 1930 and the other end thereof connected to the connection wire 1800. In addition, the pattern portion 1942 includes a reinforcing pattern 1942-2 disposed on a corner region of the insulating layer 1941. The second lead pattern part 1942-1 is a signal transmission/reception pattern electrically connected to the fifth pad portion 1935 of the third substrate 1930 and the connection wire 1800. In addition, the reinforcing pattern 1942-2 is a pattern, in which the insulating layer 941 is disposed on a corner region, for reinforcing rigidity of the fourth substrate 1940. Accordingly, the reinforcing pattern 1942-2 is not electrically connected to other configurations, and is disposed only in a corner region in which the second lead pattern part 1942-1 is not disposed on an upper surface of the insulating layer 1941 to improve rigidity of the fourth substrate 1940. In this case, the reinforcing pattern 1942-2 may be formed of the same metal material as that of the second lead pattern part 1942-1, and may be simultaneously formed in the same process as the second lead pattern part 1942-1.

The second lead pattern part 1942-1 may be configured in plural numbers. For example, the second substrate 1910 may include 36 terminal portions in the same manner as the connection wire 1800.

In this case, the second substrate 1910 may include a second-first lead pattern part 1942-1*a* disposed in a first region of the insulating layer 1941, a second-third lead pattern part 1942-1*c* disposed in a second region facing the first region of the insulating layer 1941, a second-second lead pattern part 9142-1*b* disposed in a third region between the first and second regions of the insulating layer 1941, and second-fourth lead pattern part 1942-1*d* disposed in a fourth region facing the third region of the insulating layer 1941.

In addition, the reinforcing pattern 1942-2 may include a first reinforcing pattern 1942-2*a* disposed in a first corner region between the first region and the third region of the insulating layer 1941, second reinforcing pattern 1942-2*b* disposed in a second corner region between the third region and the second region of the insulating layer 1941, a third reinforcing pattern 1942-2*c* disposed in a third corner region between the second and fourth regions of the insulating layer 1941, and a fourth reinforcing pattern 1942-2*d* disposed in a fourth corner region between the first region and the fourth region of the insulating layer 1941.

In this case, the insulating layer 1941 includes a first insulating region 1941-1 having an opening 1942-2 at a center thereof and contacting the second lead pattern part 1942-1 and the reinforcing pattern 1942-2, and a second insulating region 1941-3 protruding in an outward direction from an outer surface of the first insulating region 1941-1. The second insulating region 1941-3 may be formed to widen a contact area with the reinforcing pattern 1942-2 and to further improve rigidity of the fourth substrate 11940.

Meanwhile, the reinforcing pattern 1942-2 may further include a coupling hole 1943-3, into which a coupling protrusion (not shown) disposed on a lower surface of the substrate holder 1920 is inserted.

Meanwhile, the second lead pattern part 1942-1 may include a first portion 1942-11 disposed on the insulating layer 1941, a third portion 1942-13 coupled to the connection wire 1800, a second portion 1942-12 connecting between the first portion 1942-11 and the third portion 1942-13, and a fourth portion 1942-14 extending from the first portion 1942-11 to an inner direction of the insulating layer 1401, and being coupled to the fifth pad portion 1935 of the third substrate 1930.

In addition, a hole through which the connection wire 1800 passes may be formed in the third portion 1942-13. The third portion 1942-13 may be coupled to the connection wire 1800 by soldering. The second portion 1942-12 may include a bent portion. The second portion 1942-12 may be bent at a plurality of times in one direction. The second portion 1942-12 may have elasticity. Accordingly, the second lead pattern part 1942-1 may have elasticity.

In this case, when the second portion 1942-12 does not include a bent portion, the connection wire 1800 may move together when the image sensor module 1400 moves and warpage may occur, and break may occur depending on a degree of occurrence of the warpage. On the contrary, in an embodiment, since the second portion 1942-12 includes a bent portion, the second portion 1942-12 may serve as a suspension when the image sensor module 1400 moves, and accordingly, rigidity of the connection wire 1800 may be increased by giving elasticity to the connection wire 1800.

The fourth portion 1942-14 may be electrically connected to the fifth pad portion 1935 of the third substrate 1930. In this case, the insulating layer 1941 is disposed only at a lower portion of the first portion 1942-11 of the second lead pattern part 1942-1, and the insulating layer 1941 is not disposed in other portions.

The third portion 1942-13 may be a bonding pad electrically connected to the connection wire 1800. That is, the third portion 1942-13 may be a soldering pad that are soldered with the connection wire 1800. To this end, the third portion 1942-13 may include a fourth hole through which the connection wire 1800 passes. In addition, the fourth hole may be aligned with the third hole 1922 of the substrate holder 1920, the second hole 1912 of the second substrate 1910, and the first hole 1713-2 of the first substrate 1710 in the optical axis direction.

The second portion 1942-12 may connect the first portion 1942-11 and the third portion 1942-13. To this end, the second portion 1942-12 may include a plurality of bent portions. In this case, each of the second lead pattern parts 1942-1*a*, 1942-1*b*, 1942-1*c*, and 1942-1*d* may be bent in the same direction. For example, the second portion 1942-12 of each of the second lead pattern parts 1942-1*a*, 1942-1*b*, 1942-1*c*, and 1942-1*d*, may include a bent portion that rotates clockwise. That is, the second portion 1942-12 may be bent in a direction corresponding to a rotation direction in the z-axis direction of the image sensor module. Accordingly, the second portion 1942-12 may minimize damage to the second lead pattern part 1942-1 when rotating in the z-axis direction, and accordingly, it is possible to prevent cracks generated in the second lead pattern part 1942-1 or detachment of the second lead pattern part 1942-1 from the insulating layer 1941. Meanwhile, in an embodiment, an adhesive member (not shown) may be disposed between the insulating layer 1941 and the second lead pattern part 1942-1. The adhesive member may be interposed between the insulating layer 1941 and the second lead pattern part 1942-1 to prevent the second lead pattern part 1942-1 from being detached on the insulating layer 1941. The adhesive member may include a curing adhesive or the like. In addition, the adhesive member may be electroplated to enhance adhesion to the second lead pattern part 1942-1, and accordingly, roughness may be applied to a surface thereof.

Meanwhile, the second lead pattern part 1942-1 is a wire for transmitting an electrical signal, and may be formed of a metal material having high electrical conductivity. To this end, the second lead pattern part 1942-1 may be formed of at least one metal material selected from among gold (Au), silver (Ag), platinum (Pt), titanium (Ti), tin (Sn), copper (Cu), and zinc (Zn). In addition, the circuit pattern 112 may be formed of paste or solder paste including at least one metal material selected from among gold (Au), silver (Ag), platinum (Pt), titanium (Ti), tin (Sn), copper (Cu), and zinc (Zn), which are excellent in bonding strength.

Preferably, the second lead pattern part 1942-1 may serve as a wiring for transmitting an electrical signal, and may be formed of a metal material having an elastic force capable of moving the image sensor module 1400 in the X-axis, Y-axis, and Z-axis directions. To this end, the second lead pattern part 1942-1 may be formed of a metal material having a tensile strength of 1000 MPa or more. For example, the second lead pattern part 1942-1 may be a binary alloy or a ternary alloy containing copper. For example, the second lead pattern part 1942-1 may be a binary alloy of copper (Cu)-nickel (Ni). For example, the second lead pattern part 1942-1 may be a binary alloy of copper (Cu)-tin (Sn). For example, the second lead pattern part 1942-1 may be a binary alloy of copper (Cu)-beryllium (Be). For example, the second lead pattern part 1942-1 may be a binary alloy of copper (Cu)-cobalt (Co). For example, the second lead pattern part 1942-1 may be a ternary alloy of copper (Cu)-nickel (Ni)-tin (Sn). For example, the second lead pattern part 1942-1 may be a ternary alloy of copper (Cu)-beryllium (Be)-cobalt (Co). In addition, in addition to the metal material, the second lead pattern part 1942-1 may be formed of an alloy of iron (Fe), nickel (Ni), zinc (Zn), and the like having an elastic force capable of acting as a spring and having good electrical characteristics. Further, the second lead pattern part 1942-1 may be surface-treated with a plating layer containing a metal material such as gold (Au), silver (Ag), palladium (Pd), and the like, thereby improving electrical conductivity.

Meanwhile, the second lead pattern part 1942-1 may be formed by a general process of manufacturing a printed circuit board, such as an additive process, a subtractive process, a modified semi additive process (MSAP), a semi additive process (SAP), etc.

Meanwhile, the second lead pattern part 1942-1 may have different line widths for each portion. The first portion 1942-11 may have a wider width than the other portion to improve an adhesion force to the insulating layer 1941. In addition, the second portion 1942-12 may have a narrower line width compared with the first portion 1942-11 to have an elastic force. In this case, the second portion 1942-12 may have a line width of 20 to 1000 μm. When the line width of the second portion 1942-12 is smaller than 20 μm, overall rigidity of the second lead pattern part 1942-1 may be lowered, thereby lowering reliability of the second lead pattern part 1942-1. In addition, when the line width of the second portion 1942-12 is larger than 1000 μm, an elastic force of the second lead pattern part 1942-1 may be lowered, which may cause a problem in a shift of the image sensor module 1400.

Meanwhile, the second portion 1942-12 may include a buffer pattern portion for a buffering role in a region A connected to the first portion 1942-11. The buffer pattern portion may have a shape in which a width gradually decreases in a direction from the first portion 1942-11 to the second portion 1942-12. In this case, the width reduction is not linear but has a non-linear characteristic, and accordingly, an outer surface of the buffer pattern portion may have a rounded or curved shape.

The buffer pattern portion may solve a problem such as a pattern break caused by a pattern width difference between the first portion 1942-11 and the second portion 1942-12, and stably connect between the first portion 1942-11 and the third portion 1942-13.

In addition, the buffer pattern portion may not be overlapped with the insulating layer in a vertical direction. Accordingly, when the substrate is not only moved in the X, Y and Z axes, but also tilted, a point in which the connection portion and the pattern portion are connected is not existed on the insulating layer, and is formed outside the insulating layer, and thus pattern breakage caused by a difference in width between the connection portion and the pattern portion can be effectively reduced.

In addition, the fourth portion 1942-14 may also have a line width smaller than that of the first portion 1942-11, and accordingly, a buffer pattern portion having a rounded or curved outer surface may be disposed in a region B between the fourth portion 1942-14 and the first portion 1942-11.

Meanwhile, the second portion 1942-12 may be bent at least once as set above. Accordingly, the second portion 1942-12 includes a second-first portion 1942-12a extending in one direction and a second-second portion 1942-12b that is bent in a direction different from the one direction in the second-first portion 1942-12a.

In this case, a side surface of the second-second portion 1942-12b may have a rounded shape or a curved shape instead of a straight line. That is, when the side surface of the second-second portion 1942-12b has a straight shape, stress may be concentrated on the portion, and accordingly, breakage of the second lead pattern part 1942-1 may occur. Accordingly, the side surface of the second-second portion 1942-12b has a rounded or curved shape to prevent concentration of stress in the second-second portion 1942-12b. In this case, a curvature-R value of the side surface of the second-second portion 1942-12b may have a value between 30 and 100. When the curvature-R value of the side surface is smaller than 30, the stress concentration preventing effect is insufficient, and when larger than 100, an elastic force of the second lead pattern part 1942-1 may decrease. In this case, the second-second portion 1942-12b may include an inner surface and an outer surface along the bending direction. In addition, a curvature-R value of the inner surface of the second-second portion 1942-12b may be different from that of the outer surface of the second-second portion 1942-12b to maximize a role of stress relaxation.

In addition, the second-second portion 1942-12b may be different from the line width of the second-first portion 1942-12a. For example, the second-second portion 1942-12b may have a line width larger than that of the second-first portion 1942-12a. This is, the stress may be concentrated in the second-second portion 1942-12b and accordingly, the second-second portion 1942-12b may be formed while having a line width larger than that of the second-first portion 1942-12a.

Meanwhile, the fifth pad portion 1935 of the third substrate 1930 is positioned on the fourth portion 1942-14. In addition, the fourth portion 1942-14 and the fifth pad portion 1935 of the third substrate 1930 may be coupled to each other via soldering.

Meanwhile, in the above description, the second portion 1942-12 of the second lead pattern part 1942-1 has a rectangular shape with rounded corners, but is not limited thereto. For example, the second portion 1942-12 of the second lead pattern part 1942-1 may have a circular shape or a polygonal shape and may be bent.

<Image Sensor Module>

FIG. 36 is an exploded perspective view of an image sensor module 1400 according to an embodiment, and FIG. 37 is a connection view of a third substrate and the image sensor module 1400.

Referring to FIGS. 36 and 37, the image sensor module 1400 may include a sensor holder 1460, a filter 1450, the adhesive member 1440, a sensor base 1410, the image sensor 1430, and an image sensor substrate 1420.

Such an image sensor module 1400 may be coupled to the second substrate 1910 and the substrate holder 1920 via the sensor holder 1460. For example, the image sensor module 1400 may be fixed to the substrate holder 1920 via the sensor holder 1460. The image sensor module 1400 may include the sensor holder 1460, the filter 1450, the adhesive member 1440, the sensor base 1410, the image sensor 1430, and the image sensor substrate 1420, but at least one of configurations may be omitted.

The image sensor module 1400 may include the sensor holder 1460. The sensor holder 1460 allows the image sensor module 1400 to be stably fixed to the substrate holder 1920. In this case, the sensor holder 1460 may include an opening 1461, and the opening 1461 may be aligned with the filter 1450 and the image sensor 1430 in an optical axis direction.

The image sensor module 1400 includes the sensor base 1410.

The sensor base 1410 may include an opening 1411, and a stepped protrusion may be provided to allow the filter 1450 to be seated adjacent to the opening 1411. In addition, the adhesive member 1440 may be disposed on the stepped protrusion, and the filter 1450 may be fixedly disposed on the adhesive member 1440. Such a filter 1450 may serve to block light of a specific frequency band of light passing through the lens module 1100 from being incident on the image sensor 1430. The filter 1450 may be disposed to be parallel to an x-y plane. The filter 1450 may be disposed between the lens module 1100 and the image sensor 1430. The filter 1450 may include an infrared filter. The infrared filter may absorb or reflect infrared light incident on the infrared filter.

The image sensor substrate 1420 may be a package substrate. That is, the image sensor 1430 may be mounted in a package form on the image sensor substrate 1420. The image sensor substrate 1420 may include a printed circuit board (PCB). The image sensor substrate 1420 may include a circuit board. The image sensor 1430 may be disposed on the image sensor substrate 1420. The image sensor substrate 1420 may be coupled to the third substrate 1930. To this end, a sixth pad portion 1421 electrically connected to the fifth pad portion 1935 of the third substrate 1930 may be provided on a lower surface of the image sensor substrate 1420. In this case, as described above, the sixth pad portion 1421 is also disposed at edge regions opposite to each other on the lower surface of the image sensor substrate 1420, and accordingly, positions of the pads to which the image signal is transmitted can be separated from the other pads. Meanwhile, the image sensor substrate 1420 may be positioned in the opening of the third substrate 1930, and the sixth pad portion 1421 in the opening of the third substrate 1930 may be aligned with the fifth pad portion 1935 of the third substrate 1930 in a horizontal direction. The fifth pad portion 1935 and the sixth pad portion 1421 may be coupled to each other via soldering or the like.

The image sensor 1430 may have a configuration in which light passing through the lens module 1100 and the filter 1450 is incident to form an image. The image sensor 1430 may be mounted on the image sensor substrate 1420. The image sensor 1430 may be electrically connected to the image sensor substrate 1420. For example, the image sensor 1430 may be coupled to the image sensor substrate 1420 by surface mounting technology (SMT). As another example, the image sensor 1430 may be coupled to the image sensor substrate 1420 by flip chip technology. The image sensor 1430 may be disposed to coincide with the lens module 1100 in an optical axis. That is, the optical axis of the image sensor 1430 and the optical axis of the lens module 1100 may be aligned. The image sensor 1430 may convert light irradiated to the effective image region of the image sensor 1430 into an electrical signal. In addition, the converted electrical signal may be an image signal. The image sensor 1430 may be any one of a charge coupled device (CCD), a metal oxide semi-conductor (MOS), a CPD, and a CID.

<Optical Device>

FIG. 38 is a perspective view of an optical device according to the present embodiment, and FIG. 39 is a block diagram of the optical device shown in FIG. 39.

The optical device may be any one of a mobile phone and a portable phone, a smart phone, a portable smart device, a digital camera, a laptop computer, a digital broadcasting terminal, a personal digital assistant (PDA), a portable multimedia player (PMP), and a navigation device. However, types of the optical device are not limited thereto, and any device for capturing an image or a picture may be included in the optical device.

The optical device may include a main body 2250. The main body 2250 may be in the form of a bar. Alternatively, the main body 2250 may have various structures such as a slide type, a folder type, a swing type, a swivel type, and the like in which two or more sub-bodies are coupled to be relatively movable. The main body 2250 may include a case (casing, housing, and cover) forming an external appearance. For example, the main body 2250 may include a front case 2251 and a rear case 2252. Various electronic components of the optical device may be built in a space formed between the front case 2251 and the rear case 2252. A display 2151 may be disposed on one surface of the main body 2250. A camera 2121 may be disposed on any one or more surfaces of one surface of the main body 2250 and the other surface disposed on the opposite side of the one surface.

The optical device may include a wireless communication unit 2110. The wireless communication unit 2110 may include one or more modules that enable wireless communication between the optical device and a wireless communication system or between the optical device and a network in which the optical device is positioned. For example, the wireless communication unit 2110 may include any one or more of a broadcast receiving module 2111, a mobile communication module 2112, a wireless internet module 2113, a short range communication module 2114, and a position information module 2115.

The optical device may include an A/V input unit 2120. The A/V input unit 2120 is for inputting an audio signal or a video signal and may include any one or more of a camera 2121 and a microphone 2122. In this case, the camera 2121 may include a camera device according to the first or second embodiment described above.

The optical device may include a sensing unit 2140. The sensing unit 2140 may sense a current state of the optical device such as an opening/closing state of the optical device, a position of the optical device, a presence of a user contact, orientation of the optical device, acceleration/deceleration of the optical device, and the like to generate a sensing signal for controlling an operation of the optical device. For example, when the optical device is in the form of a slide phone, whether the slide phone is opened or closed may be sensed. In addition, it may be responsible for sensing functions related to whether a power supply unit 2190 supplies power or whether an interface unit 2170 is coupled to an external device.

The optical device may include an input/output unit 2150. The input/output unit 2150 may be a configuration for generating an input or output related to vision, hearing, or tactile sense. The input/output unit 2150 may generate input data for controlling an operation of the optical device, and may output information processed by the optical device.

The input/output unit 2150 may include at least one of a keypad portion 2130, a display 2151, a sound output module 2152, and a touch screen panel 2153. The keypad portion 2130 may generate input data by using a keypad input. The display 2151 may output an image captured by the camera 2121. The display 2151 may include a plurality of pixels whose color changes according to an electrical signal. For example, the display 2151 may include at least one of a liquid crystal display (LCD), a thin film transistor-liquid crystal display (TFT LCD), an organic light-emitting diode (OLED), a flexible display, and a three-dimensional (3D) display. The sound output module 2152 may output audio data received from the wireless communication unit 2110 in a call signal reception, a call mode, a recording mode, a voice recognition mode, or a broadcast reception mode, or output audio data stored in a memory unit 2160. The touch screen panel 2153 may convert a change in capacitance generated due to a user's touch on a specific region of a touch screen into an electrical input signal.

The optical device may include the memory unit 2160. The memory unit 2160 may store a program for processing and controlling a controller 2180. In addition, the memory unit 2160 may store input/output data, for example, any one or more of a phone book, a message, audio, a still image, a photo, and a video. The memory unit 2160 may store an image captured by the camera 1121, for example, a picture or a video.

The optical device may include the interface unit 2170. The interface unit 2170 serves as a path for connecting with an external device connected to the optical device. The interface unit 2170 may receive data from an external device, receive power to transfer to each element inside the optical device, or transmit data within the optical device to an external device. The interface unit 2170 may include any one or more of a wired/wireless headset port, an external charger port, a wired/wireless data port, a memory card port, a port connecting a device equipped with an identification module, and audio input/output (I/O) port, a video input/output (I/O) port, and an earphone port.

The optical device may include the controller 2180. The controller 2180 may control an overall operation of the optical device. The controller 2180 may perform related control and processing for voice call, data communication, video call, and the like. The controller 2180 may include a multimedia module 2181 for playing multimedia. The multimedia module 2181 may be provided in the controller 2180, or may be provided separately from the controller 2180. The controller 2180 may perform a pattern recognition processing for recognizing a writing input or a drawing input performed on a touch screen as text and an image, respectively.

The optical device may include the power supply unit 2190. The power supply unit 2190 may receive an external power source or an internal power source by a control of the controller 2180 to supply the power necessary for operating each element.

According to the embodiment, in order to realize OIS and AF functions of the camera module, instead of moving the conventional lens barrel, the image sensor is moved relative to the lens barrel in the X-axis, Y-axis, and Z-axis directions. Accordingly, the camera module according to the embodiment may remove a complicated spring structure for realizing the OIS and AF functions, thereby simplifying a structure. In addition, the structure that is more stable than the existing one may be formed by moving the image sensor according to the embodiment relative to the lens barrel.

In addition, according to the embodiment, the terminal portion electrically connected to the image sensor has a spring structure and is disposed to be floated at a position not overlapped with the insulating layer in the vertical direction. Accordingly, the camera module may move the image sensor relative to the lens barrel while supporting the image sensor stably and elastically.

According to the above-described embodiment, a X-axis direction shift, a Y-axis direction shift, and a Z-axis-centered rotation corresponding to camera shake with respect to the image sensor may be performed, and accordingly, the camera shake correction with respect to the lens corresponding to the camera shake correction with respect to the image sensor may be performed together, thereby providing a more enhanced camera shake correction function.

In addition, according to the embodiment, it is possible to reduce a total height of the camera device by embedding electrical elements required for a camera circuit by utilizing an internal space of the second actuator for moving the image sensor relative to the lens barrel.

Further, according to the embodiment, a camera assembly process may be simplified by integrating and fusing components of the camera circuit and components of the second actuator.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

The invention claimed is:

1. An image sensor substrate comprising:
   an insulating layer including a first open region; and
   a first lead pattern part disposed on the insulating layer, wherein the first lead pattern part includes:
      a first portion disposed on the insulating layer;
      a second portion extending from the first portion; and
      a third portion connected to the first portion through the second portion,
   wherein the second portion is disposed to fly on a region not overlapped with the insulating layer in a vertical direction, and
   wherein the third portion is flown with the second portion, the third portion having a first insertion hole configured to allow a wire to extend therethrough.

2. The image sensor substrate of claim 1, wherein the second portion is bent a plurality of times between the first portion and the third portion.

3. The image sensor substrate of claim 1, wherein a center of the first portion is aligned on the same vertical extension line or horizontal extension line as a center of the third portion.

4. The image sensor substrate of claim 1, wherein the first portion includes:
   a mounting part disposed on the insulating layer and on which an image sensor configured to capture an image is mounted; and
   an extension part disposed on the insulating layer and bent and extending from the mounting part.

5. The image sensor substrate of claim 4, wherein a first extension line that crosses the center of the mounting part is spaced apart from a second extension line that crosses a center of the extension part by a third distance.

6. The image sensor substrate of claim 4, wherein the extension part may include a region in which one end is connected to the mounting part, the other end is connected to the second portion, and a width gradually decreases from the one end to the other end.

7. The image sensor substrate of claim 1, wherein the first lead pattern part includes:
   a plurality of first-first lead pattern parts disposed on a first region of the insulating layer; and a plurality of first-second lead pattern parts disposed on a second region facing the first region of the insulating layer,
wherein a center of the first-first lead pattern part disposed at the outermost side of the plurality of first-first lead pattern parts is spaced apart from a center of the first-second lead pattern part disposed at the outermost portion of the plurality of first-second lead pattern parts by a first distance.

8. The image sensor substrate of claim 7, wherein the plurality of first-first lead pattern parts are disposed to be biased in a first direction with respect to a center of the first region, and
wherein the plurality of first-second lead pattern parts are disposed to be biased in a second direction opposite to the first direction with respect to the center of the second region.

9. The image sensor substrate of claim 1, wherein the second portion includes a second-first portion extending in a first direction, a second-second portion extending in a second direction different from the first direction, and a bent portion between the second-first portion and the second-second portion, and
wherein a line width of each of the second-first portion and the second-second portion is smaller than that of the bent portion.

10. The image sensor substrate of claim 9, wherein a side surface of the bent portion has a curved surface.

11. The image sensor substrate of claim 9, wherein a curvature R of the side surface of the bent portion has a range between 30 and 100.

12. The image sensor substrate of claim 9, wherein the bent portion includes an inner surface and an outer surface, and the curvature R of the inner surface is different from that of the outer surface.

13. The image sensor substrate of claim 1, wherein the first lead pattern part includes a fourth portion extending from the first portion and flying on the first open region of the insulating layer.

14. The image sensor substrate of claim 1, further comprising:
a reinforcing pattern disposed on the insulating layer,
wherein the reinforcing pattern is formed of the same metal material as the first lead pattern part.

15. The image sensor substrate of claim 14, wherein the insulating layer includes:
a first insulating region in contact with the first portion of the first lead pattern part and the reinforcing pattern; and
a second insulating region protruding from an outer surface of the first insulating region in a direction in which the reinforcing pattern is disposed, and contacting the reinforcing pattern.

16. The image sensor substrate of claim 15, wherein the reinforcing pattern includes at least one coupling hole disposed on a region not overlapped with the insulating layer in the vertical direction.

17. The image sensor substrate of claim 13, wherein a line width of the first portion of the first lead pattern part is larger than that of the fourth portion, and
wherein a line width of the second portion of the first lead pattern part is smaller than that of the fourth portion of the first lead pattern part.

18. The image sensor substrate of claim 13, wherein the first lead pattern part includes:
a first buffer part disposed between the first portion and the second portion, having a side surface having a curved surface, and having a width decreased as going from the first portion toward the second portion; and
a second buffer portion disposed between the first portion and the fourth portion, having a side surface having a curved surface, and having a width decreased as going from the first portion toward the fourth portion.

19. An image sensor substrate module comprising:
an image sensor substrate on which an image sensor configured to capture an image is mounted; and
a substrate holder disposed on the image sensor substrate,
wherein the image sensor substrate includes:
an insulating layer including a first open region; and
a first lead pattern part disposed on the insulating layer,
wherein the substrate holder includes a third open region overlapped with the first open region in a vertical direction,
wherein the first lead pattern part includes:
a first pattern part disposed on the insulating layer;
a connection portion extending from the first pattern part; and
a second pattern part connected to the first pattern part through the connection portion,
wherein the connection portion is disposed to fly on a region not overlapped with the insulating layer in the vertical direction,
wherein the second pattern part is flown with the connection portion, the second pattern part including a first insertion hole configured to allow a wire to extend therethrough, and
wherein the substrate holder includes a second insertion hole overlapping the first insertion hole along the vertical direction and configured to allow the wire to extend therethrough.

20. An image sensor substrate to support an image sensor, the image sensor substrate comprising:
an insulating layer defining an opening, an axis of the opening extending in a first direction; and
a first lead pattern part disposed on the insulating layer, the first lead pattern part including:
a first portion disposed on the insulating layer;
a second portion extending from the first portion in a direction different than the first direction and not overlapping the insulating layer in the first direction; and
a third portion connected to the first portion through the second portion, the third portion extending from the second portion so as to not overlap the insulating layer in the first direction.

* * * * *